United States Patent [19]

Mizuno et al.

[11] Patent Number: 5,436,095

[45] Date of Patent: Jul. 25, 1995

[54] MANUFACTURING METHOD OR AN EXPOSING METHOD FOR A SEMICONDUCTOR DEVICE FOR A SEMICONDUCTOR INTEGRATED CIRCUIT DEVICE AND A MASK USED THEREFOR

[75] Inventors: Fumio Mizuno, Saitama; Noboru Moriuchi, Tokyo; Seiichiro Shirai, Tokyo; Masayuki Morita, Tokyo, all of Japan

[73] Assignees: Hitachi, Ltd.; Hitachi VLSI Engineering Corp., both of Tokyo, Japan

[21] Appl. No.: 912,511

[22] Filed: Jul. 13, 1992

[30] Foreign Application Priority Data

Jul. 11, 1991 [JP] Japan .................................. 3-170946

[51] Int. Cl.⁶ ............................ G03F 9/00; G03F 9/02
[52] U.S. Cl. ........................................... 430/5; 430/311
[58] Field of Search ................................. 430/5, 311

[56] References Cited

U.S. PATENT DOCUMENTS 5,045,417  9/1991  Okamoto ................................. 430/5

FOREIGN PATENT DOCUMENTS

| | | |
|---|---|---|
| 58-78150 | 11/1981 | Japan . |
| 58-173744 | 10/1983 | Japan . |
| 62-67514 | 3/1987 | Japan . |
| 62-135837 | 6/1987 | Japan . |
| 63-17528 | 1/1988 | Japan . |
| 63-236319 | 10/1988 | Japan . |
| 63-292667 | 11/1988 | Japan . |
| 64-59832 | 3/1989 | Japan . |
| 1-195450 | 8/1989 | Japan . |
| 0216359 | 8/1989 | Japan .................................. 430/5 |
| 3-89346 | 9/1989 | Japan . |
| 2-105158 | 4/1990 | Japan . |
| 2140743 | 5/1990 | Japan . |
| 2-196462 | 8/1990 | Japan . |
| 3-89530 | 4/1991 | Japan . |
| 3215861 | 9/1991 | Japan .................................. 430/5 |

OTHER PUBLICATIONS

"A 5.9 $\mu m^2$ Super Low Power SRAM Cell Using a New Phase-Shift Lithography", Yamanaka, et al, pp. 1831–1834 IEDM Tech. Dig.; Apr. 1990.

B. J. Lin; "Phase-Shifling and Other Challenges in Optical Mask Technology;" IBM-EF-15; Sep. 26, 1990.

*Primary Examiner*—Melvyn I. Marquis
*Assistant Examiner*—R. Johnson
*Attorney, Agent, or Firm*—Antonelli, Terry, Stout & Kraus

[57] ABSTRACT

One object of the present invention is to provide the reduced projection exposure method which enables the exposure of various and fine patterns in manufacturing process of semiconductor devices or semiconductor integrated circuit devices. Structure of the present invention to attain the above object is to carry out the reduced projection exposure using a phase shift mask provided with a prescribed correction pattern on the end of the mask pattern domain of a constant mode or the boundary of the mask pattern domain of plural modes. According to this structure, as the end effects etc. are canceled by the correction pattern, the various and fine patterns can be exposed.

26 Claims, 47 Drawing Sheets

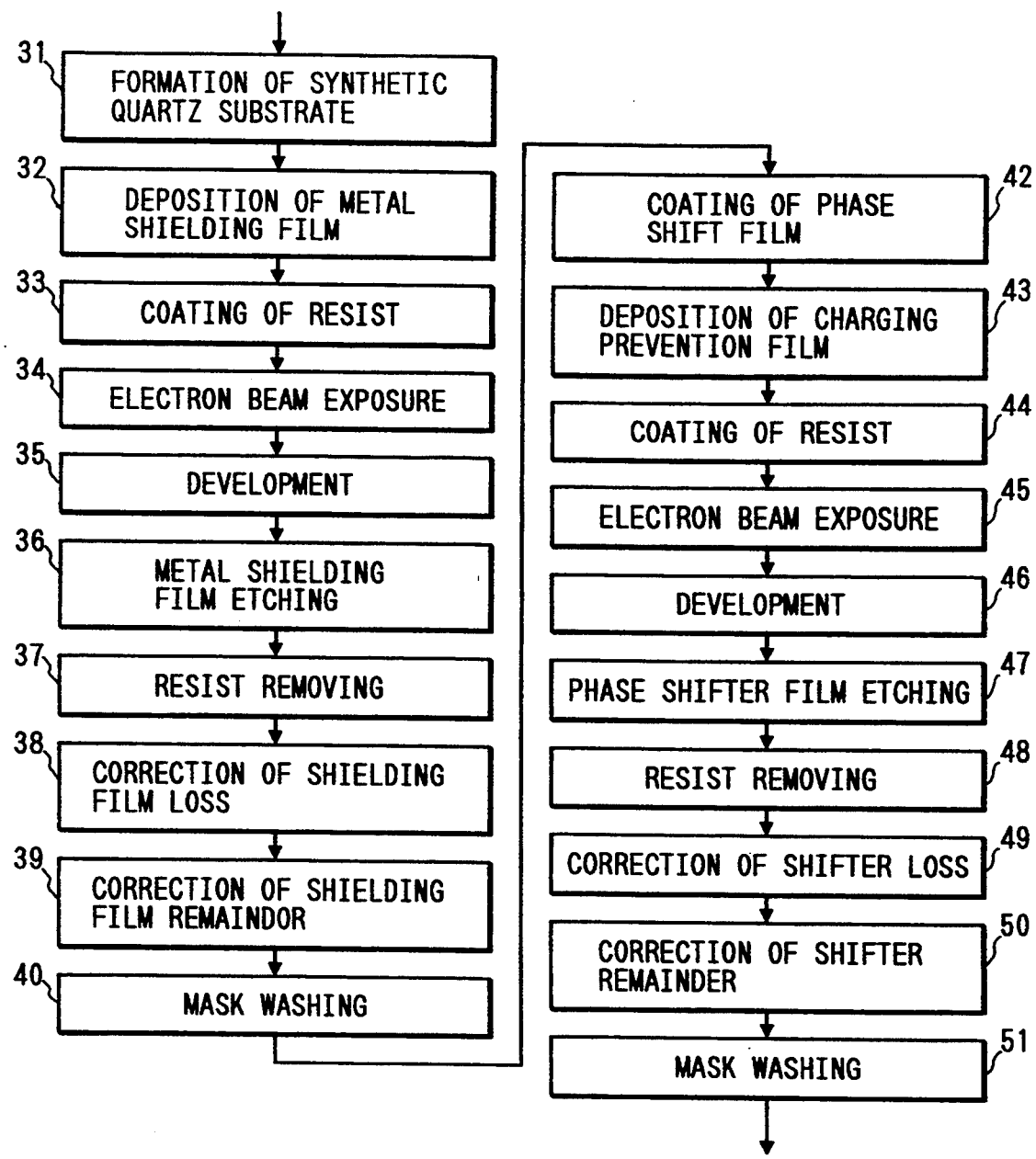

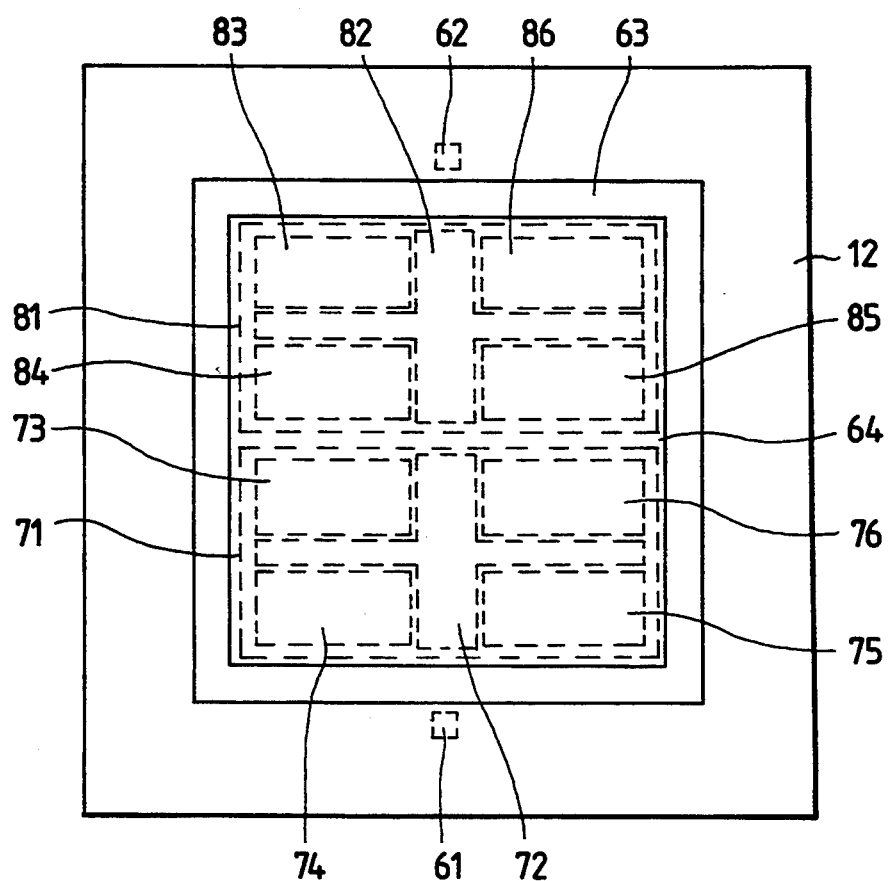

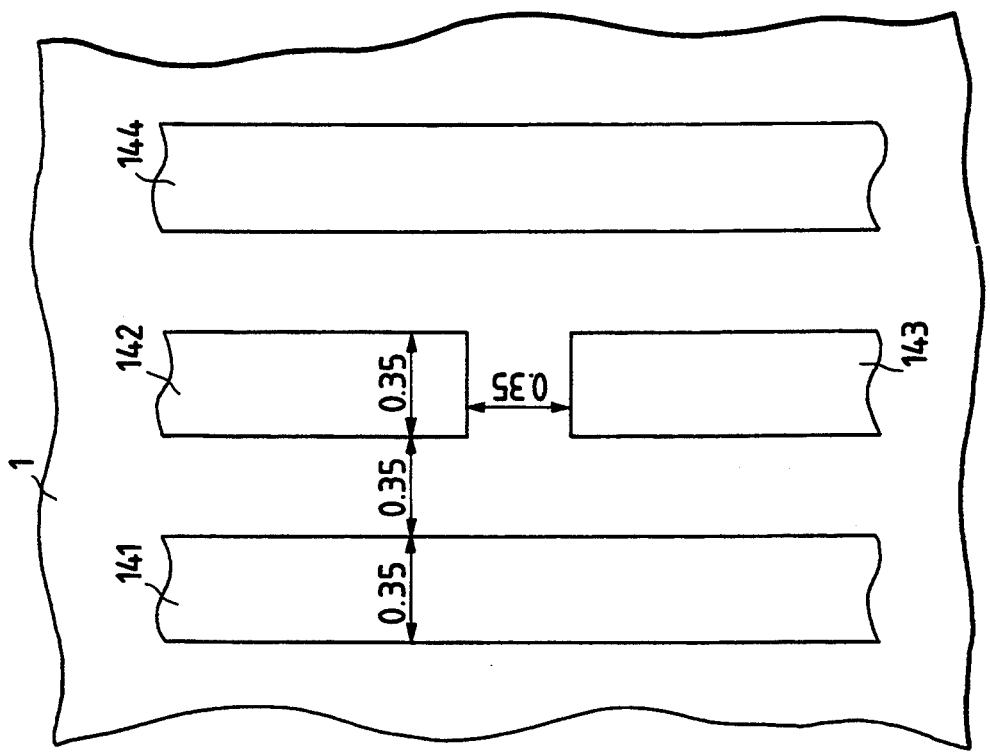
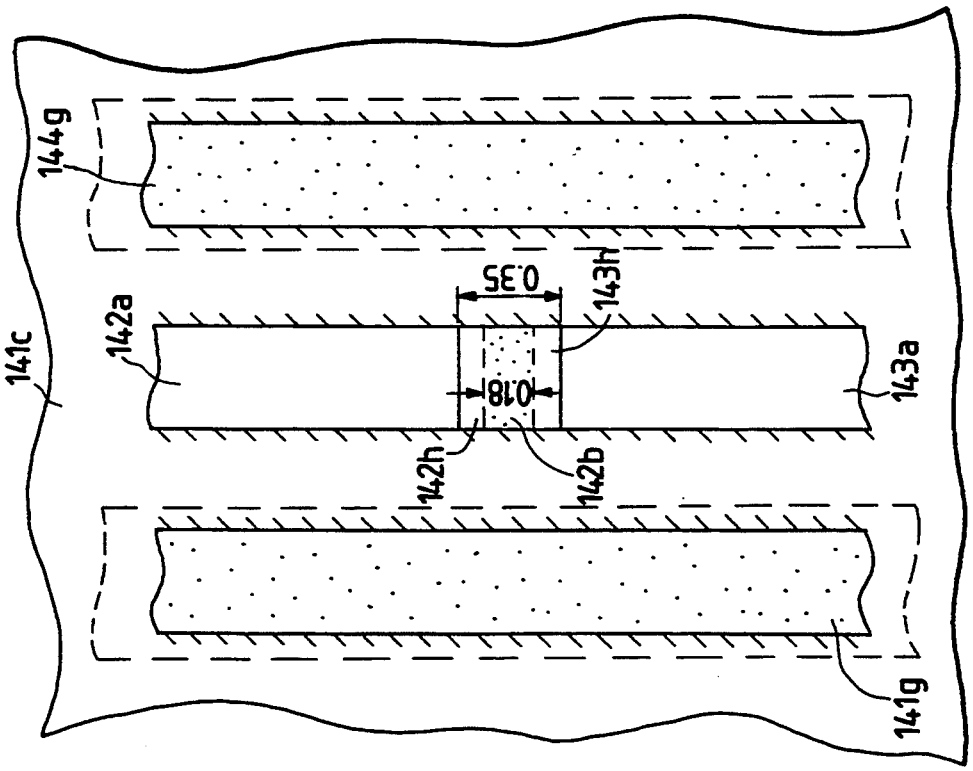

MANUFACTURING METHOD OR AN EXPOSING METHOD FOR A SEMICONDUCTOR DEVICE FOR A SEMICONDUCTOR INTEGRATED CIRCUIT DEVICE AND A MASK USED THEREFOR

BACKGROUND OF THE INVENTION

The present invention relates to an exposure technique, for example, relates to technology useful for a transfer technique etc. of circuit pattern in manufacturing processes of semiconductor integrated circuit etc.

When design rules for circuit elements and wirings become the order of submicron as high integration of semiconductor integrated circuits advances, in a photolithography process where circuit patterns on masks are transferred onto semiconductor wafers by using lights of g-line and i-line etc., the reduction of accuracy of circuit pattern transferred onto wafers becomes a serious problem. As a measure for improving such a problem, a phase shift technique preventing reduction of contrast of projected image by varying phases of light transmitting the mask is proposed. For example, Japanese patent application laid-open No. 173744/1983 discloses a phase shift where a transparent film is provided on one side of a pair of transmission domains between which a shielding domain is inserted, and phase difference is produced between lights transmitting the two transparent domains in the exposure, thereby the interference lights are weakened each other at the point on the wafer which would become a shielding domain originally (hereinafter referred to as "Levenson type" or "complementary type phase shift method").

Also, Japanese patent application laid-open No. 67514/1987 discloses a phase shift technique where after a part of the shielding domain of a mask is removed and a fine open pattern is formed, a transparent film is provided on either of the open pattern or the transmission domain existing in the vicinity thereof, and the phase difference is produced between the light transmitting the transmission domain and the light transmitting the open pattern, thereby the amplitude distribution of lights transmitting the transmission domain is prevented from spreading laterally (hereinafter referred to as "subshift type phase shift method").

Japanese patent application laid-open No. 140743/1990 discloses a phase shift technique where a phase shifter is provided on a part of the transmission domain of the mask and the phase difference is produced in the transmission lights, thereby the phase shifter boundary is emphasized (hereinafter referred to as "edge emphasized type phase shift method").

BRIEF SUMMARY OF THE INVENTION

However, any of these relates to the improvement of phase shift techniques on the experimental level, and does not fully consider the problems in the case of application to actual devices on the mass production level in which complicated patterns are mixed.

Accordingly, an object of the present invention is to provide a phase shift exposure technique where mask production is easy.

Another object of the present invention is to provide a phase shift exposure technique suitable for exposure of fine patterns in submicron units.

Another object of the present invention is to provide a reduced projection exposure method to enable exposure of various and fine patterns in the manufacturing process of semiconductor devices or semiconductor integrated circuit devices.

Another object of the present invention is to provide a phase shift exposure technique which does not produce unnecessary patterns.

Another object of the present invention is to provide a phase shift exposure technique which produces accurate patterns even at the ends of periodic patterns.

Another object of the present invention is to provide a phase shift exposure technique having a high integration density.

Another object of the present invention is to provide a phase shift exposure technique to enable the production of complicated patterns.

Another object of the present invention is to provide a phase shift exposure technique suitable for the manufacture of DRAM.

The foregoing and other objects and novel features of the present invention will become apparent from the description of the present specification and the attached drawings.

A brief explanation for one of summaries of the present invention to attain such objects is as follows.

That is, the constitution of the present invention is for carrying out the reducing projection exposure on the end of the mask pattern domain having a definite mode or the boundary of the mask pattern domain having plural modes using a phase shift mask where a prescribed correction pattern is provided.

According to the above constitution, as the end effects etc. are canceled each other by the above-mentioned correction pattern, the various and fine patterns can be exposed.

The foregoing and other summaries of the invention included in the present application are itemized as follows.

1. In the manufacturing method or the exposure method for semiconductor devices or semiconductor integrated circuit devices where monochromatic exposure luminous flux having a constant wavelength and being coherent or partially coherent in ultraviolet or deep ultraviolet domain (If it has coherence, it need not be monochromatic light, and this applies also in following items.) is irradiated to one mask on which prescribed enlarged patterns are formed, and the luminous flux passing through the mask is reduced and projected by the reducing lens system having a constant numerical aperture (It may be equi multiplication system. Also, it may be the combination reduced optical system being composed of lens system and mirrors, and the same applies also in following items.) so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) a main opening region like a band having a constant width and corresponding to a line pattern isolated at least on one side; and (b) a plurality of supplementary opening regions like dots or broken lines not forming their own patterns and having phases opposite to the main opening region and provided along one side of the main opening region and close to it spaced by regular intervals.

2. In the manufacturing method or the exposure method for semiconductor devices or semiconductor integrated circuit devices where monochromatic exposure luminous flux having a constant wavelength and being coherent or partially coherent in ultraviolet or deep ultraviolet domain (not limited to ultraviolet ray, and the same applies in the above and successive items) is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) a main opening region corresponding to pattern whose featuring conversion length is comparable with or not more than the wavelength of the exposure light; and (b) at least one supplementary opening region not forming its own pattern and corresponding to parts where the patterns for the bright parts focusing on the wafer are liable to become thin by the interference effect of light when the main opening region is exposed as it is, the supplementary opening region having the same phase as that of the main opening region and continuing to the vicinity of the main opening region or to that parts.

3. In the manufacturing method or the exposure method for semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) one corner region of shifter domain which is a light transmission region where the shifter domain and a mask substrate exposure domain are directly adjacent to each other so that the shifter domain may become convex globally; and (b) at least one local shifter loss part having the same phase as that of the mask substrate exposure region and not forming its own pattern and installed on the corner region of the shifter domain corresponding to parts where a dark pattern corresponding to the shifter domain focusing onto the wafer is liable to project or thicken undesirably by the interference effect of light when it is exposed intact.

4. In the manufacturing method or the exposure method for semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) a plurality of band-shaped main opening regions with phases reversed alternately, corresponding to a plurality of linear patterns arranged with a constant width and interval; and (b) a band-shaped dummy opening region being installed along main opening region of one end of the plurality of main opening regions, with approximately equal intervals and forming its own patterns and having the reversed phases to that of the main opening region of one end with approximately equal width.

5. In the manufacturing method or the exposure method for semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) a plurality of band-shaped main opening regions with phases reversed alternately, corresponding to a plurality of linear patterns arranged at a constant width and interval; and (b) a band-shaped wide main opening region being installed along main opening region of one end of the plurality of main opening regions with approximately the same interval as that of the main opening regions and having a larger width than the main opening regions so that it has the same width as that of the main opening regions at the exposure state and forming its own pattern having a reversed phase to that of the main opening region of one end.

6. In the manufacturing method or the exposure method for semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transformed onto the wafer, the mask comprises:

(a) the first phase shift mask pattern group according to the first mode; and (b) the second phase shift mask pattern group according to the second mode.

7. In the manufacturing method or the exposure method for semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) the first and second main opening regions having approximately equal .complicated configuration and arranged closely and having phases reversed to each other.

8. In the manufacturing method or the exposure method for semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns corresponding to the enlarged patterns on the mask are transferred onto the wafer, the mask comprises:

(a) approximately square phase shift mask pattern group forming a plurality of approximately square patterns being arranged closely in the oblique direction.

9. In the manufacturing method or the exposure method for semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) the first and second main opening regions arranged closely and having the same phase;

(b) a supplementary opening region provided to couple the first and second main opening regions and having the same phase as those of the first and second main opening regions over their full ranges; and (c) a phase shift region having a phase reversed to that of the first and second main opening regions and provided at the center of the supplementary opening region so that the focused patterns on the wafers corresponding to the first and second main opening regions may be separated at the exposure.

10. In a mask for manufacturing or exposing semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) a band-shaped main opening region having a constant width and corresponding to a linear pattern isolated at least on one side; and (b) a plurality of supplementary opening regions of dot shape or broken line shape being installed along one side of the main opening region closely with a constant spacing therefrom and having reversed phases to the main opening region and not forming their own pattern.

11. In a mask for manufacturing or exposing semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) a main opening region corresponding to pattern whose featuring conversion length on the wafer is comparable with or not more than the wavelength of the exposure light; and (b) at least one supplementary opening region not forming its own pattern and corresponding to parts where the patterns for the bright parts focusing on the wafer are liable to become thin by the interference effect of light when the main opening region is exposed as it is, the supplementary opening region having the same phase as that of the main opening region and continueing to the vicinity of the main opening region or to that parts.

12. In a mask for manufacturing or exposing semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) one corner region of shifter domain which is a light transmission region where the shifter domain and a mask substrate exposure domain are directly adjacent to each other so that the shifter domain may become convex globally; and (b) at least one local shifter loss part having the same phase as that of the mask substrate exposure region and not forming its own pattern and installed on the corner region of the shifter domain corresponding to parts where a dark pattern corresponding to the shifter domain focusing onto the wafer is liable to project or thicken undesirably by the interference effect of light when it is exposed intact.

13. In a mask for manufacturing or exposing semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) a plurality of band-shaped main opening regions with phases reversed alternately, corresponding to a plurality of linear patterns arranged with a constant width and interval; and (b) a band-shaped dummy-opening region being installed along main opening region of one end of the plurality of main opening regions, with approximately equal intervals and forming its own patterns and having the reversed phases to that of the main opening region of one end with approximately equal width.

14. In a mask for manufacturing or exposing semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) a plurality of band-shaped main opening regions with phases reversed alternately, corresponding to a plurality of linear patterns arranged with a constant width and interval; and (b) a band-shaped wide main opening region being installed along main opening region of one end of the plurality of main opening regions, with approximately the same interval as that of the main opening regions and having a larger width than the main opening regions so that it has the same width as that of the main opening regions at the exposure state and forming its own pattern having a reversed phase to that of the main opening region of one end.

15. In a mask for manufacturing or exposing semiconductor devices or semiconductor integrated circuit devices where monochromatic exposure luminous flux having a constant wavelength and being coherent or partially coherent in ultraviolet or deep ultraviolet domain is irradiated to one mask on which prescribed patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) the first phase shift mask pattern group according to the first mode; and (b) the second phase shift mask pattern group according to the second mode.

16. In a mask for manufacturing or exposing semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) approximately square phase shift mask pattern group forming a plurality of approximately square patterns being arranged closely in the oblique direction.

17. In a mask for manufacturing or exposing semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reduction lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) the first and second main opening regions arranged closely and having the same phase;

(b) a supplementary opening region provided to couple the first and second main opening regions and having the same phase as those of the first and second main opening regions over their full ranges; and (c) a phase shift region having a phase reversed to that of the first and second main opening regions and provided at the center of the supplementary opening regions so that the focused patterns on the wafers corresponding to the first and second main opening regions may be separated at the exposure.

18. Method of transferring patterns of a photo-mask onto a substrate using light rays and forming patterns onto the substrate, wherein the patterns are formed by combining system of forming different patterns with lights of the same phase and system of forming different patterns with lights of the reverse phase.

19. A mask for exposing patterns in method of transferring patterns of a photo-mask onto a substrate using light rays and forming patterns onto the substrate, wherein the patterns are formed by combining system of forming different patterns with lights of the same phase and system of forming different patterns with lights of the reverse phase.

20. In the manufacturing method or the exposure method for semiconductor devices or semiconductor integrated circuit devices where monochromatic exposure luminous flux having a constant wavelength and being coherent or partially coherent in ultraviolet or deep ultraviolet domain is irradiated to one mask on which prescribed enlarged patterns are formed, and the luminous flux passing through the mask is reduced and projected by the reducing lens system having a constant numerical aperture so that the desired reduced patterns corresponding to the enlarged patterns on the mask may focus onto the resist film of a treated wafer on one of whose main surfaces is formed the photo-sensitive resist film, thereby the reduced patterns corresponding to the enlarged patterns on the mask are transferred onto the wafer, the mask comprises:

(a) the first and second main opening regions arranged closely and having phases reversed to each other;

(b) the first supplementary opening region provided to couple the first main opening region and having the same phase as that of the first main opening region over its full ranges; and (c) the second supplementary opening region having the same phase as that of the second main opening region and coupled with the first supplementary opening region nearly at the center between the first and second main opening regions so that the focused patterns on the wafers corresponding to the first and second main opening regions may be separated at the exposure.

BRIEF DESCRIPTION OF THE DRAWINGS

FIG. 3 is a manufacturing process flow chart for masks to be used in the invention;

FIG. 4 is a plan view of a mask for exposure of a DRAM in the invention;

FIG. 41 is a plan pattern view of a mask in an embodiment of the invention;

FIG. 42 is a plan view of a finished pattern on a treated wafer corresponding to the mask;

DETAILED DESCRIPTION OF THE INVENTION

Figure 1:
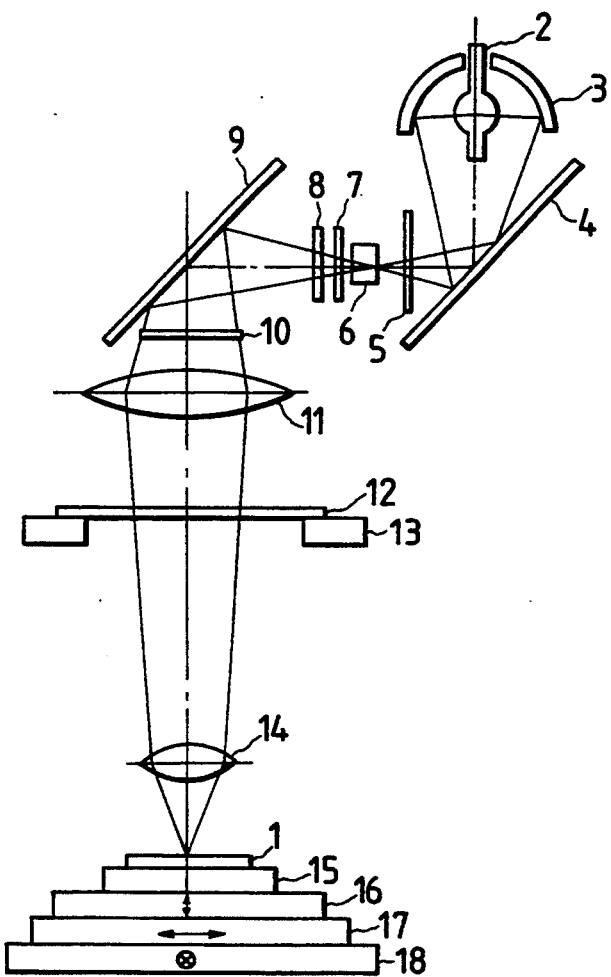
FIG. 1 is a front sectional view of a stepper to be used for exposure in the invention.

Explanation of the present invention will be carried out in embodiments as follows. Although each of the divided embodiments is explained for convenience of explanation, the embodiments are not separated but modifications having relations each other or constitute a part of other embodiment. Also, the same or similar parts are attached with the same reference numerals in each figure.

(i) Explanation of manufacturing process of a stepper, a mask or the like

FIG. 1 is an explanation diagram indicating representative constitution of an exposure device to be used for exposure system of mask patterns of each embodiment of the present invention. As a lens step-and-repeat type i-line 5:1 reduction projection device applicable to this exposure, there is, for example, i-line stepper NRS-175i7A (NA=0.5, exposure area=17.5 mm square) made by the Nihonkogaku (Nikon). In FIG. 1, numeral 1 designates a treated semiconductor wafer, such as Si single crystal wafer of 5-8 inches, numeral 2 designates a high pressure mercury lamp being a light source for exposure, numeral 3 designates a light collecting mirror, numeral 4 designates a first plane reflecting mirror, numeral 5 designates a shutter, numeral 6 designates a fly eye lens, numeral 7 designates an aperture to adjust the coherence factor $\sigma$ (used as $\sigma=0.5$ in the embodiment), numeral 8 designates a short cut filter to cut light at the deep ultraviolet side having a wavelength shorter than that of i-line in the case of i-line (365 nm), numeral 9 designates a second plane reflecting mirror, numeral 10 designates a mask blind determining the range of a transfer domain, numeral 11 designates a condenser lens for forming a Koehler illumination, numeral 12 designates a phase shift mask being an important part of the present invention, numeral 13 designates a mask holder which holds the mask and can be moved finely at least in the Z-axis direction, and numeral 14 designates a reduction projecting lens generally comprising a group of many lenses. In the stepper as above exemplified, the wafer side is constituted in telecentric way. Also, the mask side may be constituted in telecentric way. Numeral 15 designates a wafer adsorption block, numeral 16 designates a Z-axis moving block (in the height direction), numeral 17 designates an X-axis moving block (horizontal lateral direction), and numeral 18 designates a Y-axis moving block (horizontal longitudinal direction). The X-axis moving block 17 together with the Y-axis moving block 18 constitute the XY stage.

Figure 2:
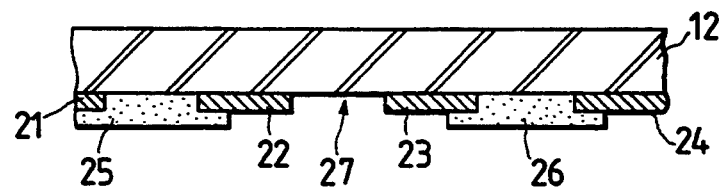
FIG. 2 is a front sectional view of a reticle or a mask in the invention.

FIG. 2 is a sectional view of a phase shift mask of the present invention. In FIG. 2, numerals 21 to 24 designate chromium shield films, numerals 25 and 26 designate phase shift films or shifters, and numeral 27 designates a mask substrate exposure region or non-shift light transmission region. The substrate exposing region does not always mean that a quartz glass substrate itself be exposed, but the substrate itself may be constituted by a quartz glass substrate as a substrate body and a thin transparent film formed on its surface.

Next, a method of forming the mask will be explained briefly.

The mask is formed in such a way that after a surface of a synthetic quartz glass plate is ground and washed, for example, a chromium film having thickness of about 0.05–0.3 $\mu$m is piled throughout its main surface by sputtering method, and subsequently a sensitive resist to an electron beam having film thickness of 0.1–0.8 $\mu$m is applied throughout the surface of the chromium film. Next, a desired pattern of the integrated circuit is processed using electron beam exposure technique. The electron beam exposure technique is in that a fine resist pattern is formed on a sample using electron ray, and the explanation will be added as follows.

Electron beams are irradiated using an electron beam plotting device onto a sample to which the electron beam sensitive resist is applied. The electron beam plotting device irradiates electron beams to designated position and designated form on the mask substrate being the sample, according to pattern data in which position coordinates and shape etc. of integrated circuit patterns are registered. Afterwards, when the resist is positive type, light exposed parts are removed by a prescribed developer, and the exposed metal film is etched by wet etching method or the like and a pattern is formed to a prescribed shape. When the resist is negative type, parts not yet exposed to light are removed by a prescribed developer, and a pattern is formed to a prescribed shape by etching. The resist is removed by a resist stripping liquid, and patterns are washed. Thereby the shielding domain and the transmission domain in prescribed shape are formed.

Subsequently, a pattern comprising a phase shifter for shifting phases of a transmission beam of light is formed onto a synthetic quartz glass substrate on which the chromium pattern is formed. The phase shifter designates the thickness of transparent substance (thickness at the center of the shifter opening) determined according to refractive index of the transparent substance and wavelength of the transmission light, and is a thin film of SOG (Spin On Glass), indium oxide (InOx) or the like. SOG is applied to the glass substrate with revolution, and afterwards, the transparent film is piled with hot baking. In this case, in order to invert the phase, the thickness d of the transparent film satisfies following relation $$d = \lambda/2\, (n-1)$$

where the wavelength of the transmission light is made $\lambda$, and the refractive index of the transparent film is made n. For example, when the wavelength $\lambda$ of the light used for the exposure is made 0.365 $\mu$m (i-line) and the refractive index n of the transparent film is made 1.5, the thickness of the transparent film may be made about 0.37 $\mu$m. However, under the consideration of variation caused by shifter formation (the film thickness of the shifter even at the best condition disperses about 80 angstrom, that is, about 2%), the phase error of about $\pi/20$–$\pi/10$ radian should be allowed in the phase inversion or the same phase. Accordingly, the expressions "phase inversion", "$\pi$ or equivalent thereto", "180° or equivalent thereto", "the same phase" etc. in the present application include these errors and the phase differences equivalent thereto, unless clearly specified.

The processings of necessary parts of the transparent film are carried out on the transparent substrate to which the transparent thin film having designated thickness is piled, using the electron beam exposure technique as described above. In order to invert the phase, the mask is subjected to hot baking after applying the SOG etc. onto the shading film of the glass substrate. In this case, the transparent film having the above film thickness can be obtained by controlling the viscosity of SOG and the rotating speed of the mask substrate at the SOG application.

When the electron beam exposure technique is used, for example, a charging prevention layer being made of aluminium with thickness 0.05 $\mu$m has been formed by the sputtering method or the like on the upper surface over a resist applied surface (lower surface in FIG. 2). Next, electron beam drawing is carried out, according to the pattern data or phase shifter processing corresponding to the pattern of the above-mentioned integrated circuit.

FIG. 3 indicates flow of the mask formation. In FIG. 3, numeral 31 designates a formation process of a synthetic quartz substrate for a mask, numeral 32 designates a piling process of a metal shielding film where a chromium film is deposited throughout almost full surface of one main surface of the substrate, numeral 33 designates a resist application process where a photoresist is spin-applied on the chromium film, numeral 34 designates an electron beam exposure process where the applied resist film is exposed by direct picture drawing with an electron beam exposure apparatus, numeral 35 designates a resist development process where unnecessary parts of the resist are removed and desired resist patterns are formed, numeral 36 designates an etching process of a metal shielding film where the chromium film is etched using the resist pattern as a mask, numeral 37 designates a resist removing process where the resist is fully removed afterwards, numeral 38 designates a correction process of loss or broken parts of the shielding film where loss parts among the shielding film are corrected, numeral 39 designates a correction process of shielding film remainder where the remainder part of unnecessary shielding film on the substrate is removed, and numeral 40 designates a mask washing process where the mask with the chromium pattern being completed is washed. Also in FIG. 3, numeral 42 designates a piling process of a phase shift film where a phase shift film is applied throughout almost full surface of the exposure domain with the chromium pattern being completed, numeral 43 designates a piling process of a charging prohibition film where a thin conductive film is piled on the phase shift film, numeral 44 designates a resist application process where a resist film for patterning the phase shift film is spin-applied, numeral 45 designates an electron beam exposure process where the resist film is exposed by direct picture drawing with electron beams similarly to the above, numeral 46 designates a resist development process where unnecessary parts of the resist film are removed and resist patterns are formed, numeral 47 designates an etching process of a phase shifter film where the phase shifter film is formed to a desired pattern using the resist film as a mask, numeral 48 designates a resist removing process where the resist film is removed afterwards, numeral 49 designates a correction process of loss or broken parts of the shifter where loss parts of the shifter are corrected on the substrate subjected to patterning, numeral 50 designates a correction process of shifter remainder where the remainder part of unnecessary shifter film is removed on the mask substrate similarly, and numeral 51 designates a mask washing process where the mask being completed for the present is washed.

Pattern defects produced in the mask manufacturing process of chromium patterns on the mask forming patterns comprising the shielding domain and the transmission domain can be corrected by using laser light, bundled ion beam etc. That is, when the shielding film remainder occurs in the transmission domain of the mask, it can be corrected by irradiating the laser light spot onto appropriate parts. Also, when any breakage in part of the shielding domain occurs, it can be corrected by piling up carbon films on broken parts by irradiating bundled ion beams while adding organic gases such as the pyrene gas ($C_{16}H_{10}$).

Shifter patterns on the mask similar to the carbon pattern can be corrected by sputtering cutting using irradiation of the bundled ion beams. Then, the depth d of a groove obtained by scraping the transparent substrate becomes $$d = \lambda/2 (n-1)$$

where the wavelength of transmission light is $\lambda$, and the refractive index of groove substance is n.

In the sputtering process using the ion beams, plasma ashing processing of $CF_4$ or the like is necessary to be applied after the processing in order to smooth the processed surface and to prevent the reduction of transmittance. The light transmittance having been reduced to about 90% can be improved to about 97% due to the above processing.

FIG. 4 is a plan layout of the mask of the present invention. In FIG. 4, numerals 61 and 62 designate wafer positioning marks with the wafer (FIG. 1), numeral 63 designates a chromium shielding band for a mask band, numeral 64 designates a part corresponding to scribe line on the wafer 1, numerals 71 and 81 designate parts corresponding to unit chip domain (for example, DRAM of 64 kbits) on wafers respectively, numerals 72 and 82 designate parts corresponding to the peripheral circuit domain of memory ICs respectively, and numerals 73-76 and 83-86 designate parts corresponding to memory mats of the ICs respectively.

Furthermore, in the embodiment, the explanation has been carried out in the type where the shifter films are placed on the chromium shielding films, but the invention is not limited to this, and it is needless to say that the invention can be applied to plan patterns in general for the type in which shifters are placed under chromium films and other phase shift masks.

Various kinds of mask patterns corresponding to the embodiments of the present invention will be explained as follows, but following rules are set about reference symbols of the drawings to avoid repetition. That is, alphabets of small letters attached next to each reference numeral indicate the following things. "a" indicates a non-shift real opening region (or main opening region) corresponding to the pattern on the wafer of the reference numeral, that is, a chromium opening region without shifter film or a mask surface exposed region (hereinafter referred to "chromium opening region etc."), "b" indicates a shift supplementary opening for supplementing the pattern exposure on the wafer of the reference numeral, that is, a supplementary pattern having a shifter film and not forming the real image of itself (hereinafter, phase shift amount is 180 degrees, unless indicated specifically), "c" indicates a chromium shielding region (indicated by partial hatching along the boundary, to distinguish the part and the boundary from others), "d" indicates a shifter film attached domain (indicated by broken line, to distinguish the boundary from other line), "e" indicates a non-shift reinforcement opening for reinforcing the pattern exposure intensity on the wafer of the reference numeral, that is, a supplementary pattern having no shifter film and not forming the real image of itself, "f" indicates a shift reinforcement opening for reinforcing the pattern exposure intensity on the wafer of the reference numeral, that is, an supplementary pattern having a shifter film and not forming the real image of itself, "g" indicates a shift real opening region (or main opening region) corresponding to a pattern on the wafer of the reference numeral, that is, a chromium opening region having a shift film or a mask surface having no chromium shielding film, "h" is a non-shift supplementary opening for supplementing the pattern exposure on the wafer of the reference numeral, that is, a supplementary pattern having no shifter film and not forming the real image of itself, "k" indicates a local shifter loss part to shape patterns being formed by shifter-on-quartz method, "m" is a surface where a mask surface is exposed, that is, a part where the phase shift amount is zero degree, "q" indicates an intermediate phase shift region (a buffer zone) having intermediate phase shift amount of 60 degrees, "r" indicates an intermediate phase shift region (a buffer zone) having intermediate phase shift amount of 120 degrees, and the second alphabet "y" indicates that it is associated with the second mask in the process of exposing one pattern using two masks.

Further, the devices, materials and various conditions being used for the exposure and patterning will be summarized as follows. As a stepper, the NSR1755I8A (reduction ratio=5:1, exposure wavelength i-line=365 nm monochromatic light) Nikon Inc. was used under the condition that NA=0.5, partial coherence factor $\sigma = 0.5$. As a positive resist, the high resolution resist for i-line NPR-A185SH2 of the NAGASE SANGYO corporation was used, and as a negative resist, the high resolution chemical amplification system resist for i-line Ri-1300N of the Hitachi Chemicals Inc. was used.

Then, the following mask pattern will be explained in a DRAM having a line pattern minimum dimension of 0.35 µm and a hole pattern minimum dimension of 0.4 µm taken as an example.

(1) Isolated linear pattern

Figure 6:
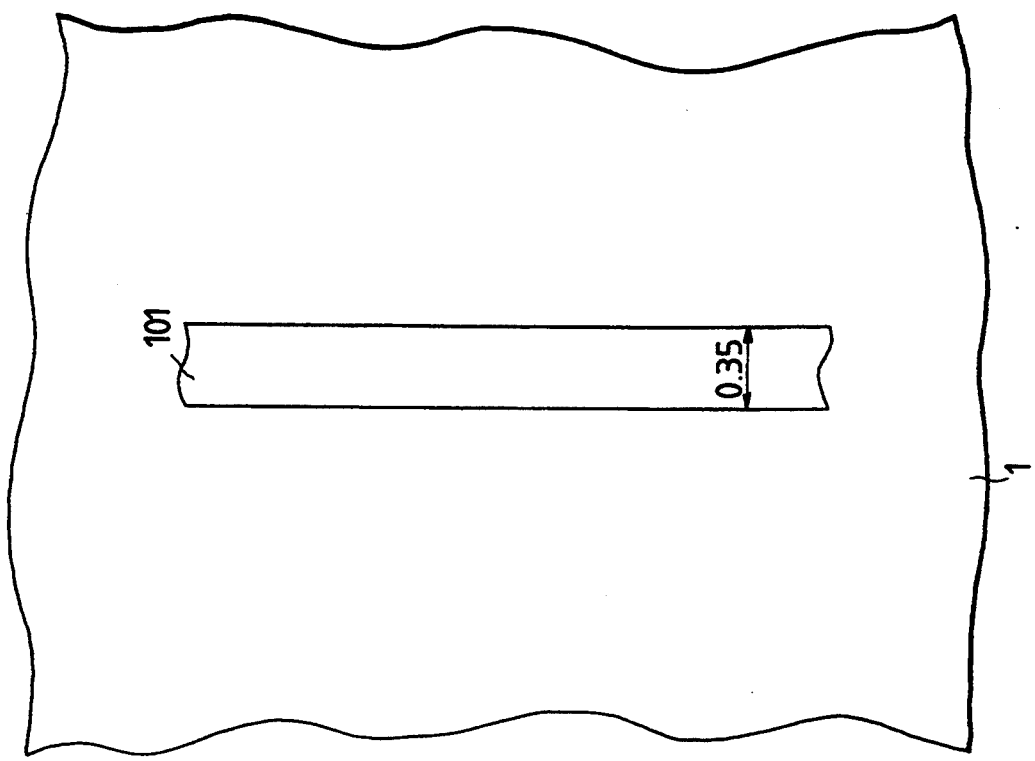
FIG. 6 is a plan view of a finished pattern on a treated wafer corresponding to the mask.
Figure 5:
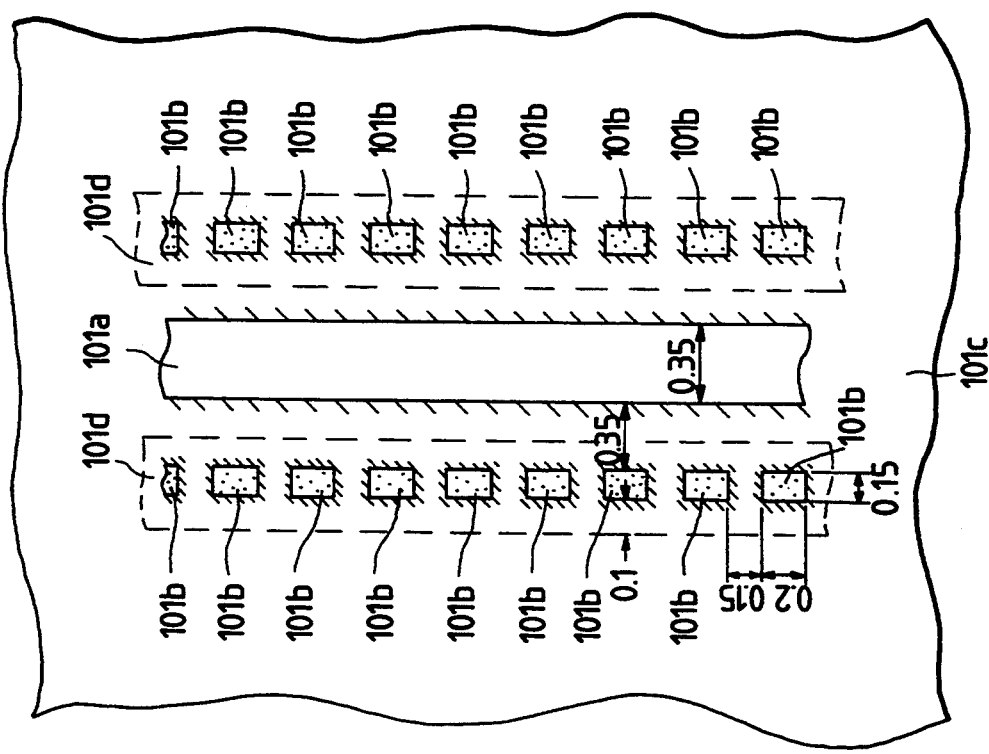
FIG. 5 is a plan pattern view of a mask in an embodiment of the invention.

FIG. 5 shows a pattern where real patterns are not close to each other on the same mask among linear patterns such as aluminium wirings, that is, a phase shift mask pattern for exposing isolated linear patterns on a wafer as shown in FIG. 6, using negative resist. Dimensions described in FIG. 5 are those in conversion on the wafer in unit of µm unless clearly specified. Accordingly, the shown value may be multiplied by 5 to know a dimension on the actual mask. Also, all these drawings are those of a wafer or a mask set to the exposure device seen from the upper side. In these drawings, numeral 101a designates a non-shift real opening region corresponding to a linear pattern 101 on a wafer, many numerals 101b designate dot-shaped shift supplementary opening regions having the same shape and arranged at regular intervals respectively, numeral 101c designates a chromium shielding region, and numeral 101d designates a shifter film attaching domain. A partial hatching is applied to distinguish the chromium shielding region from the non-shift opening region in FIG. 5. Also, to indicate opening regions with shifter films, indications by scattered dots are applied to the parts.

The reason why the supplementary opening regions are divided in this way is as follows. Connection with the present width results in the production of undesired patterns in relation to NA, because of partial or overall dissolution. On the other hand, if width of band-shaped supplementary opening region is thinned so as not to resolve it at all, patterning of the mask itself by EB becomes difficult. If supplementary opening regions are divided in the above way, both space period of supplementary opening regions as a whole and respective Fourier components in X, Y directions for individual supplementary opening regions fall out of projecting lens, and undesired patterns are not produced.

(2) Projected linear pattern

Figure 8:
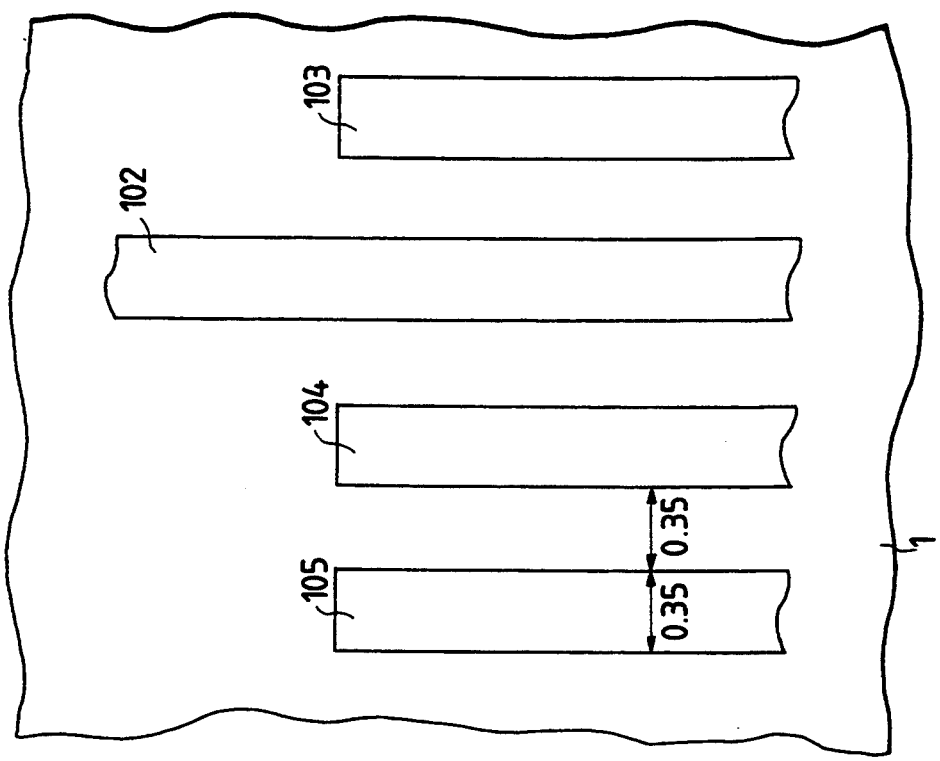
FIG. 8 is a plan view of a finished pattern on a treated wafer corresponding to the mask.
Figure 7:
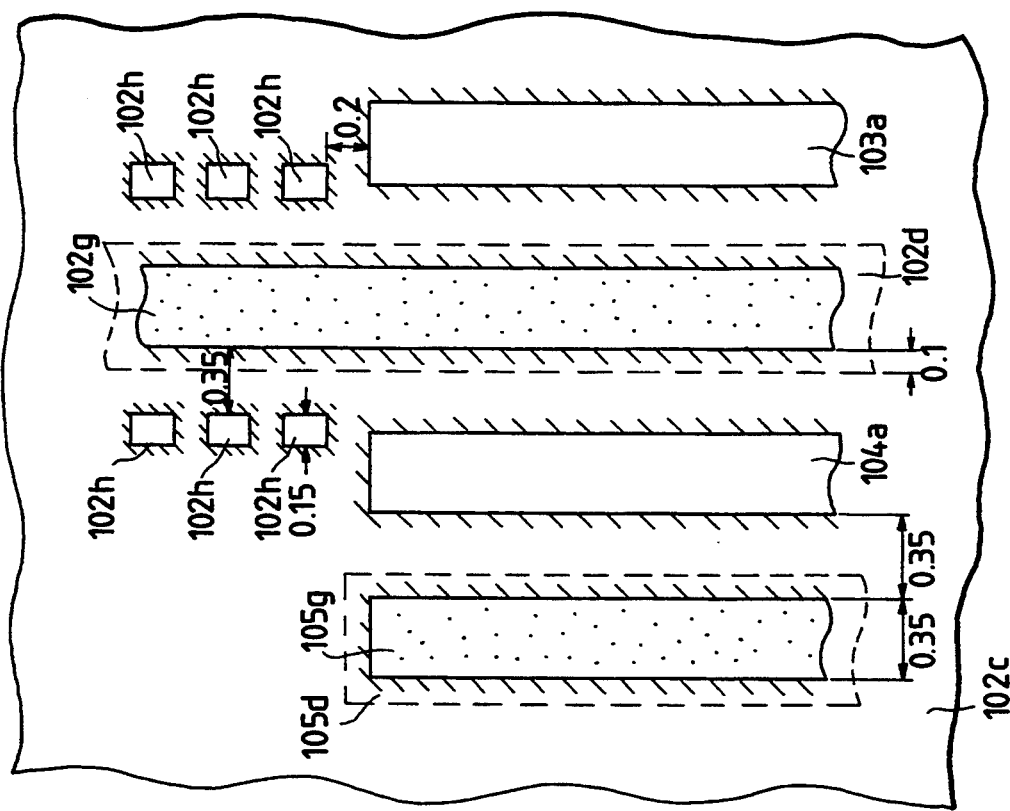
FIG. 7 is a plan pattern view of a mask in an embodiment of the invention.

FIG. 7 is one of application of the technique in FIG. 5 and indicates phase shift mask patterns where the linear pattern group with linear patterns projecting every several lines or one line as shown in FIG. 8 is exposed using negative resists as described above. In these drawings, numeral 102 designates a long linear pattern on the wafer 1, numerals 103 to 105 designates short linear patterns spaced with regular intervals from the long linear pattern, numeral 102g designates a shift real opening region on the mask corresponding to the long linear pattern 102, numeral 102h designates many dot-shaped non-shift supplementary opening regions for preventing the projecting part of the long linear pattern 102 from being thinned, numerals 103a and 104a designate non-shift real opening regions corresponding to the short linear patterns 103 and 104 respectively, numeral 105g designates a shift real opening region corresponding to the short linear pattern 105, numeral 102d designates a shifter film attaching domain corresponding to the long linear pattern 102, numeral 105d designates a shifter film attaching domain corresponding to the short linear pattern 105, and numeral 102c designates a chromium shielding region. Unless treated in this way, as the projection part of the pattern 102 has no positive contribution from both openings 103 and 104, the pattern becomes thinner.

(3) Supplementary opening on the periodic structure end

Figure 10:
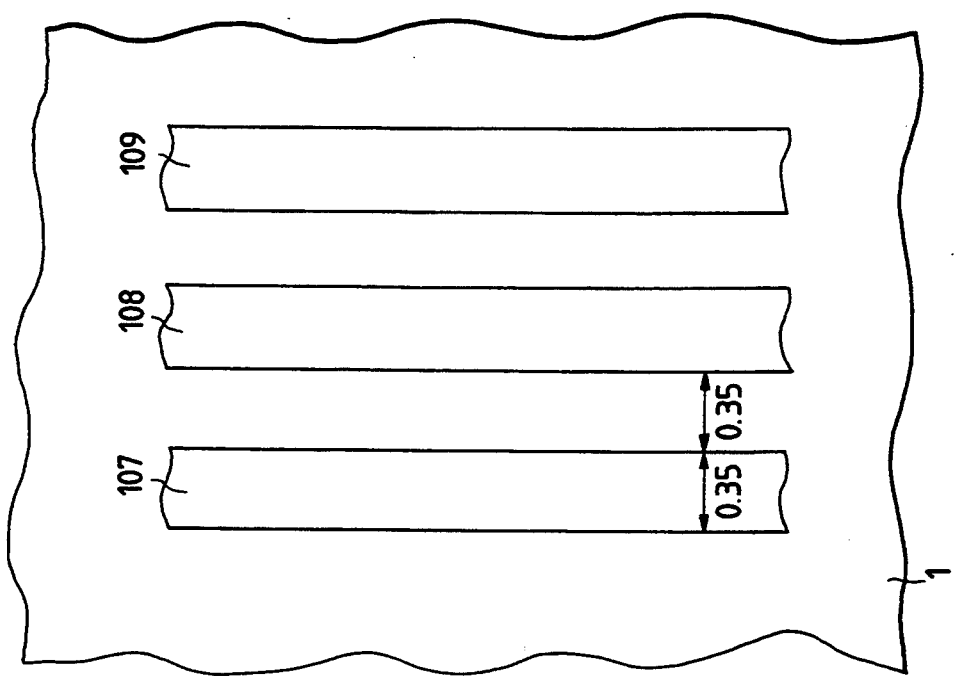
FIG. 10 is a plan view of a finished pattern on a treated wafer corresponding to the mask.
Figure 9:
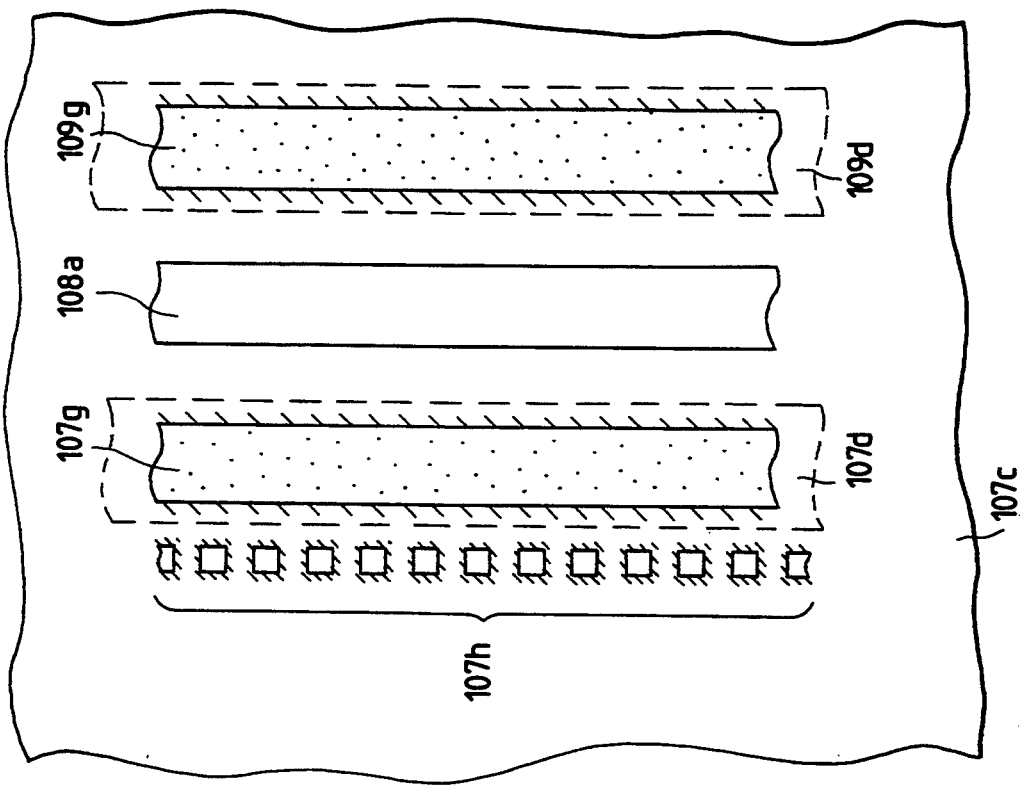
FIG. 9 is a plan pattern view of a mask in an embodiment of the invention.

FIG. 9 is one of applications of the technique in FIG. 5 and indicates phase shift mask patterns for preventing the phenomena in which the end pattern becomes thinner at the exposure of many periodic linear patterns by negative resists as shown in FIG. 10. Further, dimensions on the mask are not repeated, as they are approximately equal to those of the preceding embodiments. In these drawings, numerals 107 to 109 designate many linear patterns with equal width arranged at the same period, and among them, the linear pattern 107 forms the left end. Numeral 107h designates a supplementary pattern for preventing the end pattern 107 from being thinned. Unless treated in this way, as the pattern 107 has no positive contribution from the left side, the pattern becomes thinner.

(4) Dummy pattern of the periodic structure end

Figure 12:
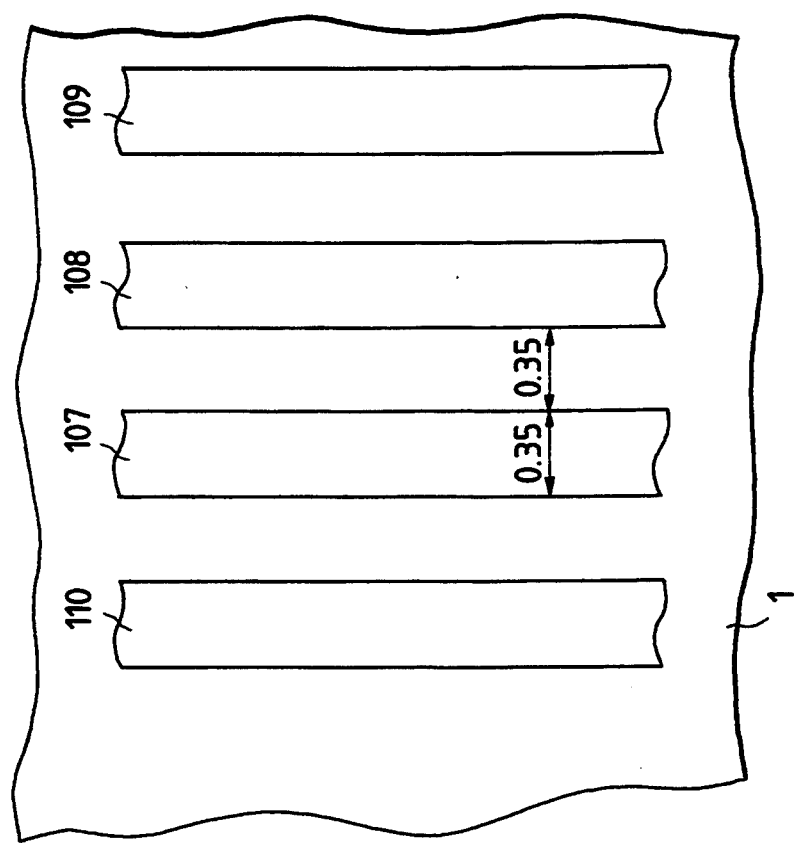
FIG. 12 is a plan view of a finished pattern on a treated wafer corresponding to the mask.
Figure 11:
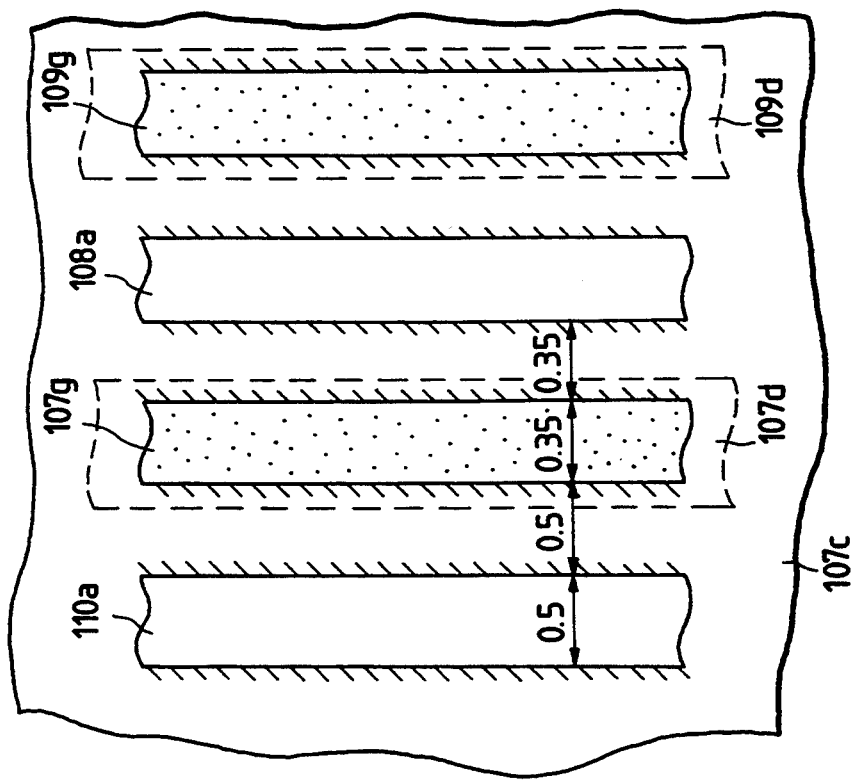
FIG. 11 is a plan pattern view of a mask in an embodiment of the invention.

FIG. 11 is a modification of FIG. 9, and indicates mask patterns where in place of the supplementary pattern disposed at the end, a wide dummy non-shift opening 110a focusing a real pattern 110 (FIG. 12) is arranged. In this case, the pattern 110 corresponding to this dummy pattern remains as shown in FIG. 12.

(5) Widening of pattern width of the periodic structure end

Figure 14:
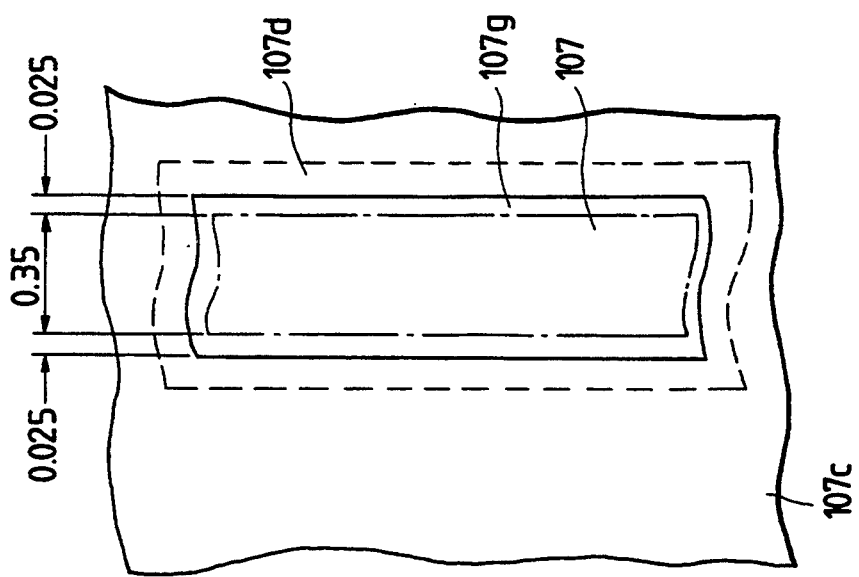
FIG. 14 is a plan view of a finished pattern on a treated wafer corresponding to the mask.
Figure 13:
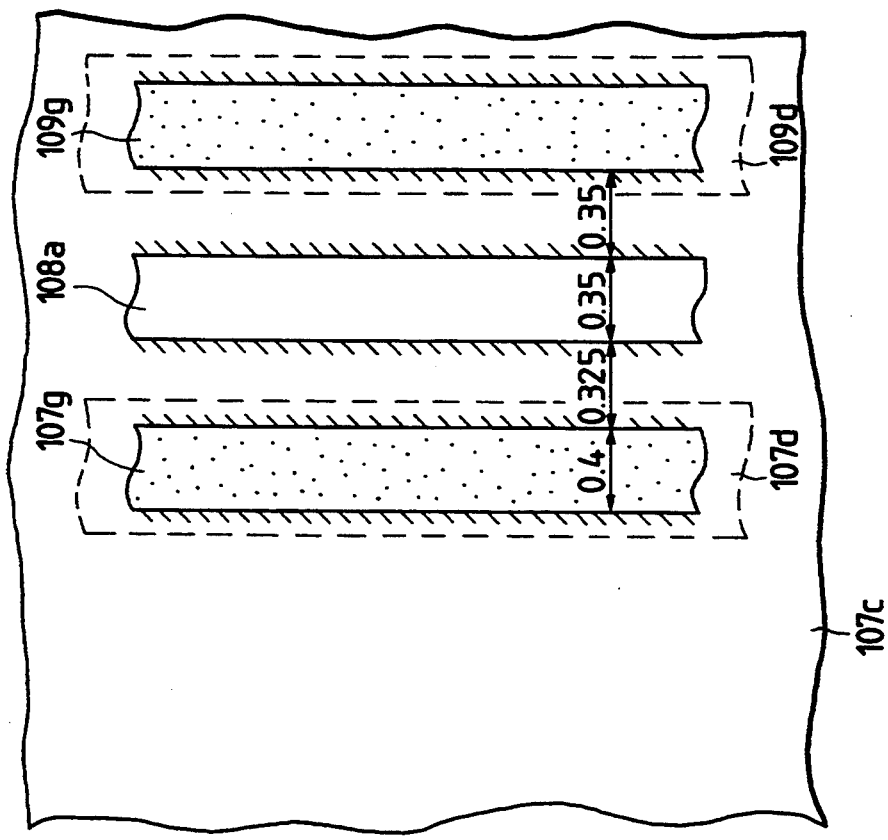
FIG. 13 is a plan pattern view of a mask in an embodiment of the invention.

FIG. 13 is a modification of FIG. 9, and indicates mask patterns where in place of the supplementary pattern disposed at the end, a wide shift real opening 107g focusing the real pattern 107 (FIG. 10) with its desired width is arranged under consideration of the effect thinning due to the end. FIG. 14 is an enlarged plan view of the mask pattern in FIG. 13, indicating the manner that the wide opening pattern 107g at the end becomes the pattern 107 on the wafer having the desired width due to the thinning caused by the exposure.

(6) Normal arrangement and alternate phase inversion close hole pattern

Figure 16:
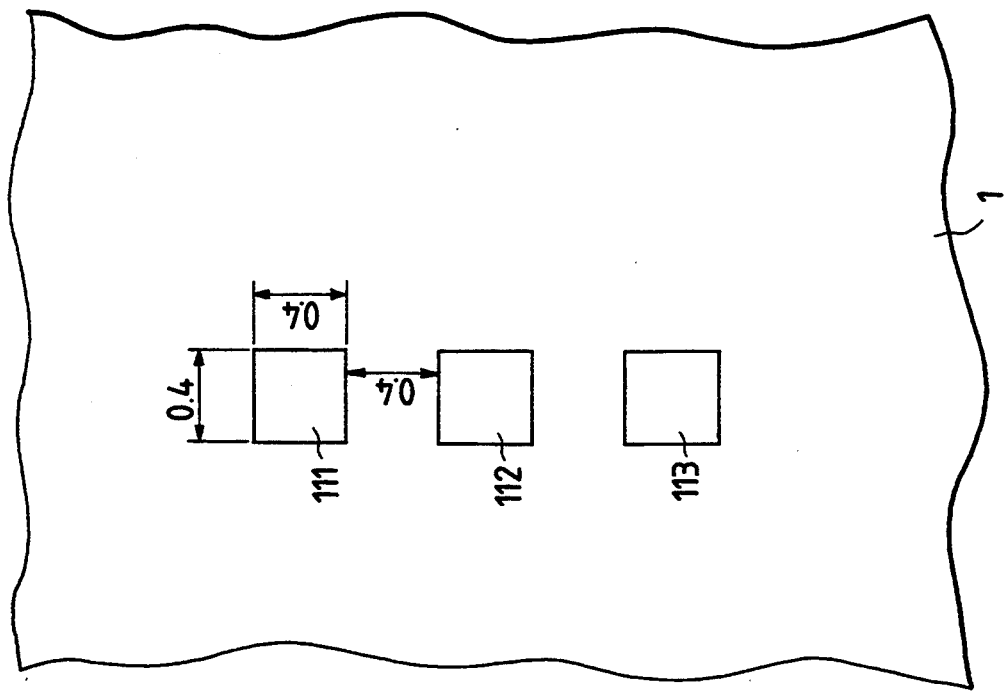
FIG. 16 is a plan view of a finished pattern on a treated wafer corresponding to the mask.
Figure 15:
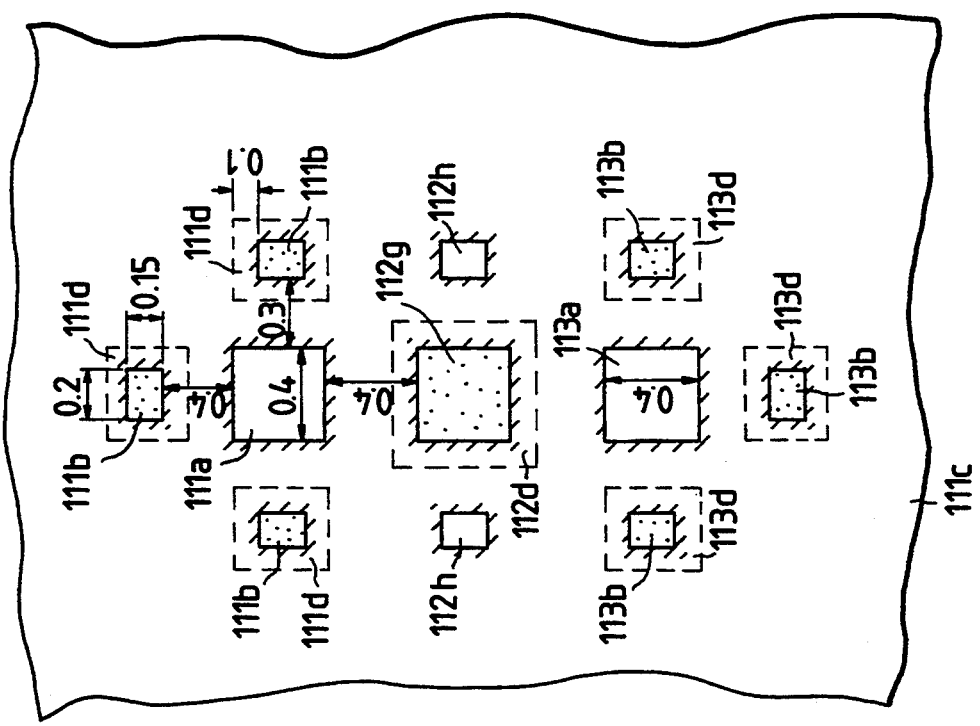
FIG. 15 is a plan pattern view of a mask in an embodiment of the invention.

FIG. 15 indicates phase shift mask patterns where square hole patterns 111 to 113 arranged in line with regular intervals and having the same shape (the dimension is equal) as shown in FIG. 16 are patterned by positive resists. In this example, one of supplementary patterns 111b, 112h, 113b having the same shape and arranged on four corners of neighboring real patterns is omitted, and instead, neighboring real openings 111a, 112g, 113a are subjected to phase inversion alternately. The mask pattern in this mode is especially effective when interval between hole patterns is not more than 0.6 µm.

(7) Normal arrangement supplementary pattern common close hole pattern

Figure 18:
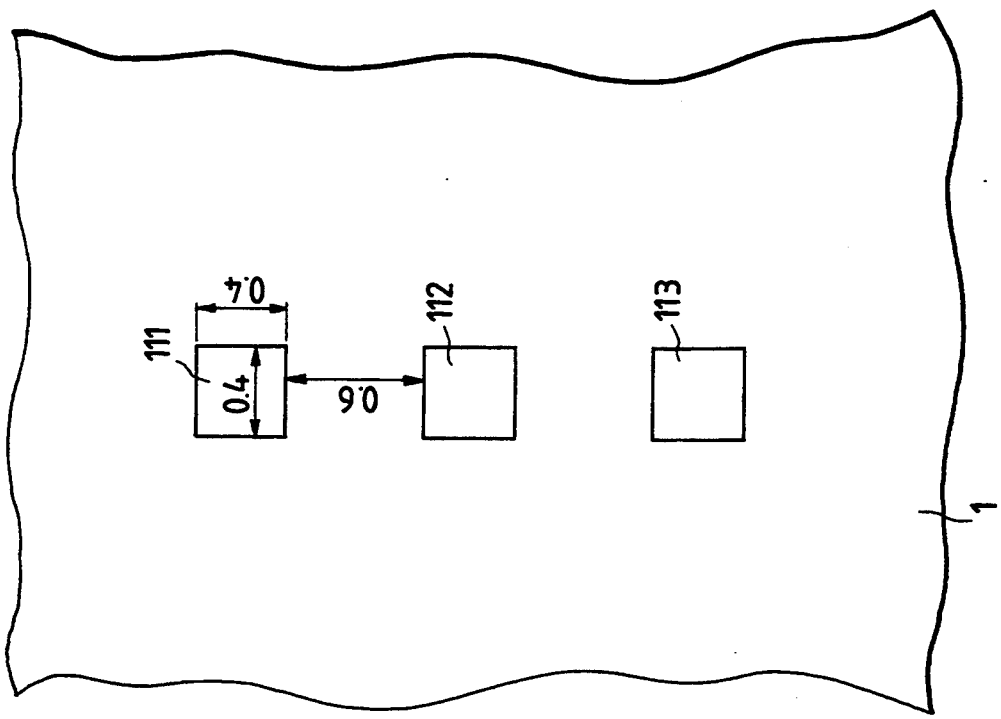
FIG. 18 is a plan view of a finished pattern on a treated wafer corresponding to the mask.
Figure 17:
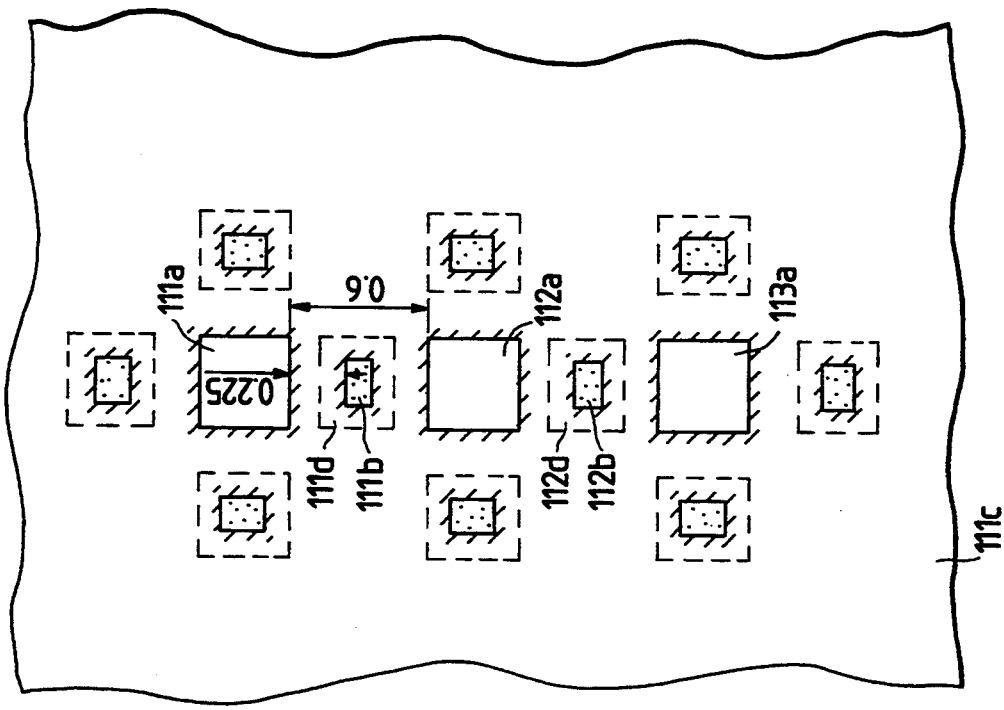
FIG. 17 is a plan pattern view of a mask in an embodiment of the invention.

FIG. 17 is nearly the same as the case in FIG. 15, but indicates phase shift mask patterns where hole intervals are slightly larger as shown in FIG. 18. In the following example, mask dimensions being not clearly specified are the same as those in FIG. 15. In this case, the real openings have the same phase, and instead, supplementary openings of four corners of each real opening are shared one by one. The mask pattern in this mode is especially effective when interval between hole patterns is not less than 0.6 µm and not more than 1.1 µm.

Figure 20:
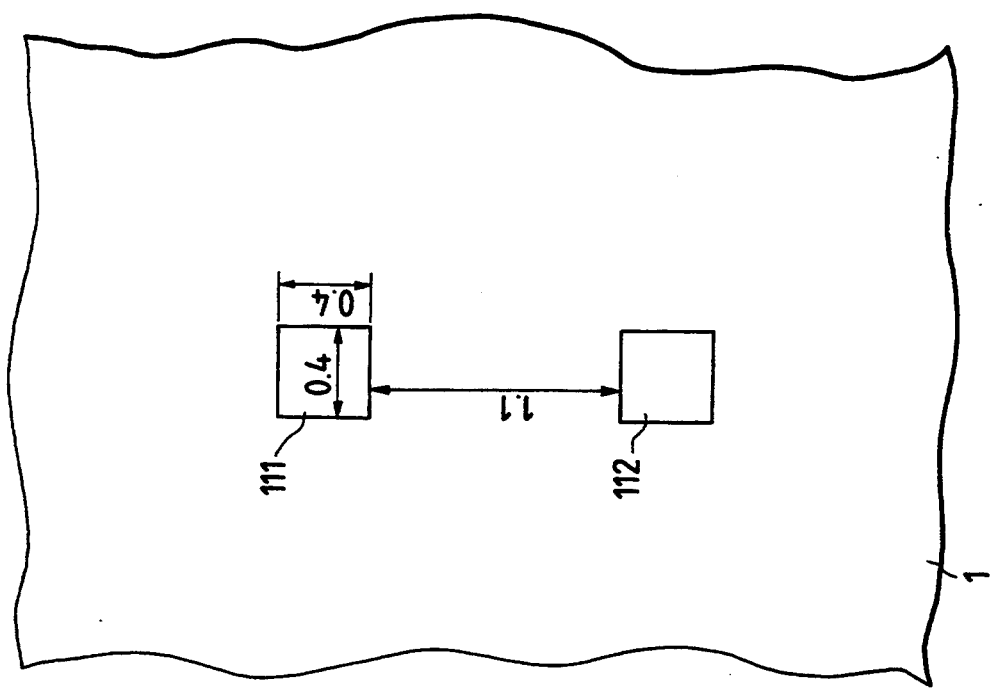
FIG. 20 is a plan view of a finished pattern on a treated wafer corresponding to the mask.
Figure 19:
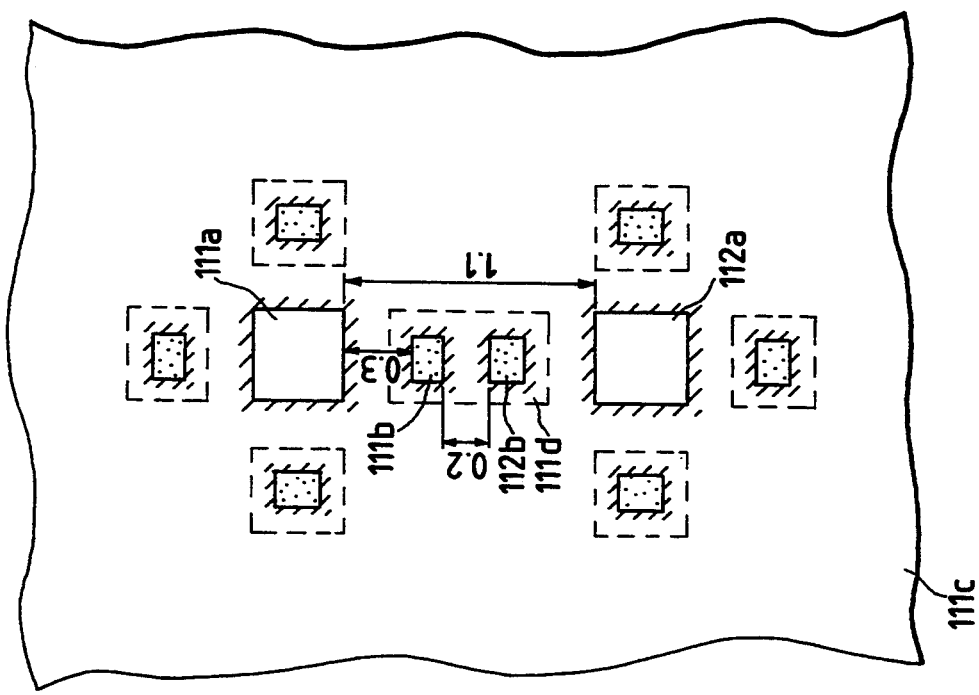
FIG. 19 is a plan pattern view of a mask in an embodiment of the invention.
Figure 22:
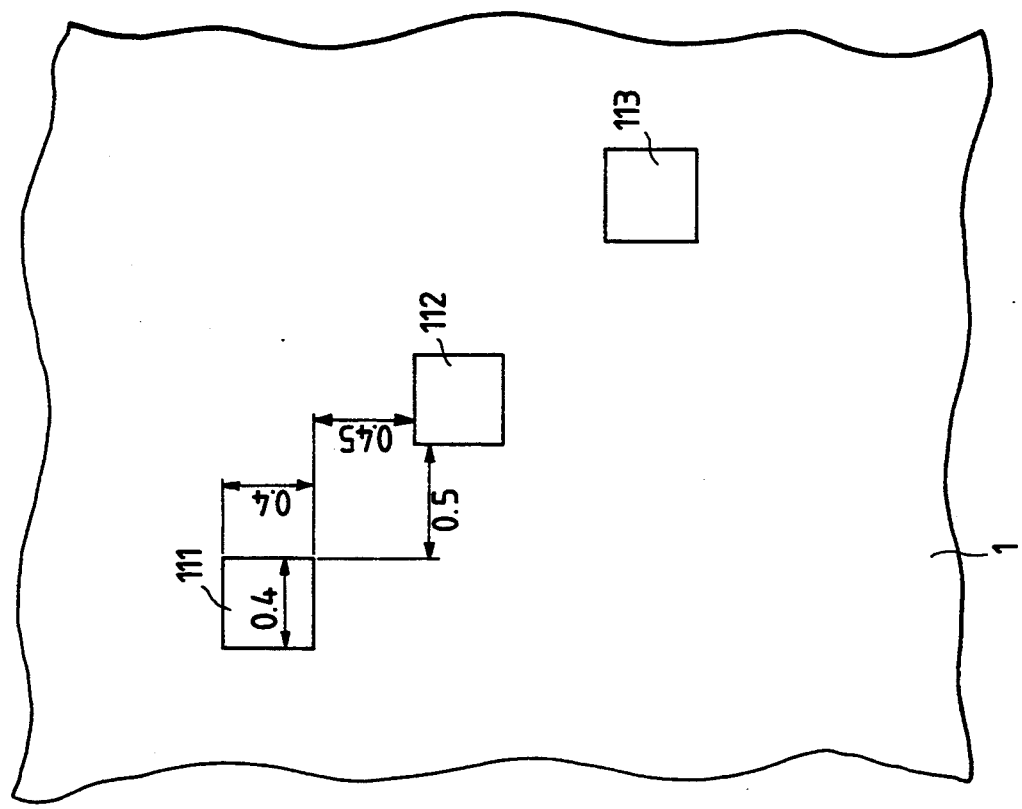
FIG. 22 is a plan view of a finished pattern on a treated wafer corresponding to the mask.

(8) Shifter film sharing close hole pattern for a normal arrangement supplementary pattern FIG. 19 is nearly the same as the case in FIG. 17, but indicates phase shift mask patterns where hole intervals are further made larger and the pattern is similar to a complete isolated pattern as shown in FIG. 20. In this case, as a shifter film 111d for supplementary openings 111b and 112b to which real openings 111a and 112a come close respectively is constituted by a common island, margin for the pattern formation is large. The mask pattern in this mode is especially effective when interval between hole patterns is not less than 1.1 μm.

Figure 21:
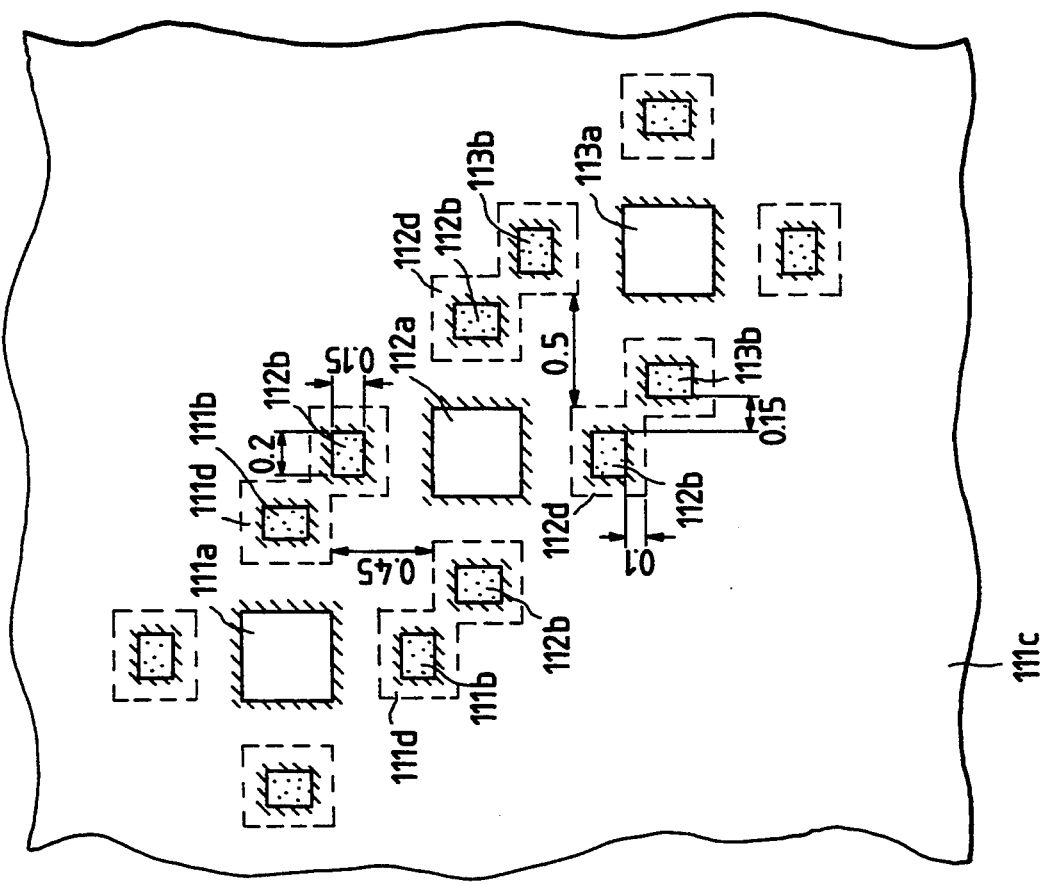
FIG. 21 is a plan pattern view of a mask in an embodiment of the invention.

(9) Shifter film sharing close hole pattern for an oblique arranged supplementary pattern FIG. 21 is nearly the same as the case in FIG. 19, but indicates phase shift mask patterns where holes are arranged with regular intervals nearly in the diagonal direction. In this case, as a shifter film 111d (112d) for supplementary openings 111b and 112b (112b and 113b) to which real openings 111a and 112a (112a and 113a) come close respectively is constituted by a common island, margin for the pattern formation is large.

(10) Zigzag configuration alternate phase inversion close hole pattern

Figure 24:
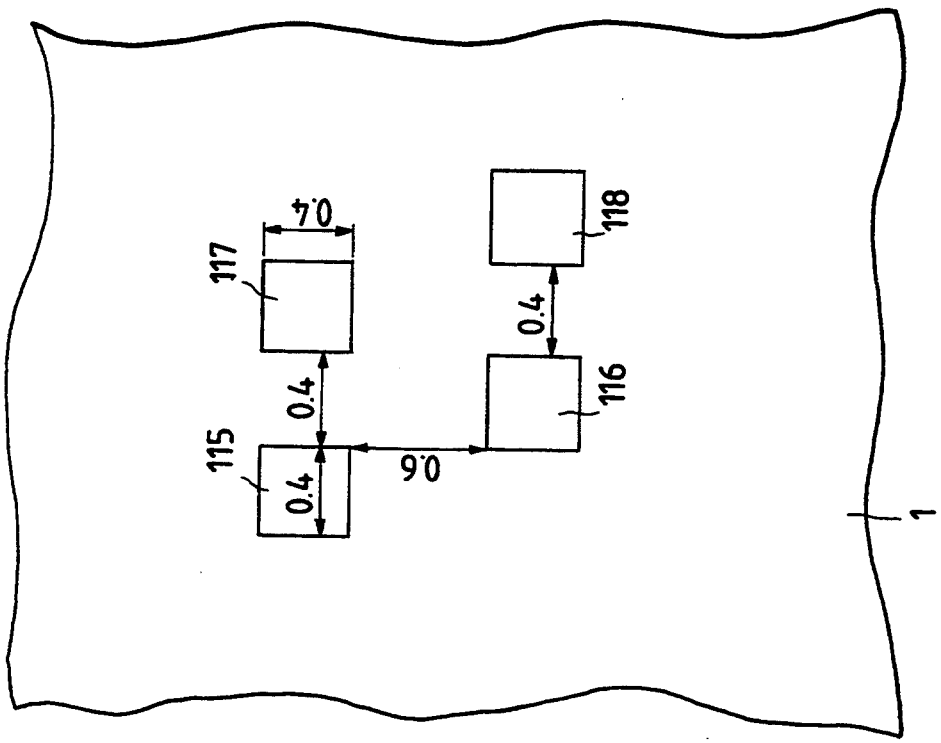
FIG. 24 is a plan view of a finished pattern on a treated wafer corresponding to the mask.
Figure 23:
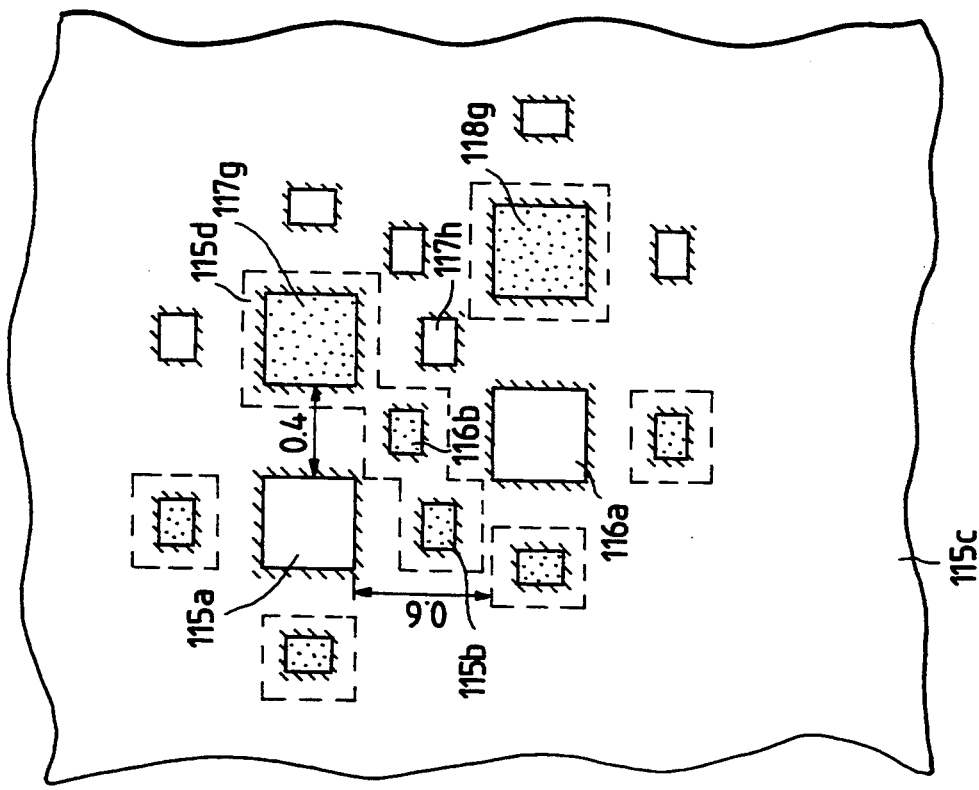
FIG. 23 is a plan pattern view of a mask in an embodiment of the invention.

FIG. 23 indicates phase shift mask patterns when hole lines 115 to 118 in FIG. 15 are arranged with half a period shifted in zigzag form as shown in FIG. 24. In this case, phases of real opening regions 115a and 117a in lateral direction are inverted alternately. Also, a shifter film for a shift real opening region 117g and a shifter film 115d of shift supplementary opening regions 115b and 116b for non-shift opening regions 115a and 116a form a common island. Therefore, margin for the pattern formation is large. The mask pattern in this mode is especially effective when lateral interval between hole patterns is not more than 0.6 μm.

Figure 26:
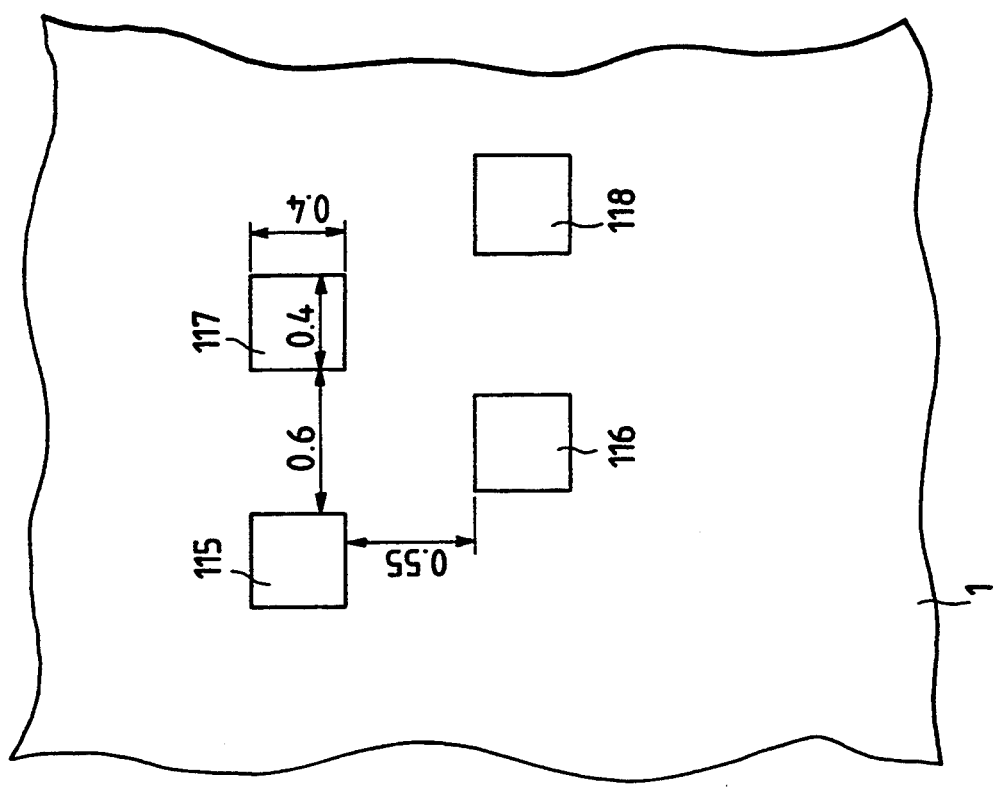
FIG. 26 is a plan view of a finished pattern on a treated pattern corresponding to the mask.
Figure 25:
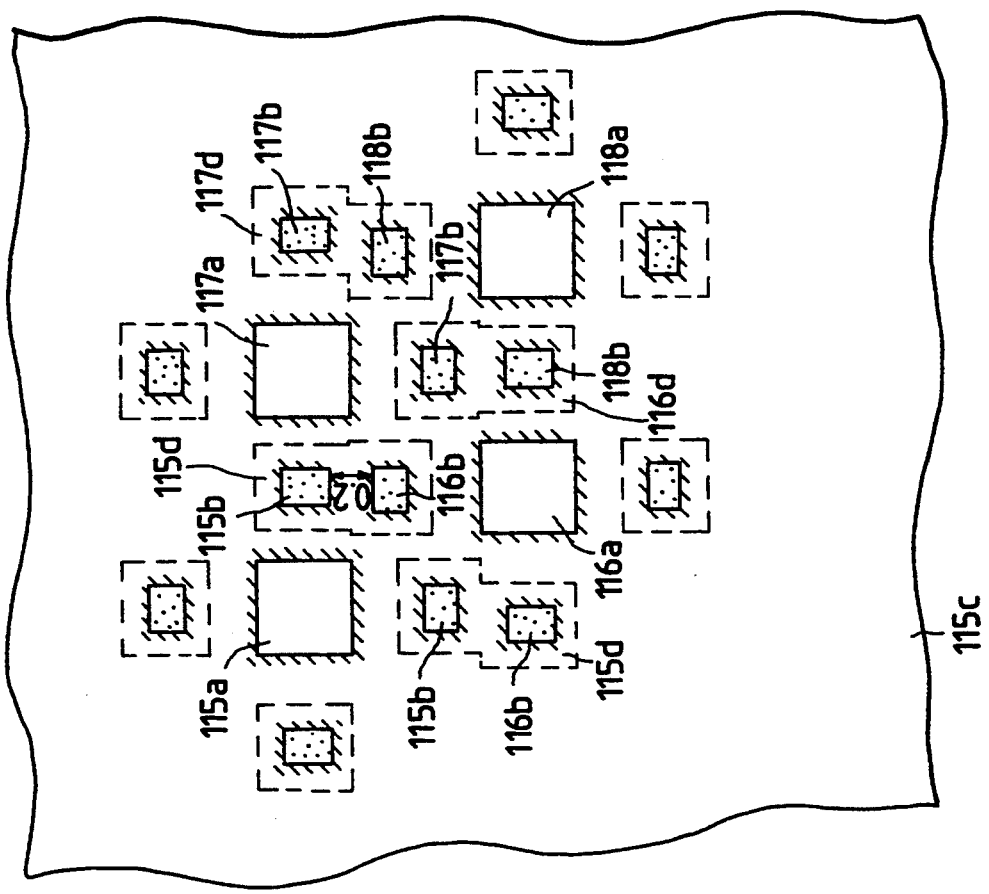
FIG. 25 is a plan pattern view of a mask in an embodiment of the invention.

(11) Zigzag configuration supplementary opening and shifter film sharing close hole pattern FIG. 25 is nearly the same as the case in FIG. 23, but indicates phase shift mask patterns where lateral pitches can be taken a little larger as shown in FIG. 26. In this case, a part of supplementary opening regions 115b and 118b is intended to be common to real opening regions 115a and 117a as well as 116a and 118a which are neighboring laterally. In such a configuration, the longitudinal pitches can be compressed, comparing with FIG. 23. The mask pattern in this mode is especially effective when the lateral interval between hole patterns is not less than 0.6 μm and not more than 1.1 μm.

(12) Hole pattern mixture configuration

Figure 27:
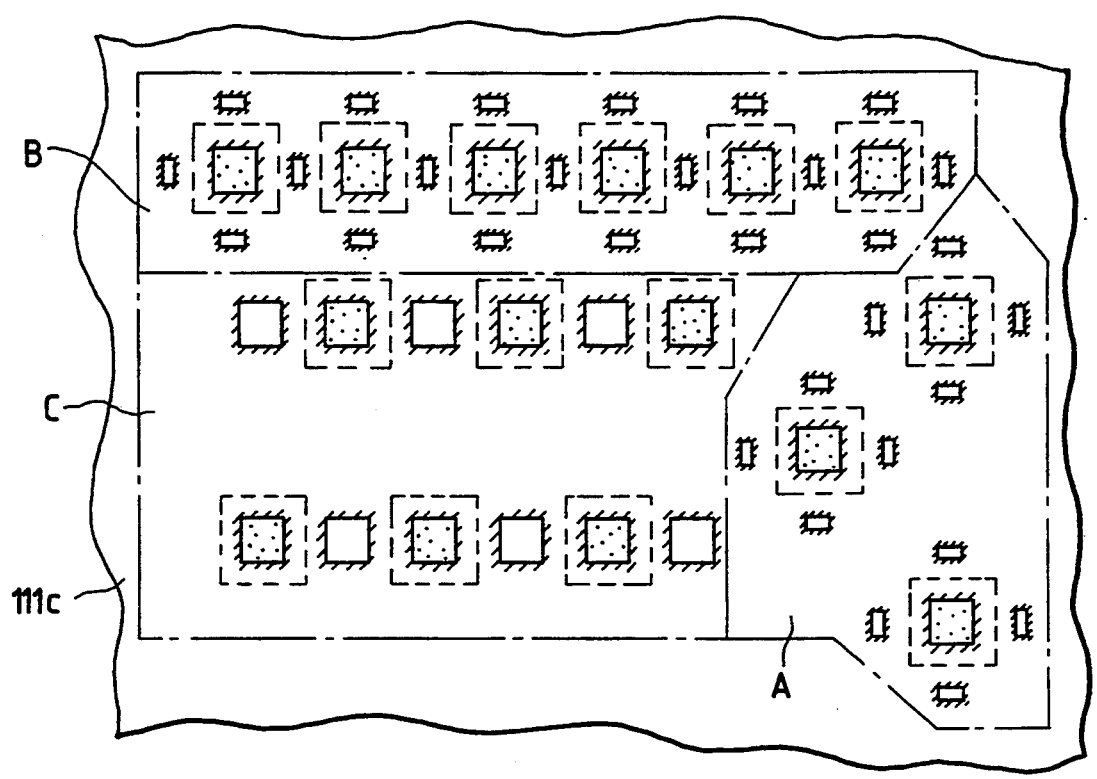
FIG. 27 is a plan pattern view of a mask in an embodiment of the invention.
Figure 28:
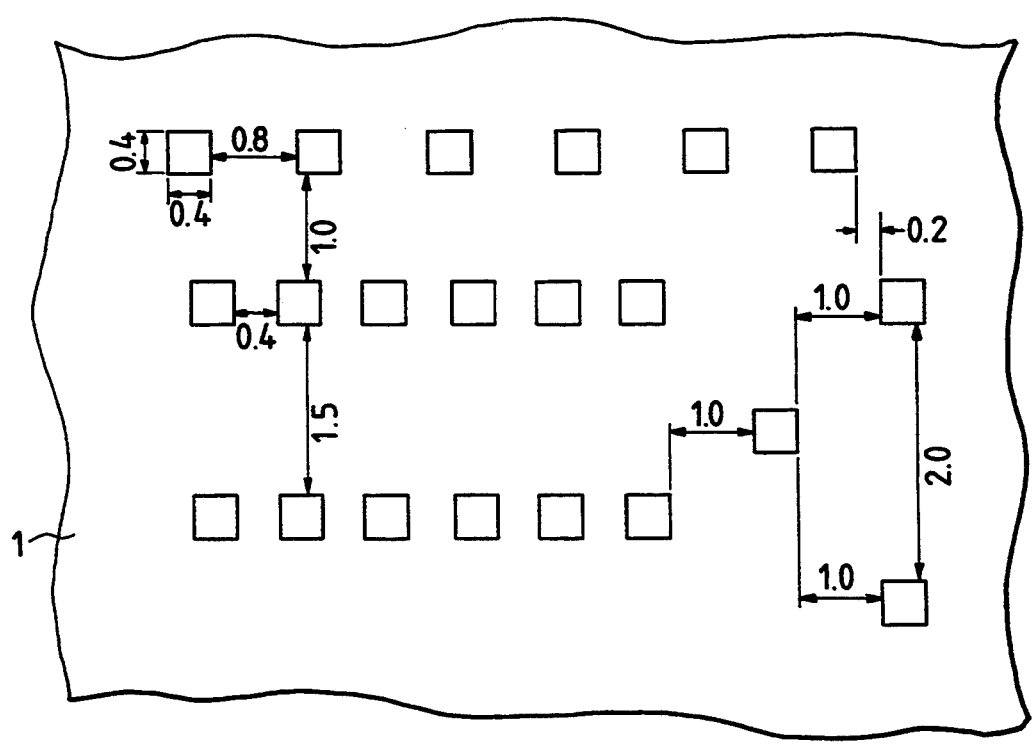
FIG. 28 is a plan view of a finished pattern on a treated wafer corresponding to the mask.

FIG. 27 indicates phase shift mask patterns where mask pattern modes in three kinds A, B, C are used together, and many contact holes having the same size as shown in FIG. 28 are formed by positive resists. In this case, mode A is responsive to a completely isolated hole, mode B is responsive to FIG. 17, and mode C is responsive to FIG. 15. In the mode C, however, a supplementary opening is not used, but phases of corresponding real openings in neighboring lines are inverted.

(13) T type branch reinforcement opening

Figure 29:
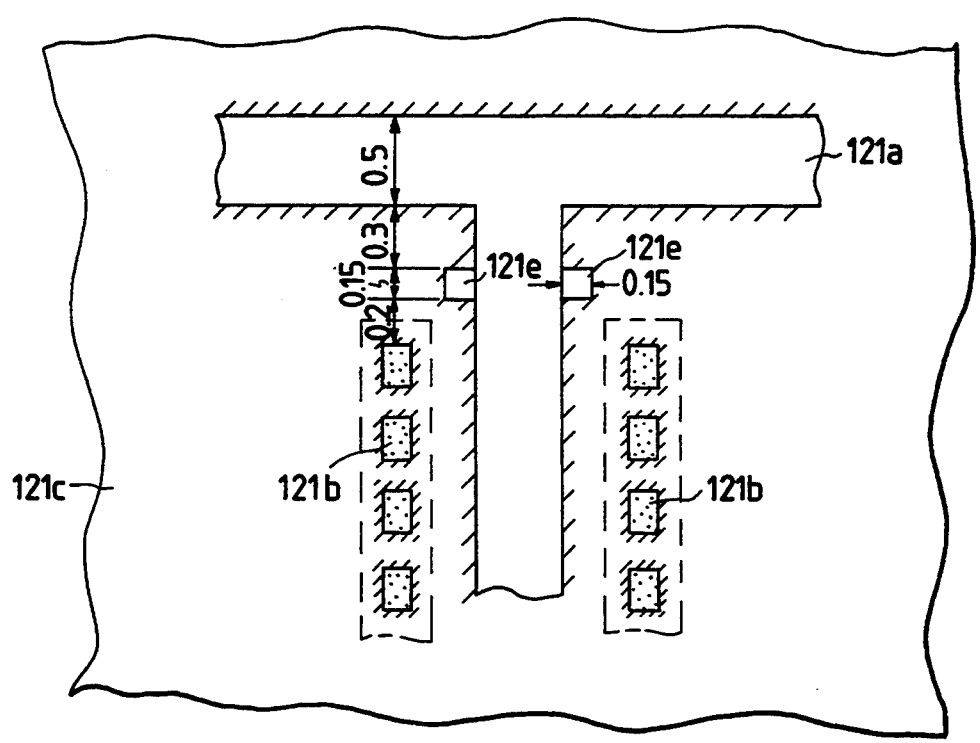
FIG. 29 is a plan pattern view of a mask in an embodiment of the invention.
Figure 30:
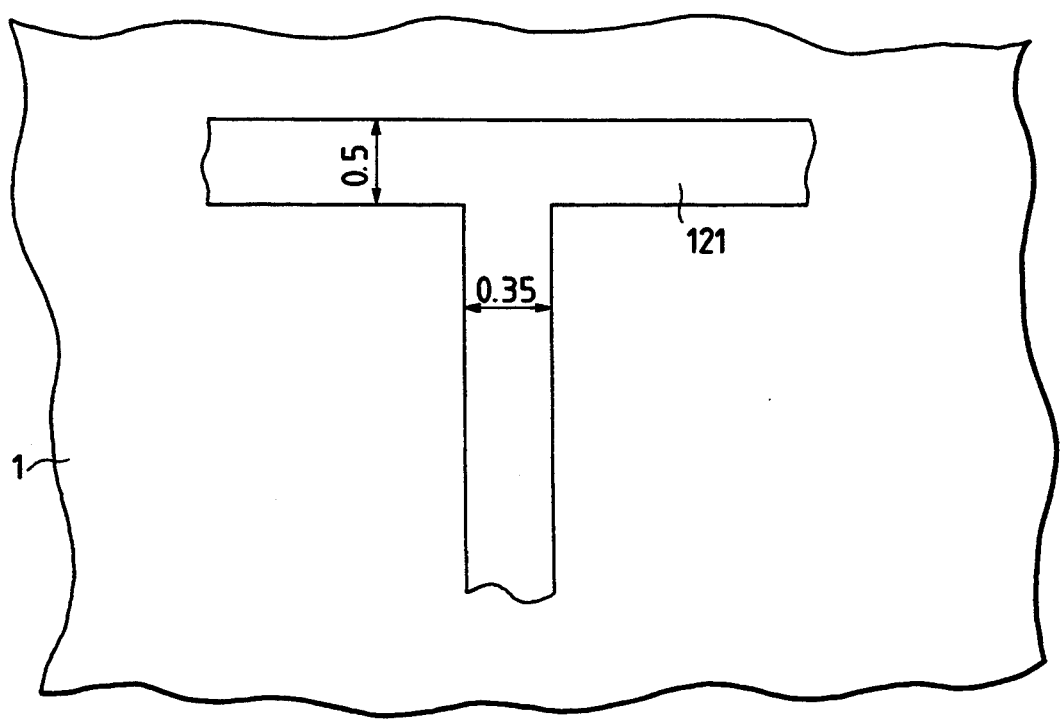
FIG. 30 is a plan view of a finished pattern corresponding to the mask.

FIG. 29 indicates phase shift mask patterns where a T type linear pattern 121 of Al wiring etc. as shown in FIG. 30 is exposed by negative resists shown in FIG. 5 and phase shift supplementary openings 121b. In this case, as the thinning of pattern due to interference is generated at the joint part of the hammer handle of the pattern 121, a pair of non-shift reinforcement openings 121e are provided continuous to or very close with the non-shift real opening 121a, that is, a fine supplementary opening which does not resolve and has the same phase as the real opening corresponding thereto is provided.

By carrying out the above, as an apparent quantity of light on the real opening close to a pair of non-shift reinforcement openings 121e is increased, occurrence of the thinning of pattern due to interference can be prevented at the joint of the hammer handle of the pattern 121.

Figure 87:
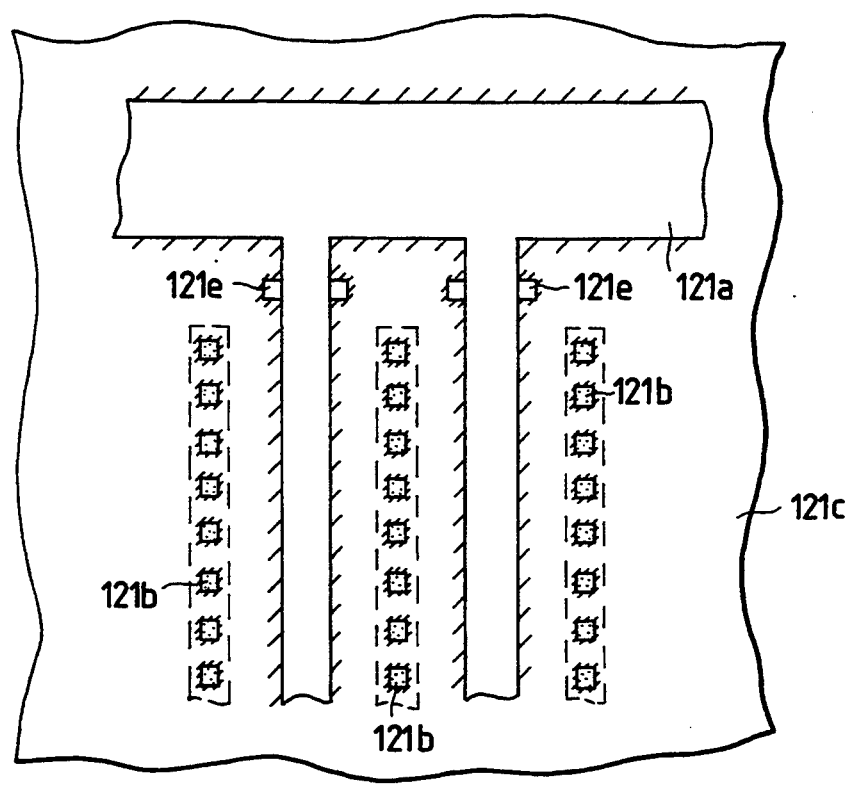
FIG. 87 is a plan pattern view of a mask in an embodiment of the invention.
Figure 88:
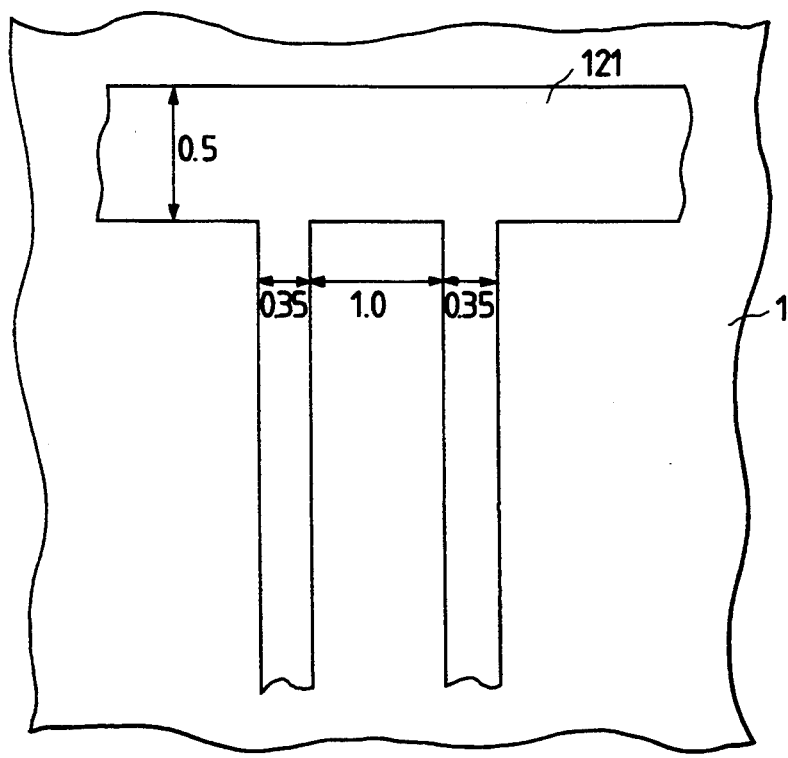
FIG. 88 is a plan view of a finished pattern on a wafer corresponding to the mask.

FIG. 87 indicates a modification where a plurality of the hammer handles or landing piers are projected, and these are relatively close (interval from 0.8 μm to 1.2 μm).

Figure 89:
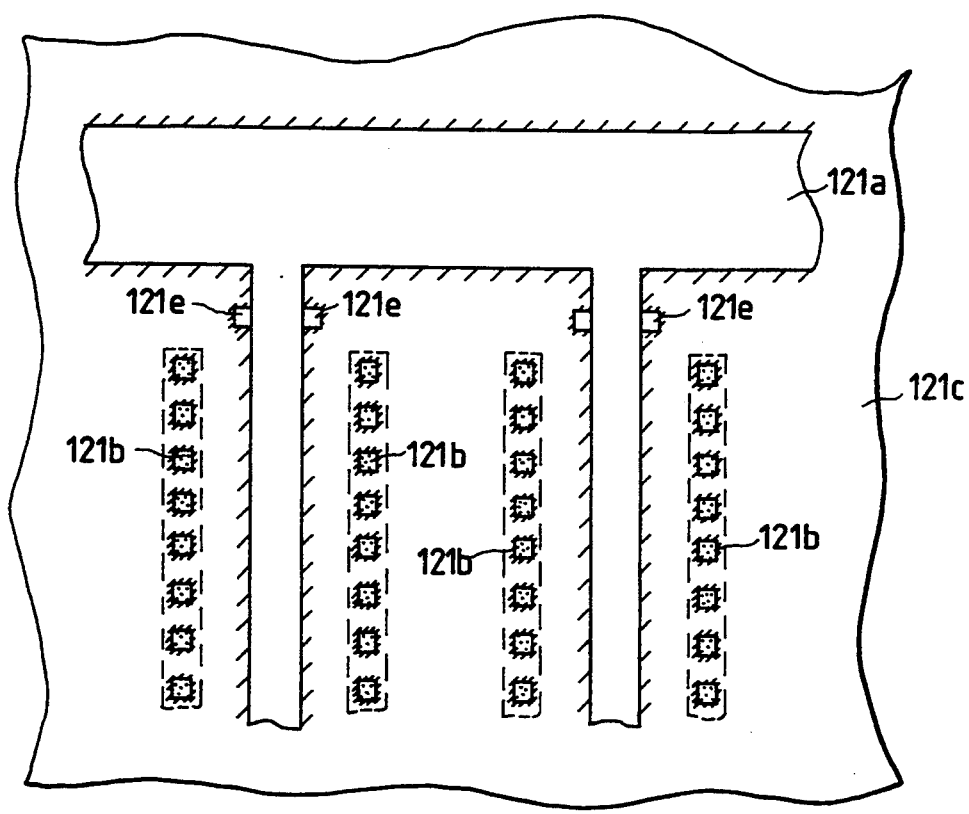
FIG. 89 is a plan pattern view of a mask in an embodiment of the invention.
Figure 90:
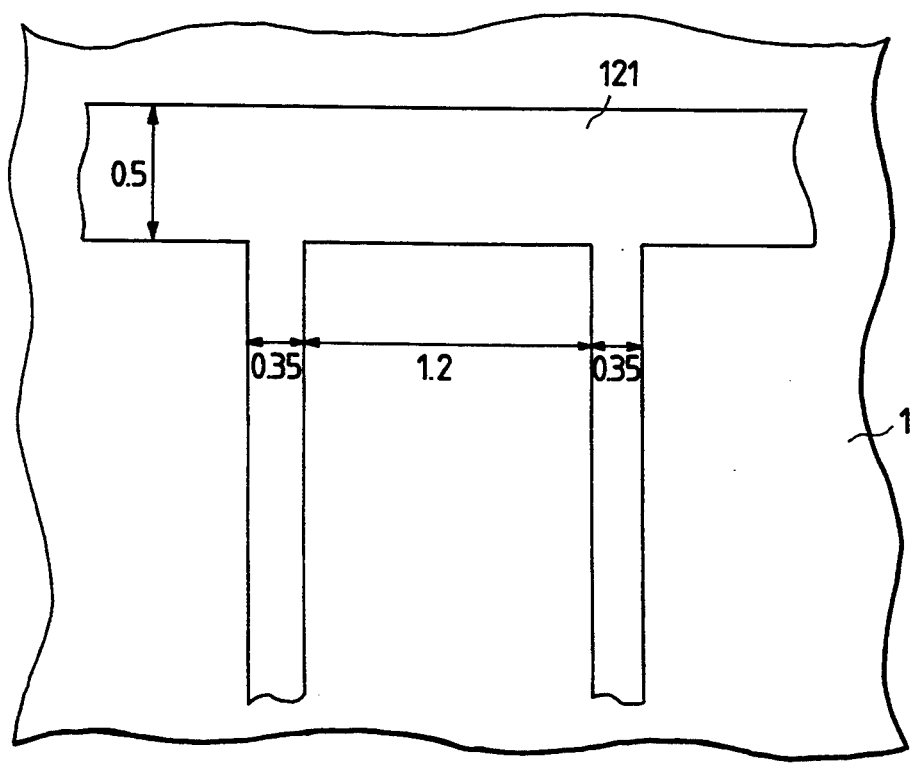
FIG. 90 is a plan view of a finished pattern on a treated wafer corresponding to the mask.

Moreover, FIG. 89 indicates a modification where the interval is equal to 1.2 μm or more.

(14) Opposite comb teeth branch reinforced opening

Figure 32:
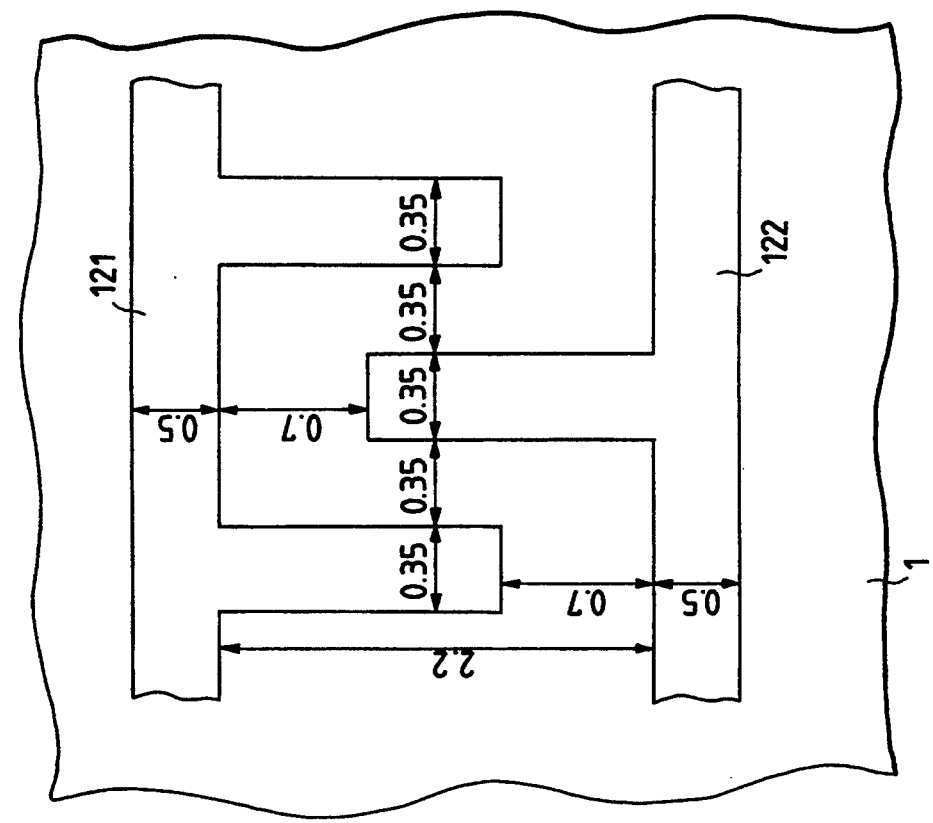
FIG. 32 is a plan view of a finished pattern on a treated wafer corresponding to the mask.
Figure 31:
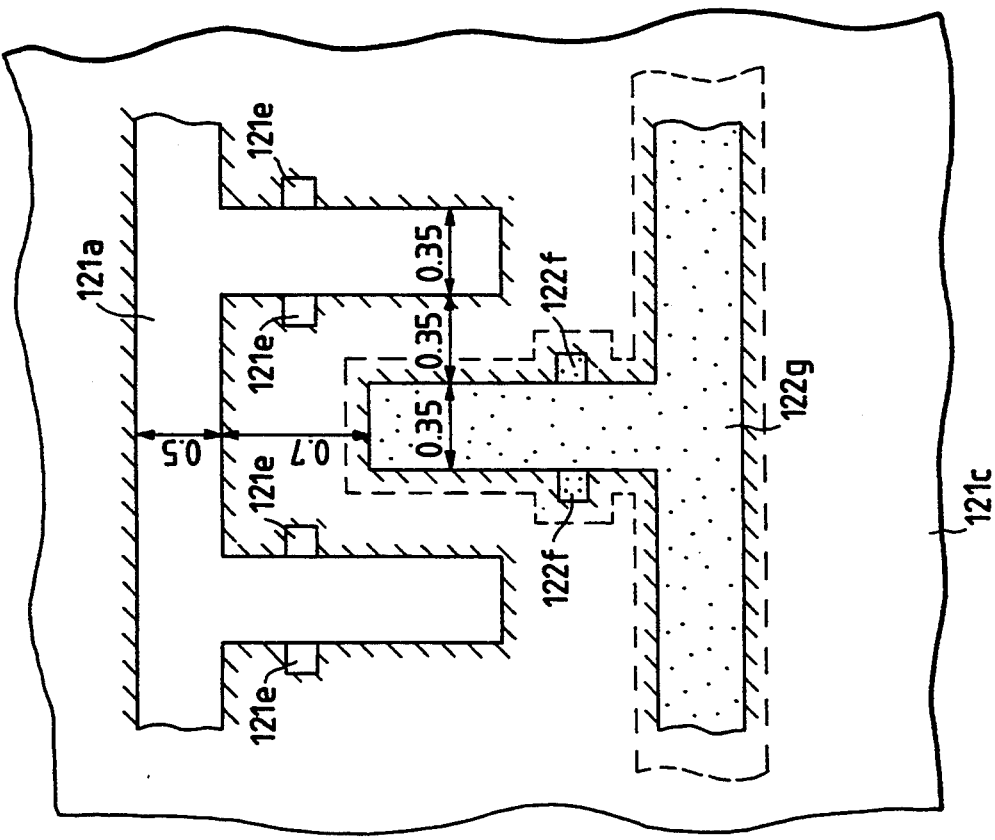
FIG. 31 is a plan pattern view of a mask in an embodiment of the invention.

FIG. 31 indicates phase shift mask patterns where combs by arranging many hammer handles of T type as shown in FIG. 30 with regular intervals are opposed with half a cycle shifted thereby linear patterns 121 and 122 as shown in FIG. 32 are exposed by negative resists in similar manner to the above. In this case, the phase of the real opening 122g closely confronted is inverted instead of using supplementary openings. The opening regarding the pattern 122 and that regarding the pattern 121 are in relation of the complete phase reverse state. Accordingly, 122f is a shift reinforcing opening having the same shape as the non-shift reinforcing opening.

(15) Ladder bar reinforcing opening

Figure 34:
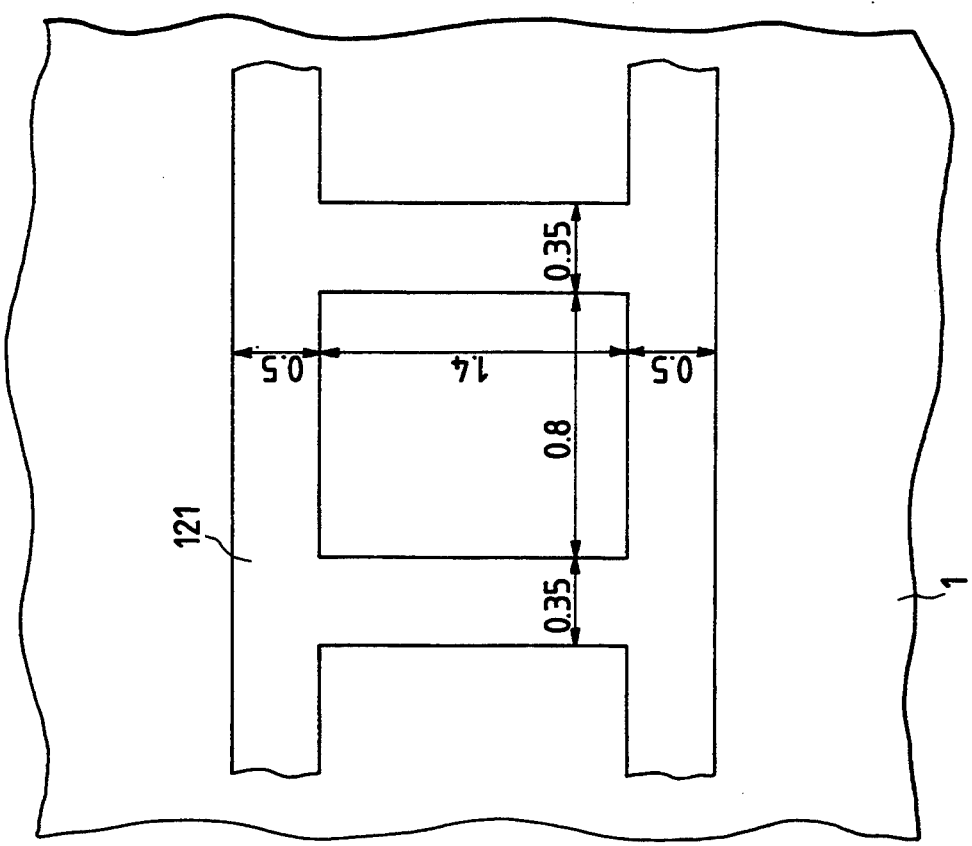
FIG. 34 is a plan view of a finished pattern on a treated wafer corresponding to the mask.
Figure 33:
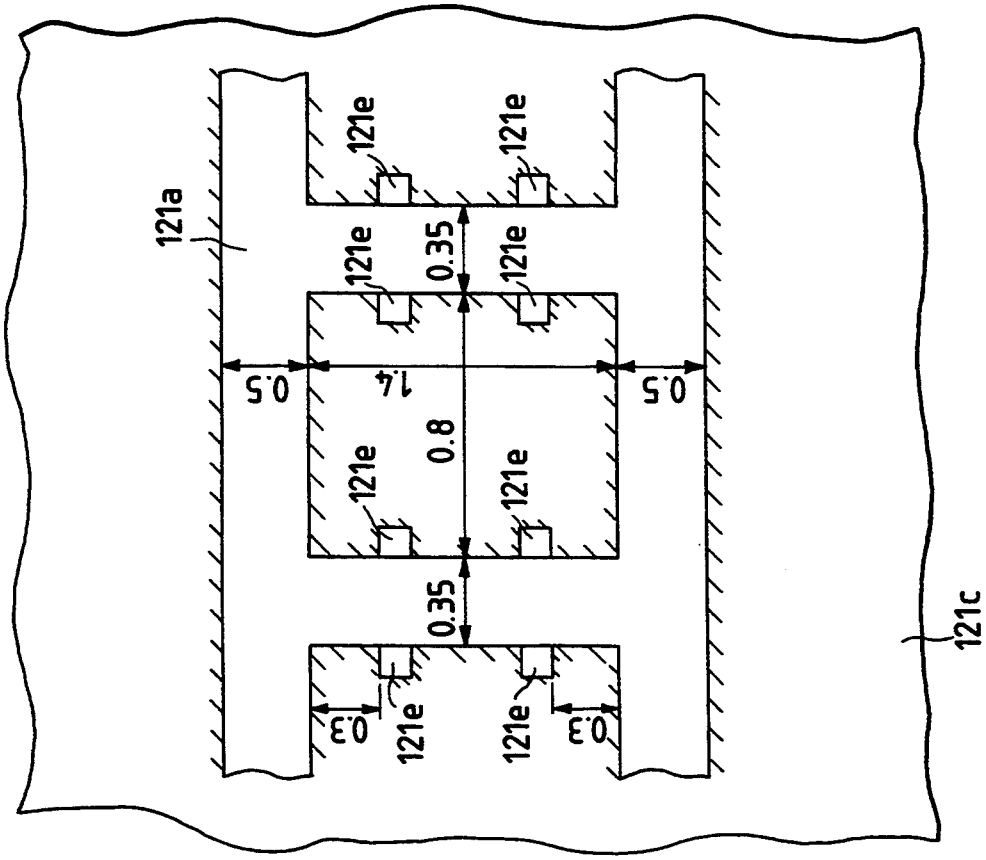
FIG. 33 is a plan pattern view of a mask in an embodiment of the invention.

FIG. 33 indicates phase shift mask patterns where a ladder-shaped linear wiring 121 as shown in FIG. 34 is exposed by a negative resist in similar manner to the above. Unless performing this processing, parts having nearly the same length as the wavelength of the exposing light from the end of the leg of the ladder is thinned due to the interference effect of the exposing light wave.

(16) Opposite double comb teeth alternate phase compensation

Figure 35:
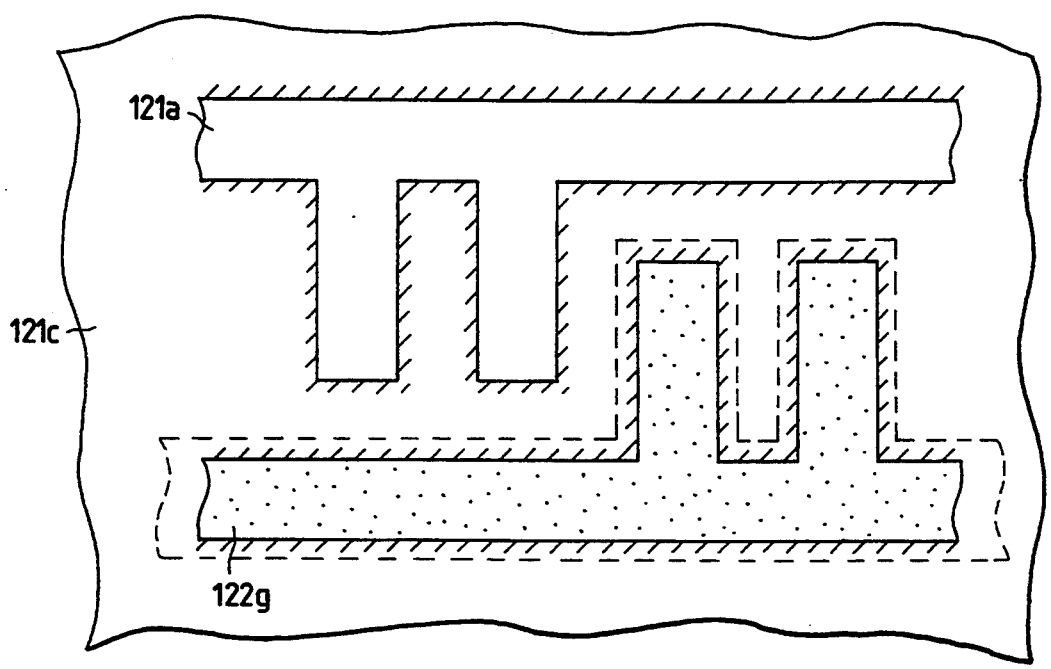
FIG. 35 is a plan pattern view of a mask in an embodiment of the invention.
Figure 36:
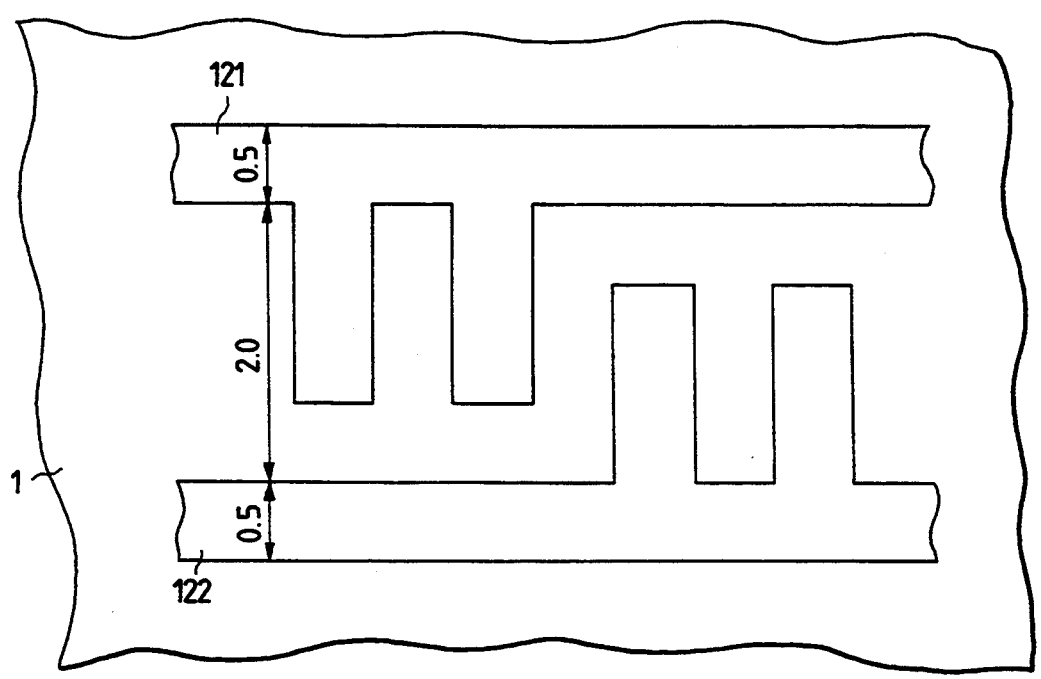
FIG. 36 is a plan view of a finished pattern on a treated wafer corresponding to the mask.

FIG. 35 indicates phase shift mask patterns where patterns each having two comb teeth as shown in FIG. 36 being arranged alternately in the linear wiring similar to FIG. 32 are exposed by a negative resist in similar manner to the above.

(17) Repeated quasi linear pattern alternate phase compensation

Figure 37:
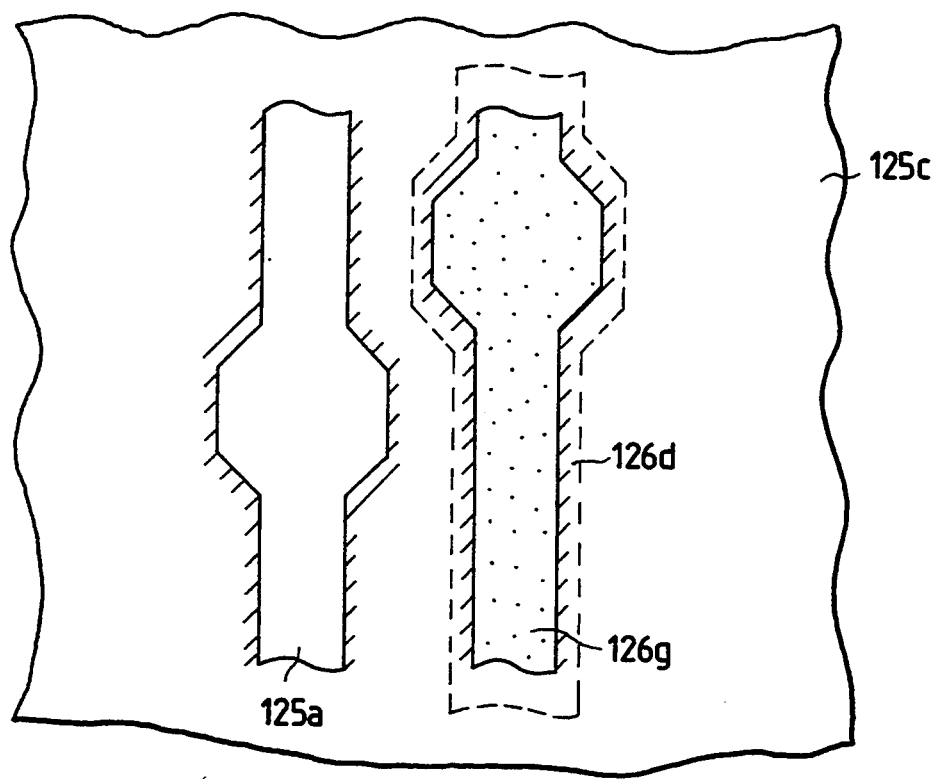
FIG. 37 is a plan pattern view of a mask in an embodiment of the invention.
Figure 38:
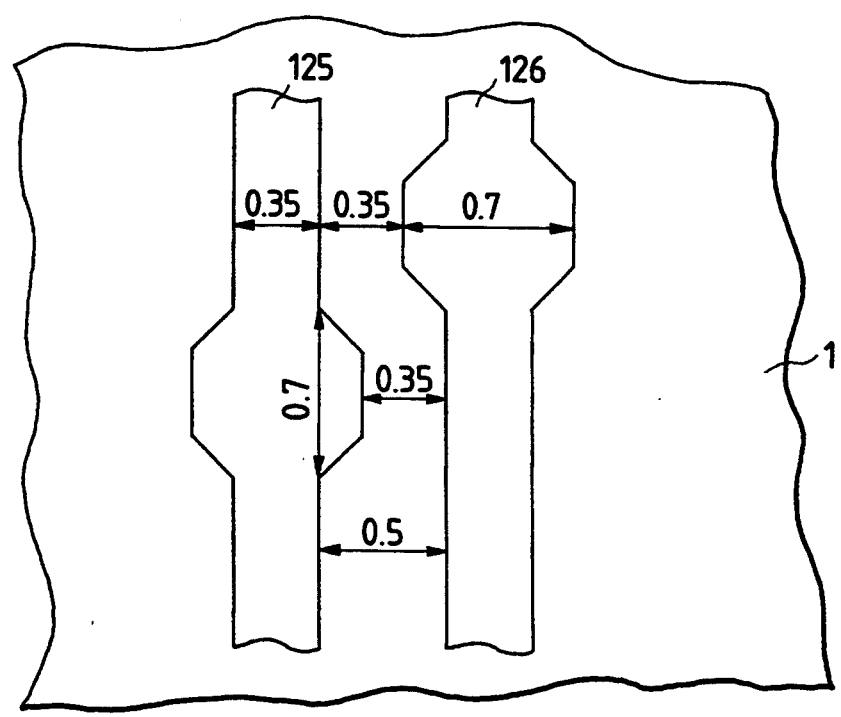
FIG. 38 is a plan view of a finished pattern on a treated wafer corresponding to the mask.

FIG. 37 indicates phase shift mask patterns where repeated quasi linear patterns using a pair of linear patterns 125 and 126 having local expansions as shown in FIG. 38 as a repetition unit are exposed by a negative resist in similar manner to the above. In this case, dimensions of opening patterns 125a and 125g are the same as those of finished patterns 125 and 126. Further, the shifter film 126d is broadened or widened by 0.1 μm than the corresponding pattern in similar manner to other examples.

(18) Repeated U pattern alternate phase compensation

Figure 39:
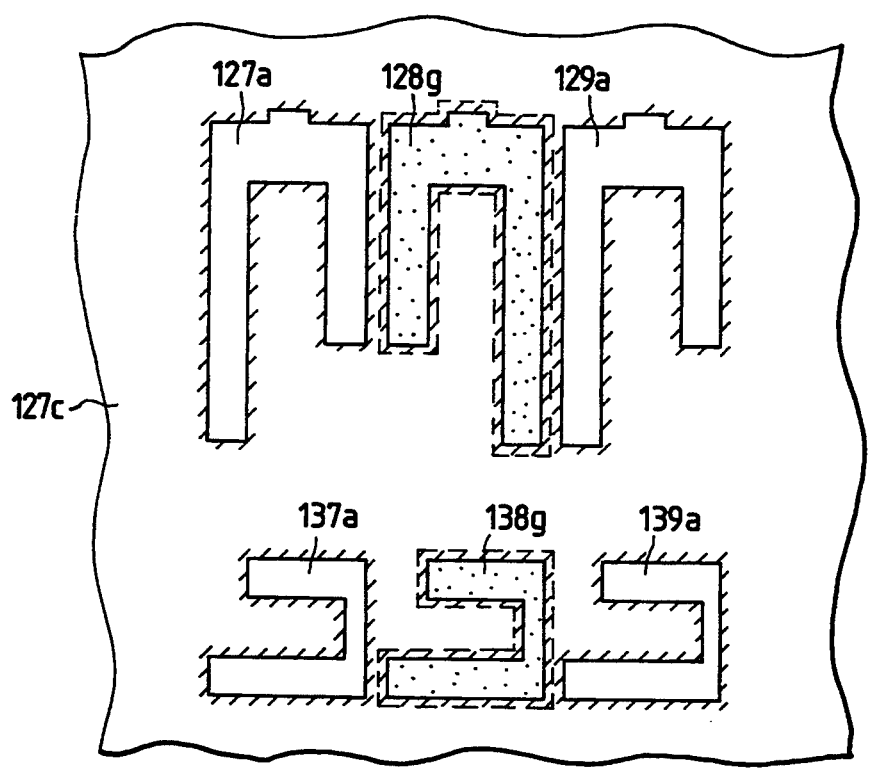
FIG. 39 is a plan pattern view of a mask in an embodiment of the invention.
Figure 40:
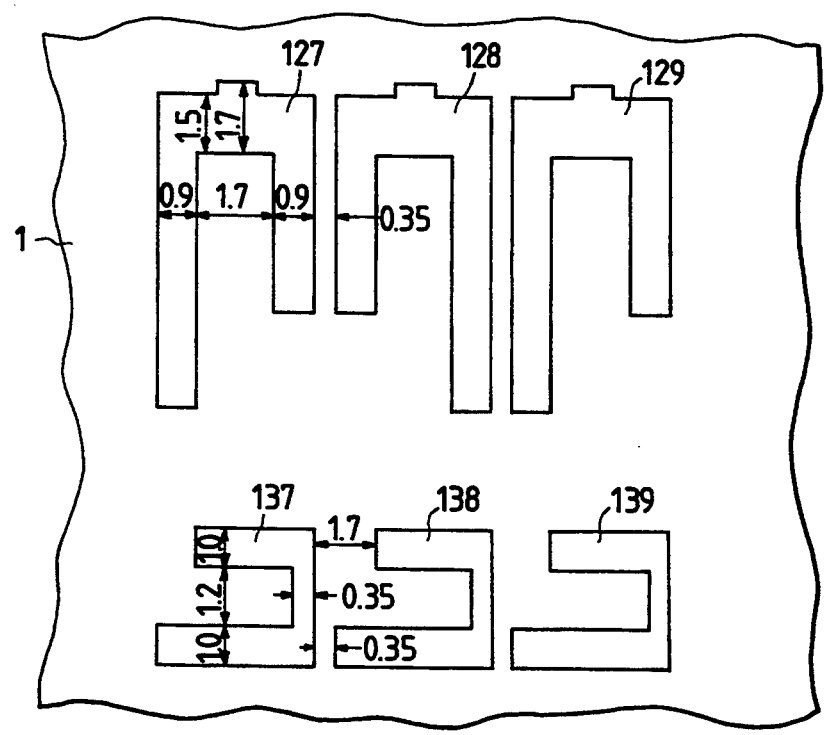
FIG. 40 is a plan view of a finished pattern on a treated wafer corresponding to the mask.

FIG. 39 indicates phase shift mask patterns where U-like patterns 127–129 and 137–139 repeatedly arranged closely as shown in FIG. 40 are exposed by negative resists in similar manner to the above. In this case, close openings are phase reversed to each other. Further, the sizes of the mask real openings are the same as those of the finished ones in similar manner to the above example.

(19) Repeated linear pattern midway cutting

Figure 63:
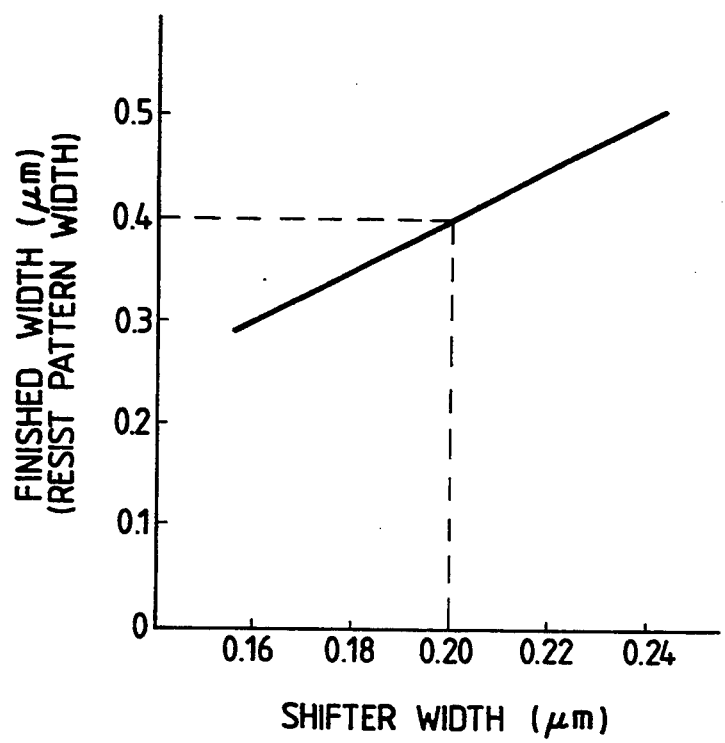
FIG. 63 is a graph showing relation of width of a shifter and dimension of a finished pattern using Shifter-On-Quartz method.

FIG. 41 indicates phase shift mask patterns where specific patterns 142 and 143 among linear repeated patterns 141 to 144 having the same width and the same interval of Al wiring etc. are cut at intermediate position by so-called Shifter-On-Quartz method, and patterns by the cutting as shown in FIG. 42 are exposed by negative resists and so-called Levenson type phase shift mask. In FIG. 41, 142h, 143h and 142b are supplementary openings in a wide sense, and are patterns on the mask corresponding to cut parts between the linear patterns 142 and 143. 142b is a shifter-on-quartz section being a phase inverting shifter layer formed directly on the mask substrate or a shift supplementary opening, and 142h and 143h are shifter-on-quart supplementary openings or non-shift supplementary openings having the same phase as those of 142a and 143a. There is no special boundary between the shifter-on-quartz supplementary opening and the real opening neighboring therewith, but it is indicated by solid line for the convenience of illustration in this application. Also, the relation between width of a dark part on the wafer formed by a fine shifter-on-quartz section and width of a shifter-on-quartz section (conversion on the wafer) is shown in FIG. 63.

(20) Close parallel line shifter-on-quartz separation

Figure 43:
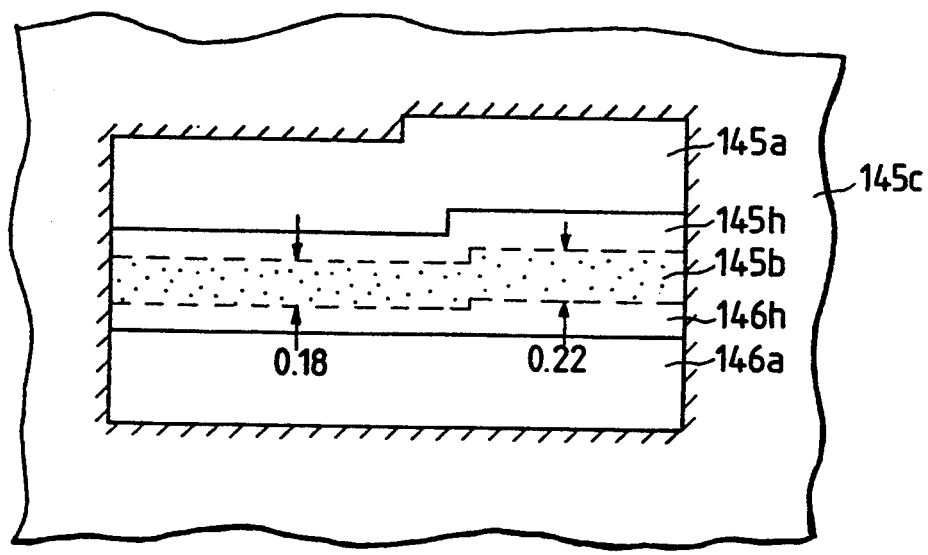
FIG. 43 is a plan pattern view of a mask in an embodiment of the invention.
Figure 44:
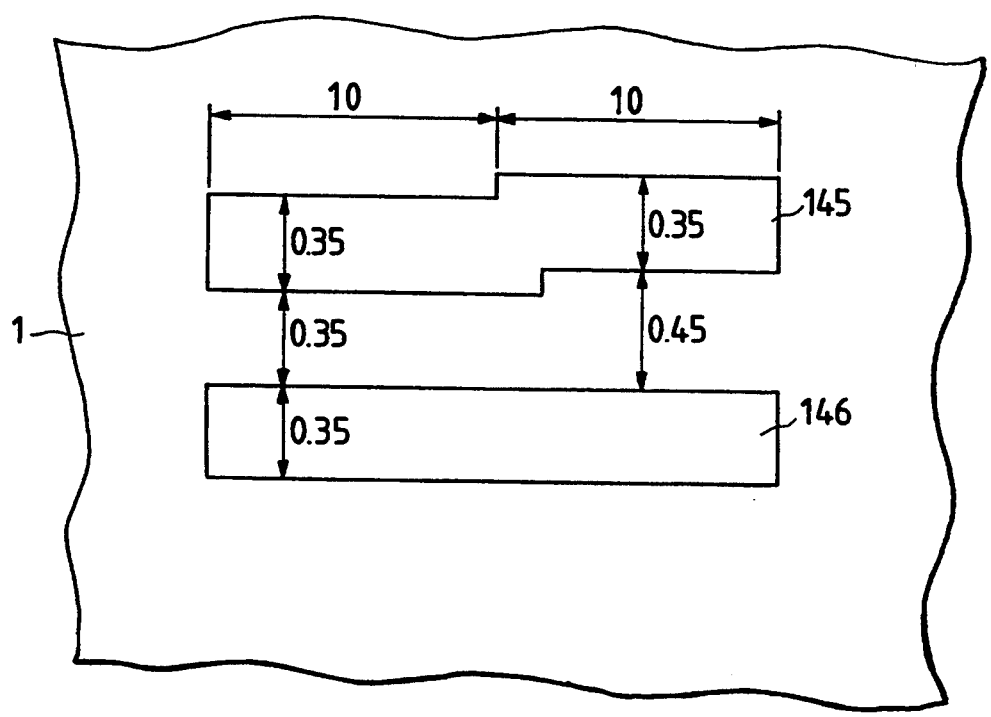
FIG. 44 is a plan view of a finished pattern on a treated wafer corresponding to the mask.

FIG. 43 indicates phase shift mask patterns where close parallel patterns 145 and 146 as shown in FIG. 44 are exposed by negative resists. In FIG. 43, 145b is a shift supplementary opening similar to the prior example, 145h and 146h are non-shift supplementary openings installed with equal width on both sides of the shift supplementary opening respectively, and 145a and 146a are non-shift real openings having equal dimensions to those of the finished patterns 145 and 146.

(21) Close parallel line shifter & chrom separation

Figure 45:
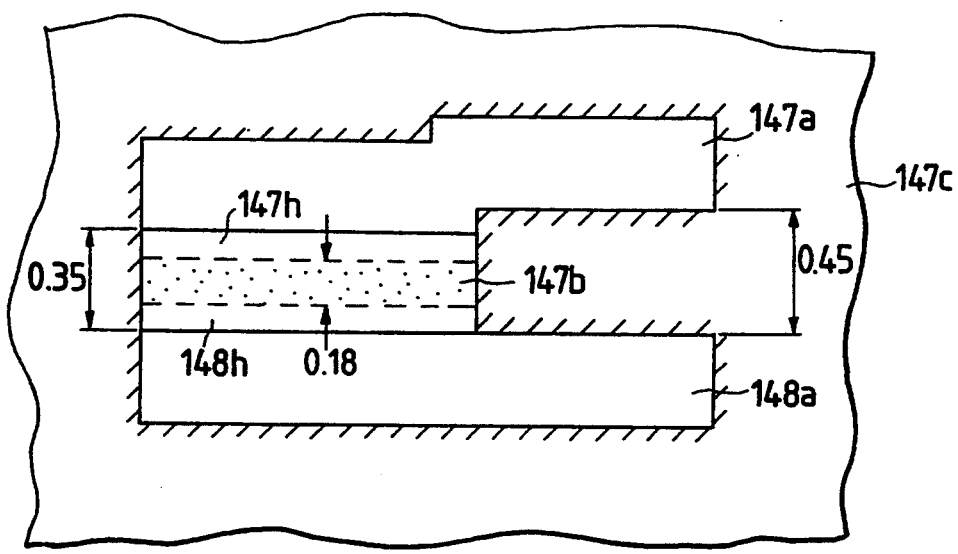
FIG. 45 is a plan pattern view of a mask in an embodiment of the invention.
Figure 46:
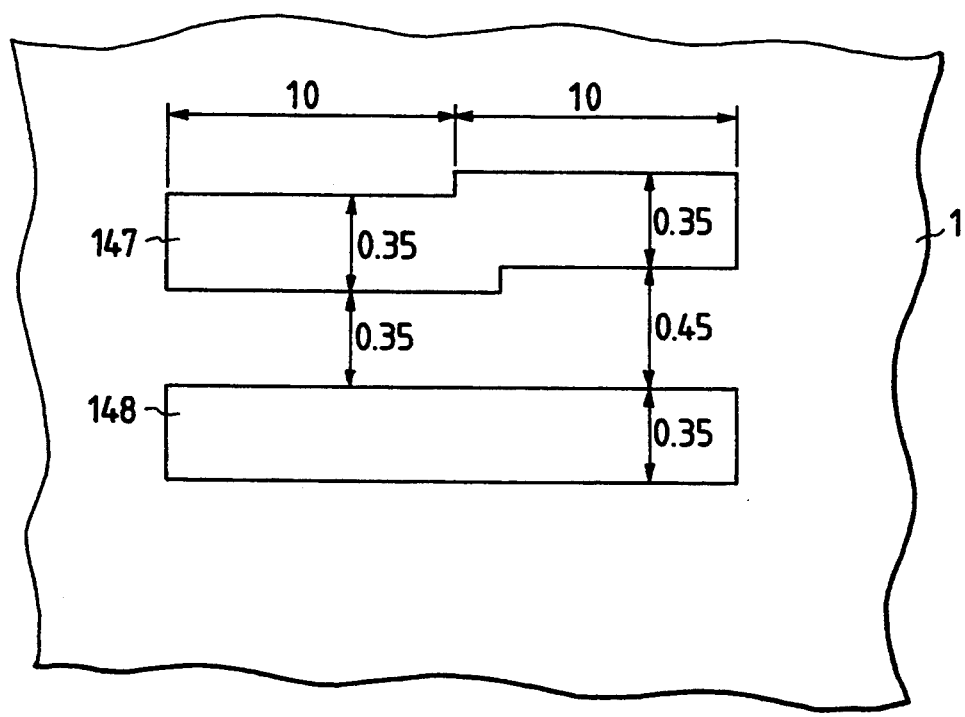
FIG. 46 is a plan view of a finished pattern on a treated wafer corresponding to the mask.

FIG. 45 indicates phase shift mask patterns where close parallel patterns 147 and 148 as shown in FIG. 46 are exposed by negative resists. In FIG. 45, 147b is a shift supplementary opening similar to the prior example, 147h and 148h are non-shift supplementary openings installed with equal width on both sides of the shift supplementary opening respectively, and 147a and 148a are non-shift real openings having equal dimensions to those of the finished patterns 147 and 128. This method is especially effective when pattern interval for the portion having wide pattern interval is further wider in comparison with the portion having narrow interval.

(22) Close parallel L pattern shifter-on-quart separation

Figure 47:
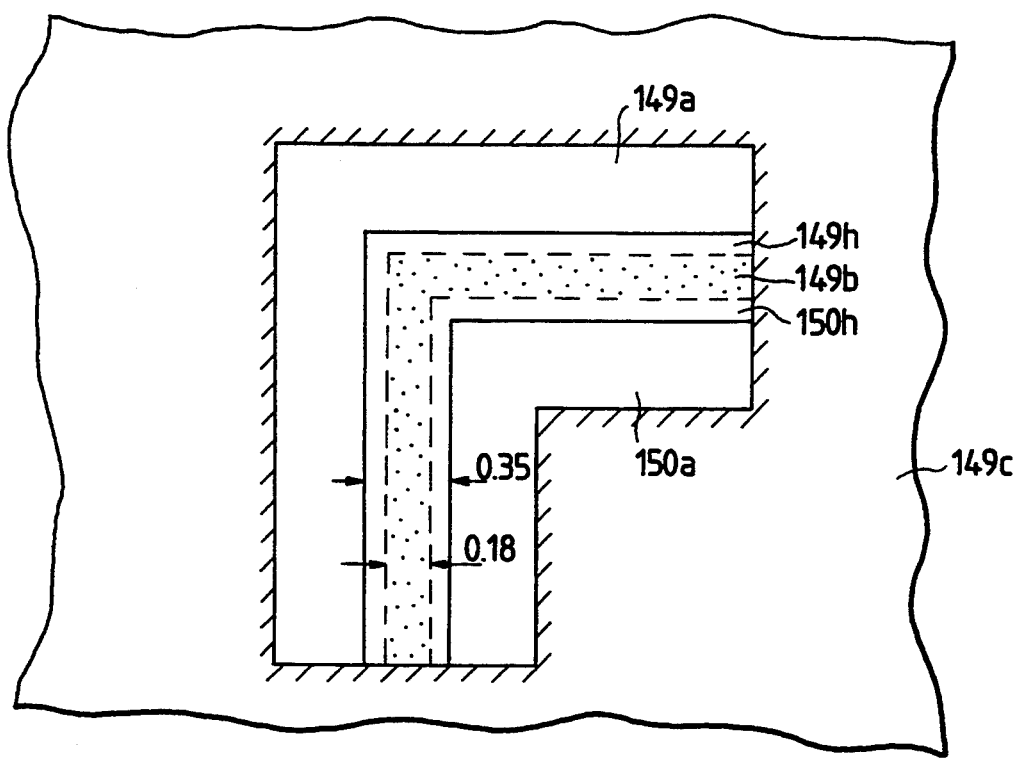
FIG. 47 is a plan pattern view of a mask in an embodiment of the invention.
Figure 48:
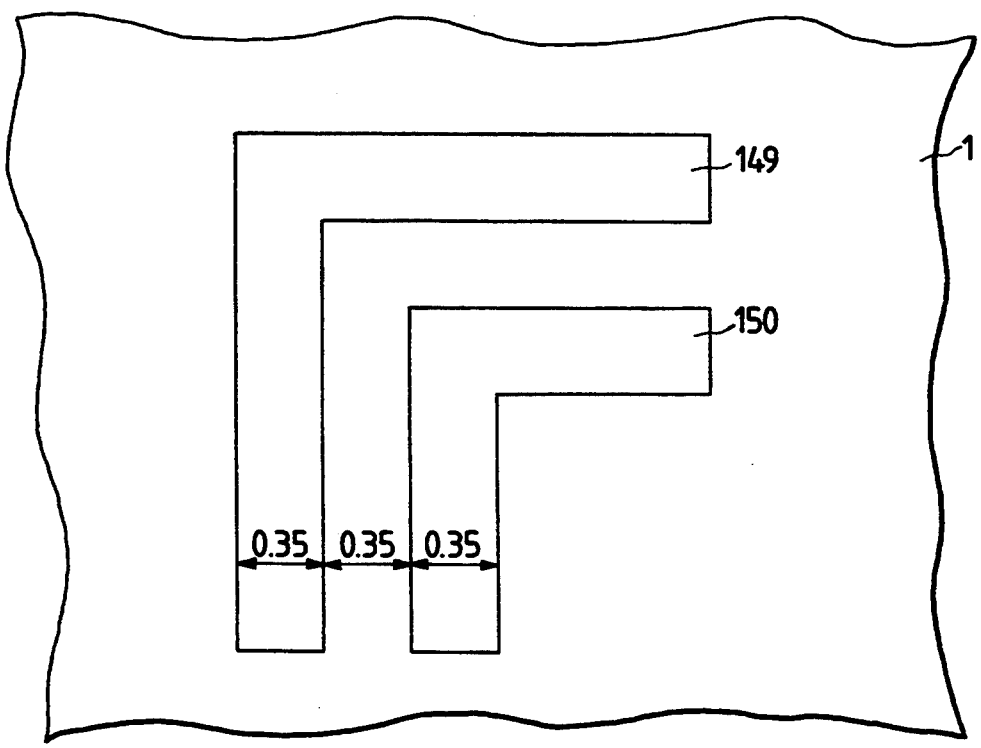
FIG. 48 is a plan view of a finished pattern on a treated wafer corresponding to the mask.

FIG. 47 indicates phase shift mask patterns where close parallel L-like patterns 149 and 150 as shown in FIG. 48 are exposed by negative resists. In FIG. 47, 149b is a shift supplementary opening similar to the prior example, 149h and 150h are non-shift supplementary openings installed with equal width on both sides of the shift supplementary opening respectively, and 149a and 150a are non-shift real openings having equal dimensions to those of the finished patterns 149 and 150.

(23) Close parallel S pattern shifter-on-quartz separation

Figure 49:
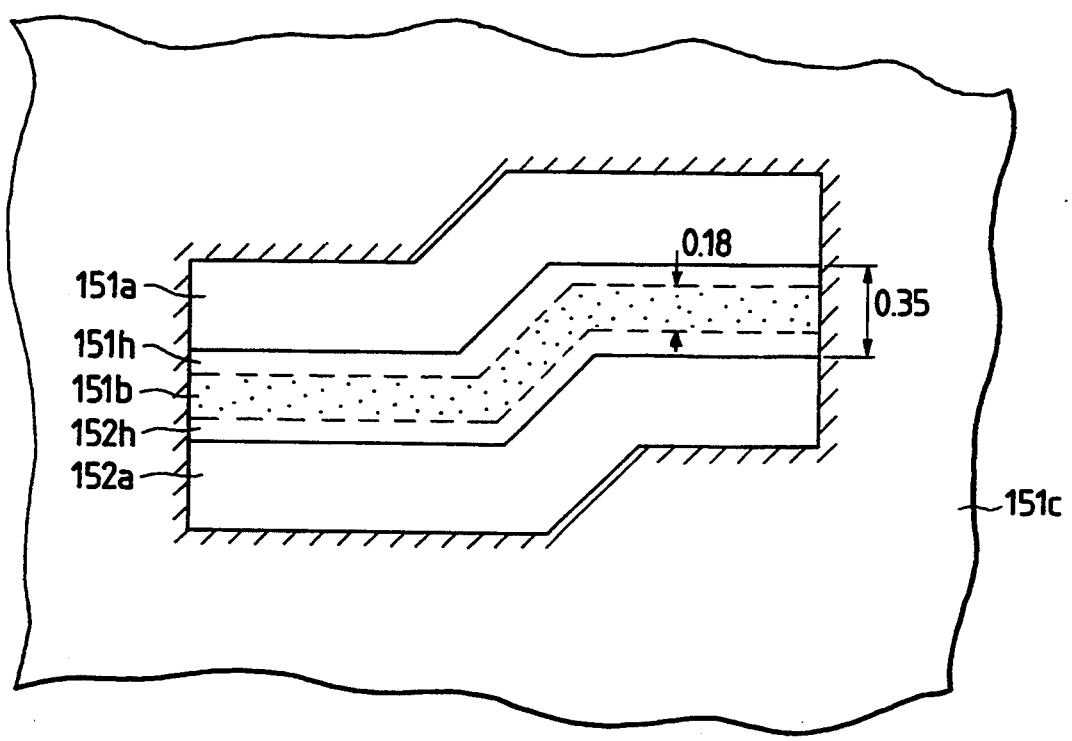
FIG. 49 is a plan pattern view of a mask in an embodiment of the invention.
Figure 50:
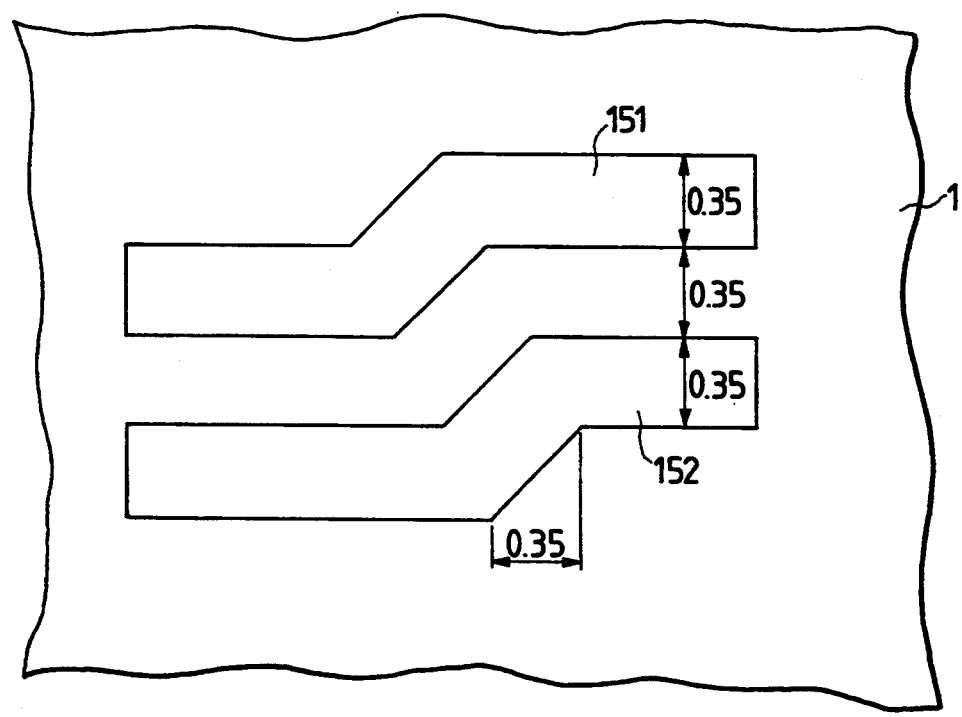
FIG. 50 is a plan view of a finished pattern on a treated wafer corresponding to the mask.

FIG. 49 indicates phase shift mask patterns where close parallel S-like patterns 151 and 152 as shown in FIG. 50 are exposed by negative resists. In FIG. 49, 151b is a shift supplementary opening similar to the prior example, 151h and 152h are non-shift supplementary openings installed with equal width on both sides of the shift supplementary opening respectively, and 151a and 152a are non-shift real openings having equal dimensions to those of the finished patterns 151 and 152.

(24) Partial close pattern shifter-on-quart separation

Figure 51:
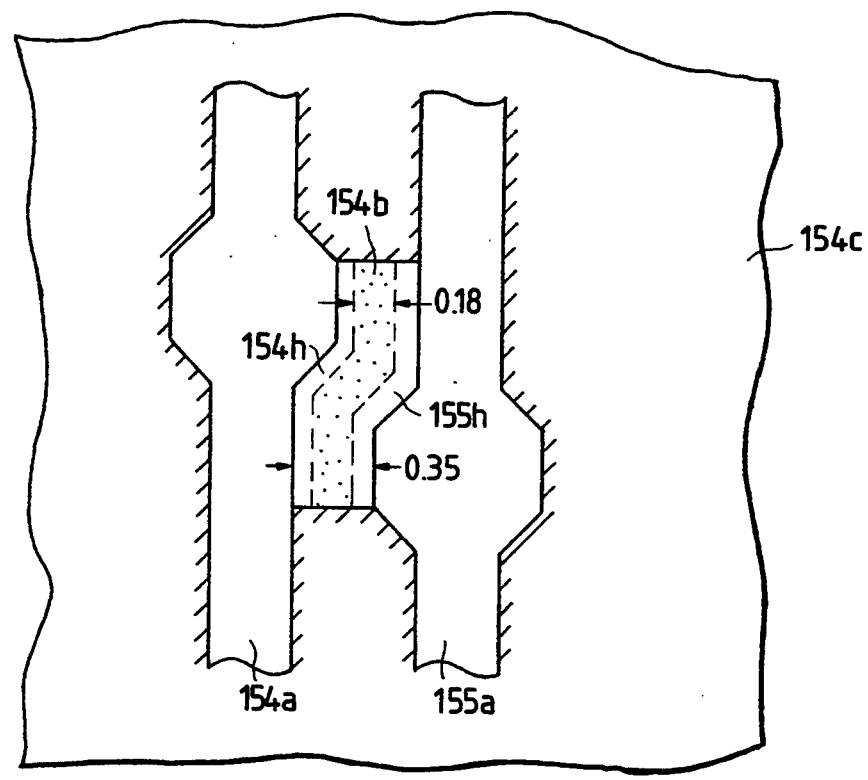
FIG. 51 is a plan pattern view of a mask in an embodiment of the invention.
Figure 52:
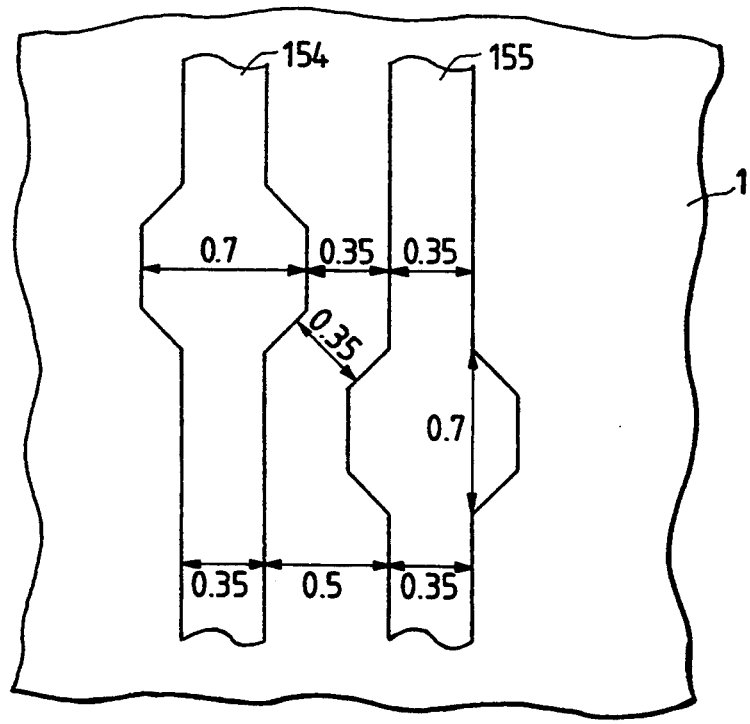
FIG. 52 is a plan view of a finished pattern on a treated wafer corresponding to the mask.

FIG. 51 indicates phase shift mask patterns where partially close parallel repeated patterns 154 and 155 as shown in FIG. 52 (In the drawing, the repetition in the lateral direction is indicated by its unit part only. The same applies to following example.) are exposed by negative resists. In FIG. 51, 154b is a shift supplementary opening similar to the prior example, 154h and 155h are non-shift supplementary openings installed with equal width on both sides of the shift supplementary opening respectively, and 154a and 155a are non-shift real openings having equal dimensions to those of the finished patterns 154 and 155.

(25) Partial close pattern alternate phase inversion separation

Figure 53:
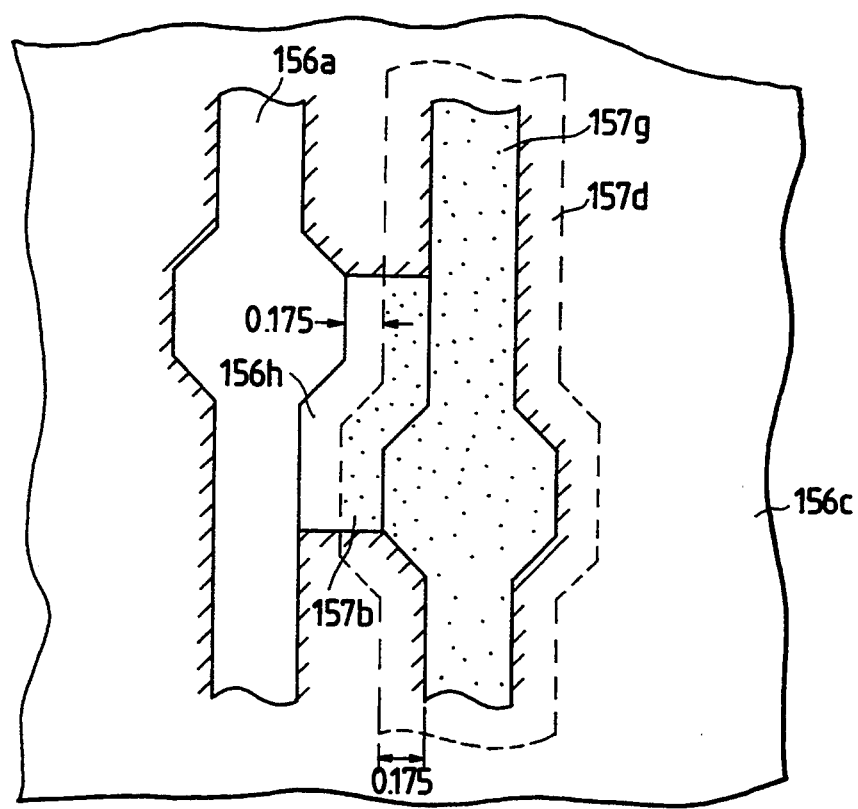
FIG. 53 is a plan pattern view of a mask in an embodiment of the invention.
Figure 54:
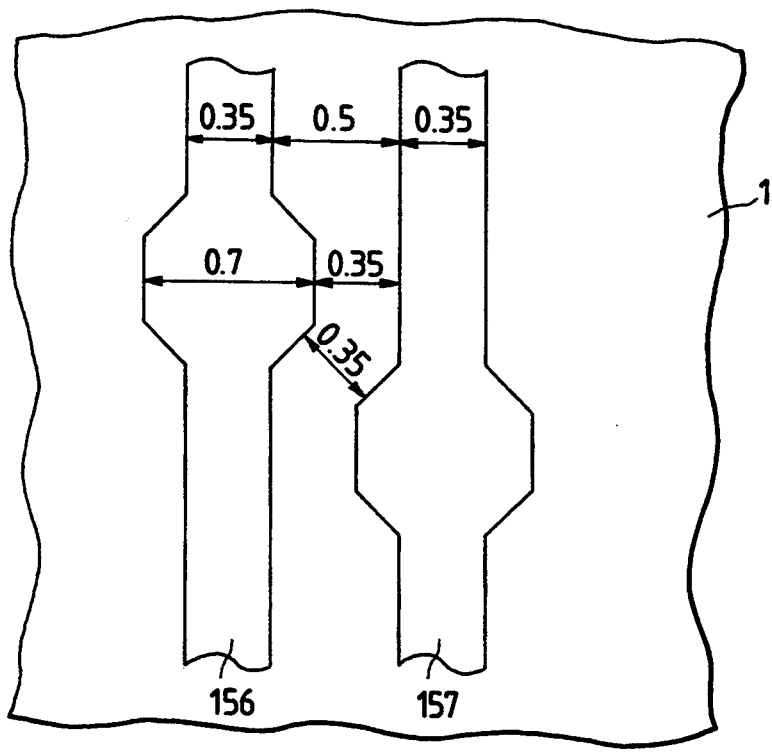
FIG. 54 is a plan view of a finished pattern on a treated wafer corresponding to the mask.

FIG. 53 indicates phase shift mask patterns where partially close parallel repeated patterns 156 and 157 as shown in FIG. 54 are exposed by negative resists. In FIG. 53, 157b is a shift supplementary opening, 156h is a non-shift supplementary opening forming a dark part together with the shift supplementary opening 157b, and 156a and 157g are non-shift real openings having equal dimensions to those of the finished patterns 156 and 157.

(26) Close parallel L pattern shifter-on-quartz separation corner correction

Figure 55:
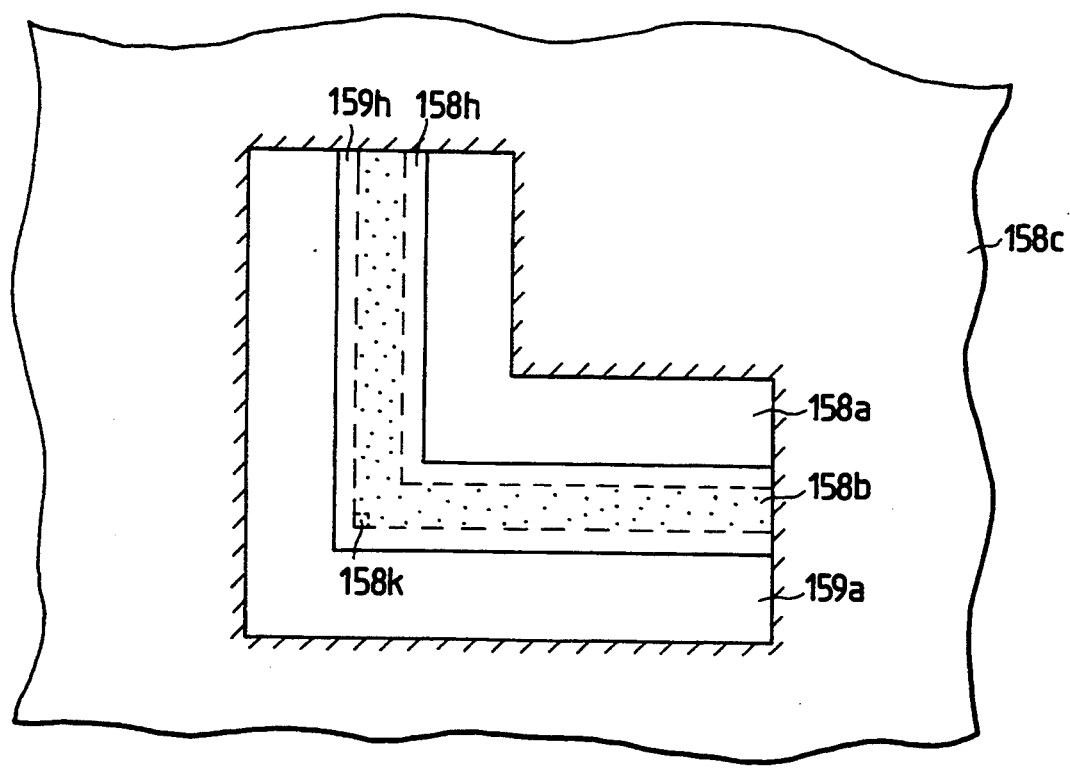
FIG. 55 is a plan pattern view of a mask in an embodiment of the invention.
Figure 56:
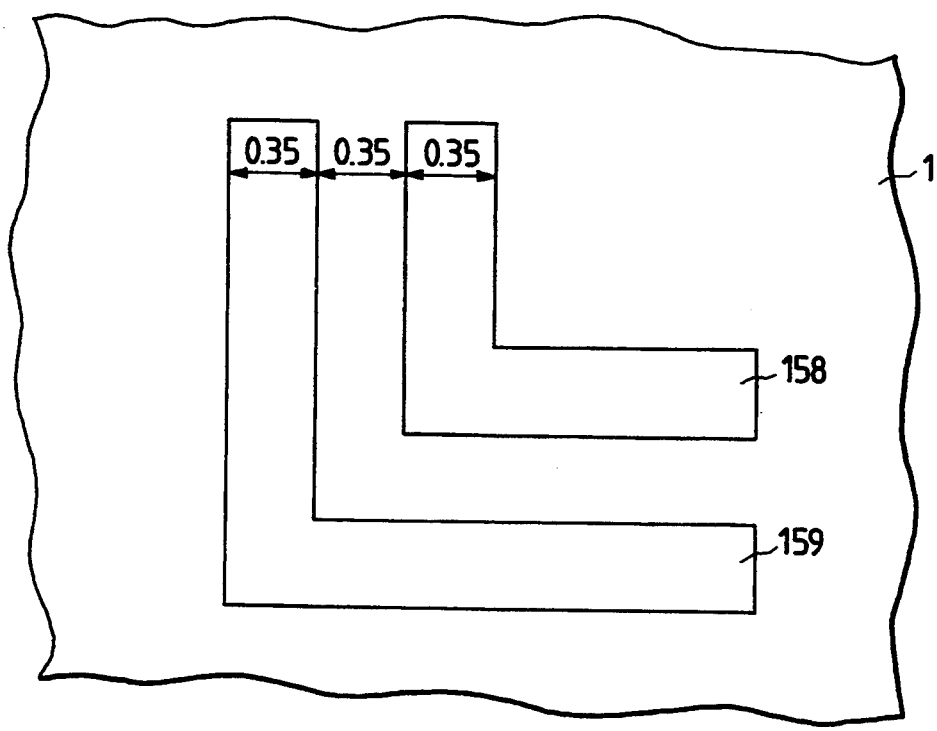
FIG. 56 is a plan view of a finished pattern on a treated wafer corresponding to the mask.

FIG. 55 indicates phase shift mask patterns where closely parallel L-like patterns 158 and 159 as shown in FIG. 56, capable of preventing excessive expansion of a dark part at the corner during the exposure by the mask in FIG. 47 are exposed by negative resists. In FIG. 55, 158k is a correcting shifter loss part being a non-shift opening of 0.06 μm square for preventing expansion of the dark part at the corner, 158b is a shift supplementary opening similar to the prior example, 158h and 159h are non-shift supplementary openings installed with equal width on both sides of the shift supplementary opening respectively, and 158a and 159a are non-shift real openings having equal dimensions to those of the finished patterns 158 and 159.

(27) Close parallel S pattern shifter-on-quartz separation corner correction

Figure 57:
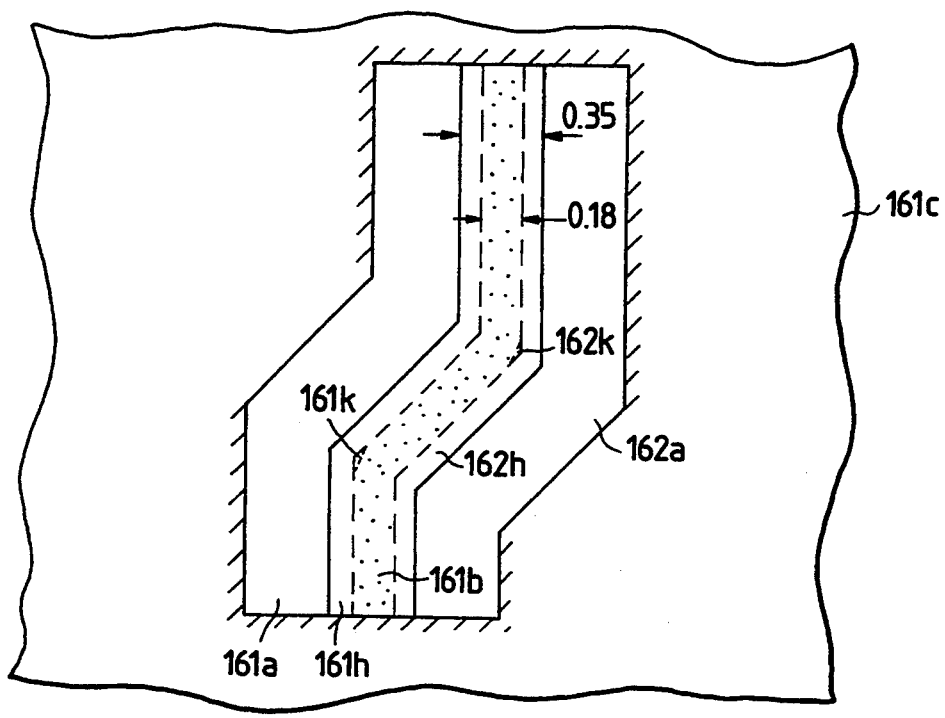
FIG. 57 is a plan pattern view of a mask in an embodiment of the invention.
Figure 58:
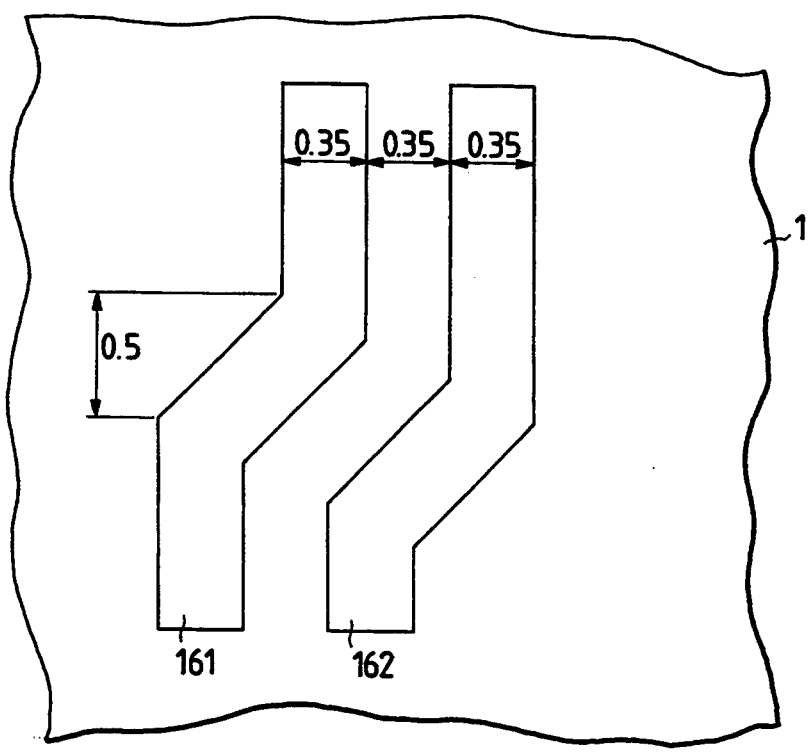
FIG. 58 is a plan view of a finished pattern on a treated wafer corresponding to the mask.

FIG. 57 indicates phase shift mask patterns where closely parallel S-like patterns 161 and 162 as shown in FIG. 58, capable of preventing excessive expansion of a dark part at the corner region during the exposure by the mask in FIG. 49 are exposed by negative resists. In FIG. 57, 161k and 162k are correcting shifter loss parts being non-shift opening regions for preventing expansion of the dark part at the corner, 161b is a shift supplementary opening similar to the prior example, 161h and 162h are non-shift supplementary openings installed with equal width on both sides of the shift supplementary opening respectively, and 161a and 162a are non-shift real openings having equal dimensions to hose of the finished patterns 161 and 162.

(28) Shifter-on-quartz fine hole pattern corner correction

Figure 59:
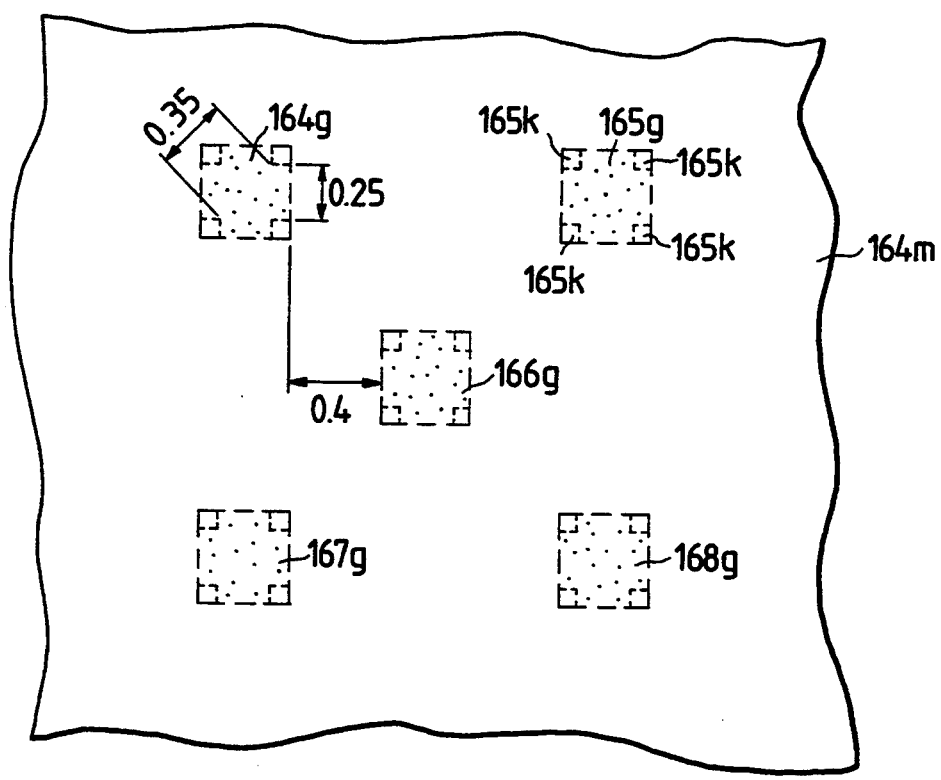
FIG. 59 is a plan pattern view of a mask in an embodiment of the invention.
Figure 60:
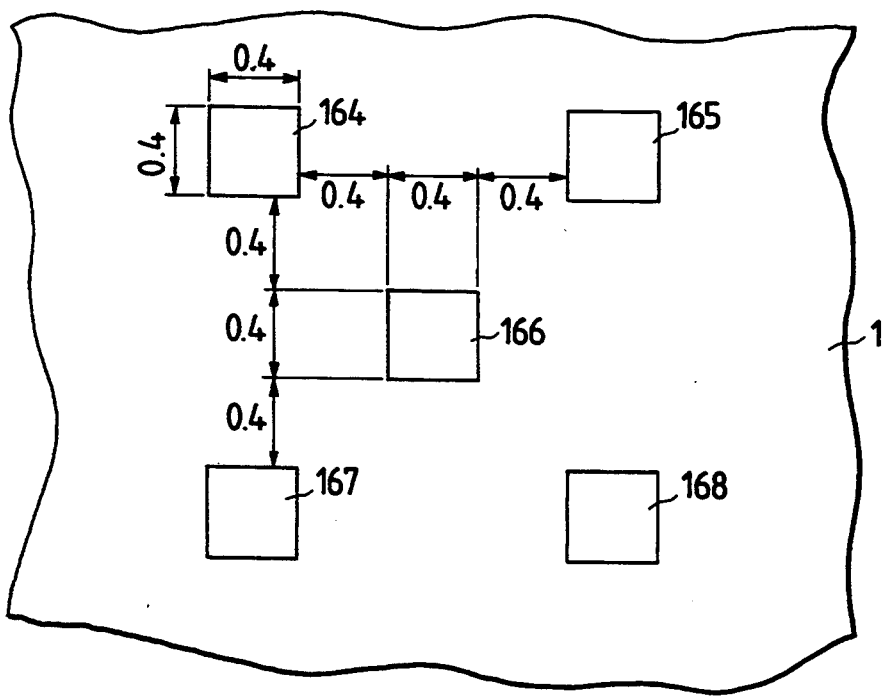
FIG. 60 is a plan view of a finished pattern on a treated wafer corresponding to the mask.

FIG. 59 indicates improved mask patterns to solve a problem that hole patterns 164–168 shown in FIG. 60 are excessively expanded in the diagonal direction during the exposure by Shifter-On-Quart method using negative resists. In FIG. 59, 164m is a quartz glass surface of the mask, 164g–168g are shift patterns or shift real opening regions comprising phase inverting shifter films being formed directly on the mask substrate corresponding to the hole patterns 164–168, and 165g is a shifter loss part of 0.06 μm square provided on each apex of the shifter patterns 164g–168g.

Figure 61:
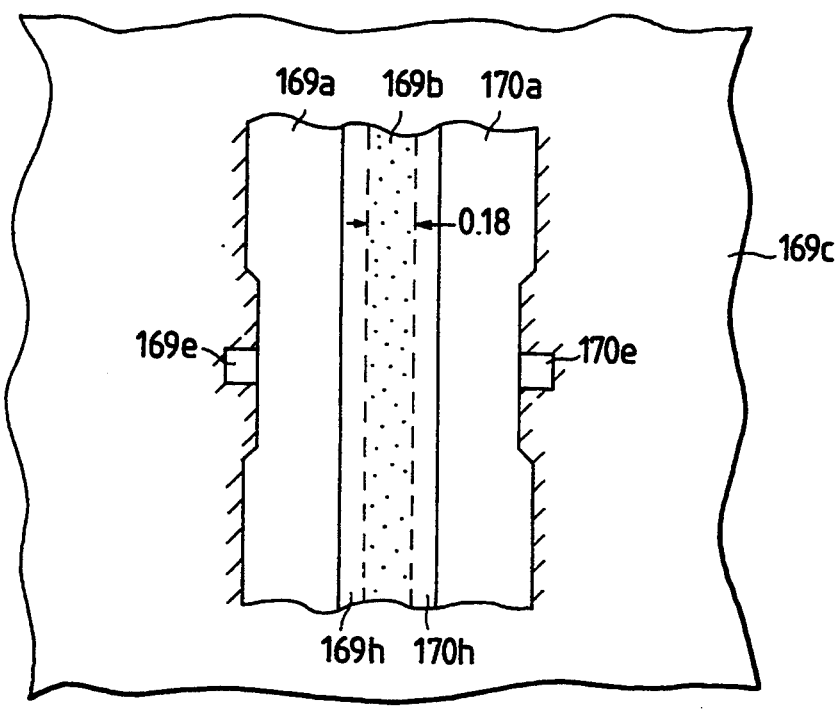
FIG. 61 is a plan pattern view of a mask in an embodiment of the invention.
Figure 62:
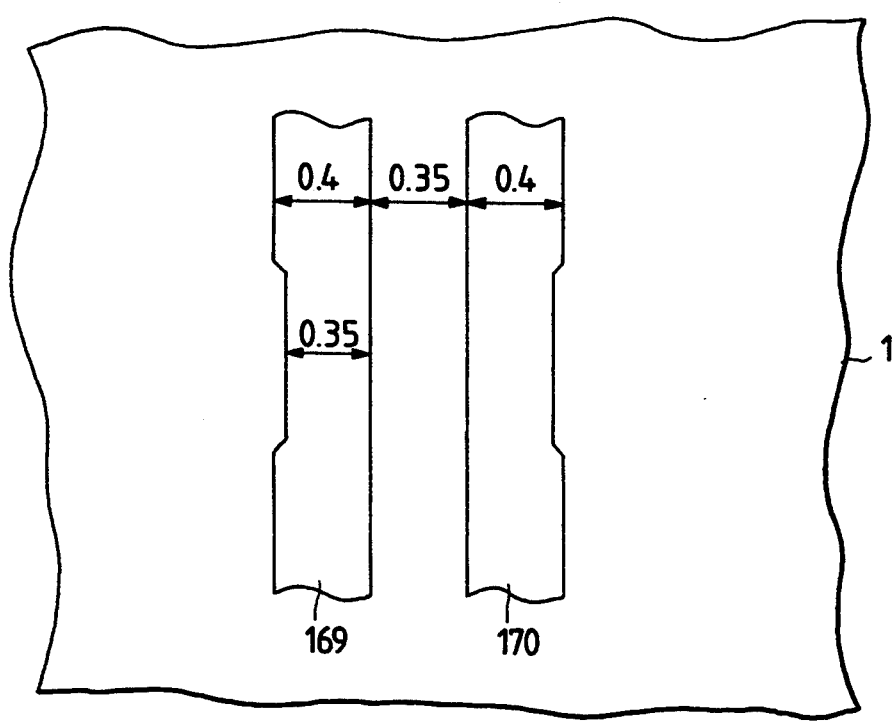
FIG. 62 is a plan view of a finished pattern on a treated wafer corresponding to the mask.

(29) Close parallel lines shifter-on-quartz separation pattern thinning prevention FIG. 61 indicates improved mask patterns to solve a problem that when concave parts exists on a part of the closely parallel linear patterns as shown in FIG. 62, the patterns are excessively thinned at the concave parts during the exposure, by Shifter-On-Quartz method using negative resists. In FIG. 61, 169e and 170e are non-shift reinforcement openings of 0.15 μm square to reinforce the concave parts.

(30) Shifter screening dog bone patterning

Figure 64:
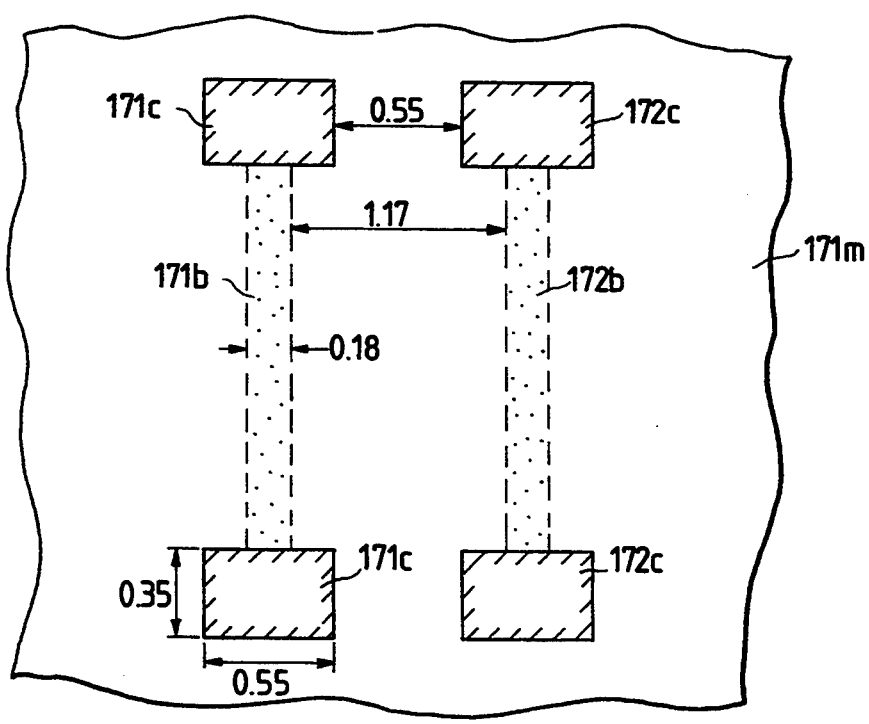
FIG. 64 is a plan pattern view of a mask in an embodiment of the invention.
Figure 65:
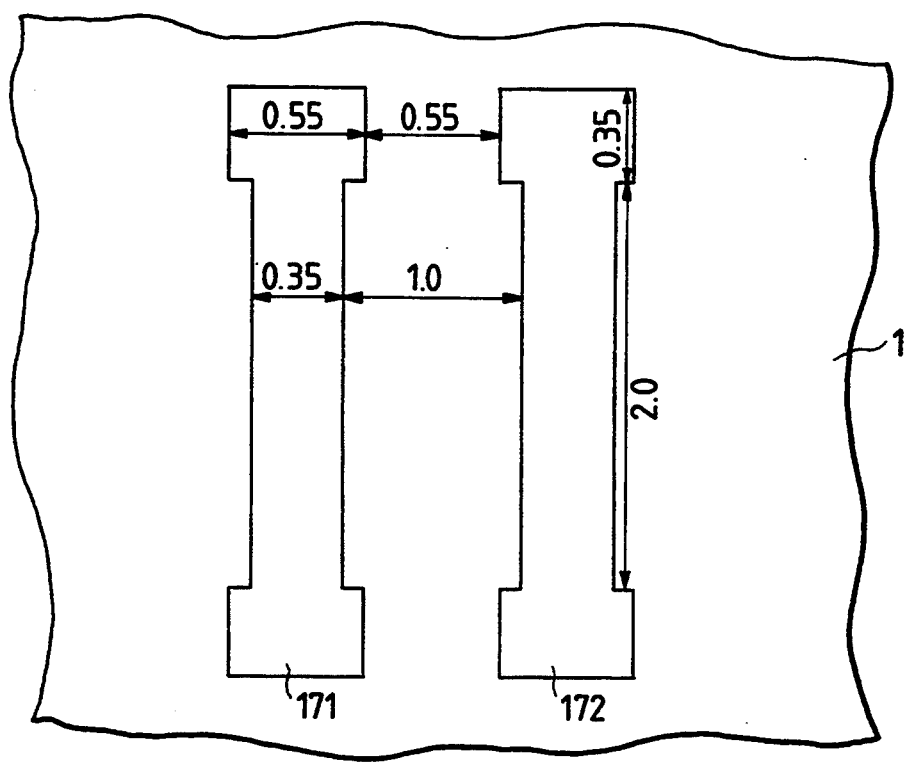
FIG. 65 is a plan view of a finished pattern on a treated wafer corresponding to the mask.

FIG. 64 indicates phase shift mask patterns where dog bone patterns as shown in FIG. 65 are exposed by a shifter screen method combining a Shifter-On-Quartz method and screening by chromium patterns, using positive type resists.

(31) Double exposure shifter screen patterning

Figure 66:
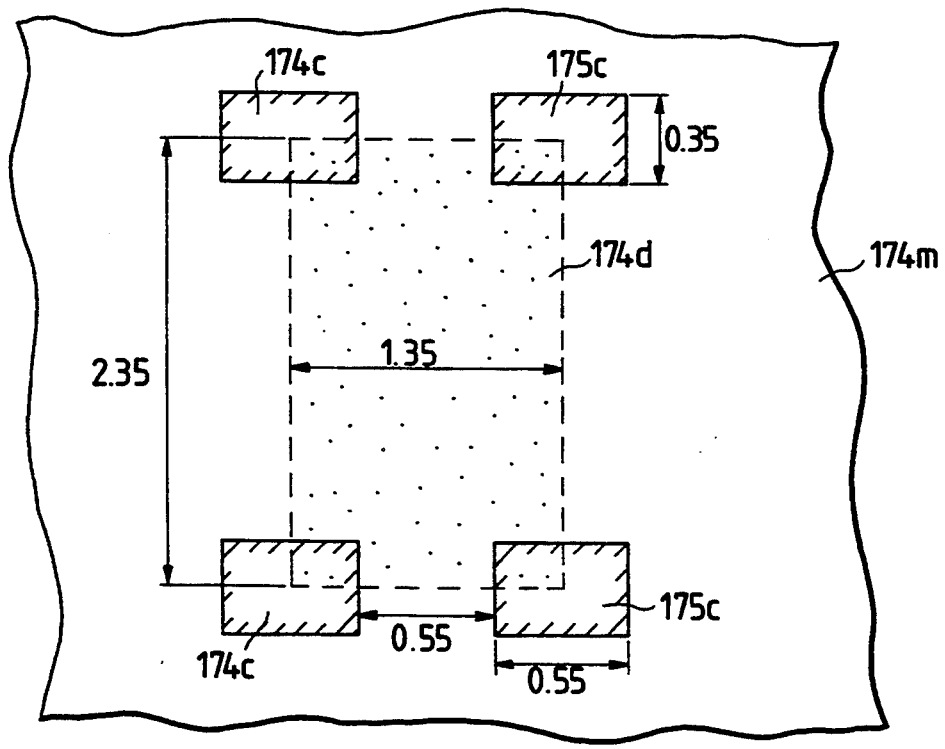
FIG. 66 is a plan pattern view of a mask in an embodiment of the invention.
Figure 67:
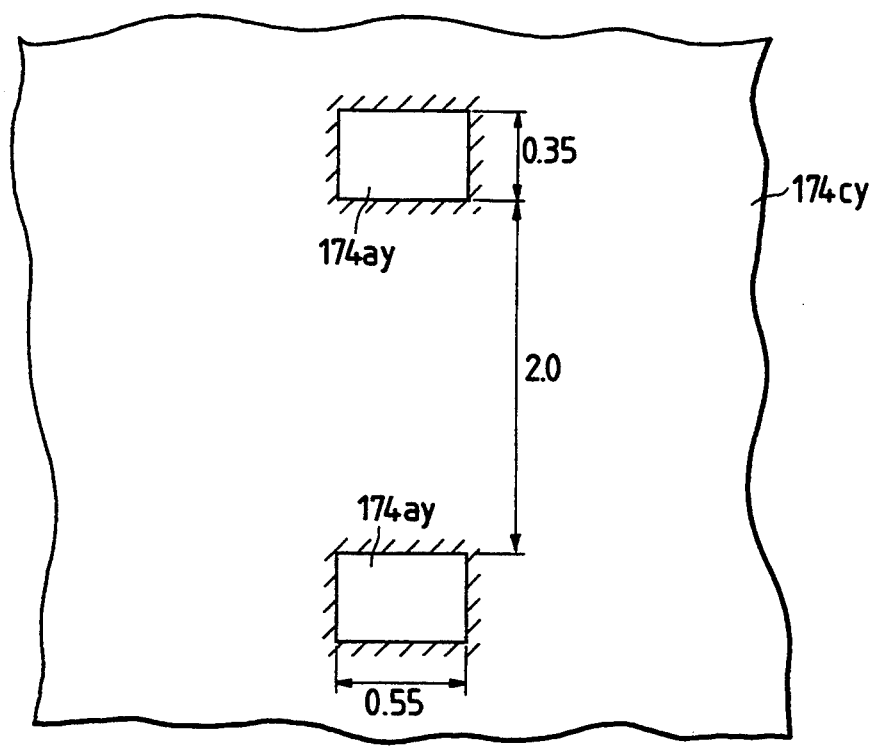
FIG. 67 is a plan pattern view of a mask in an embodiment of the invention.
Figure 68:
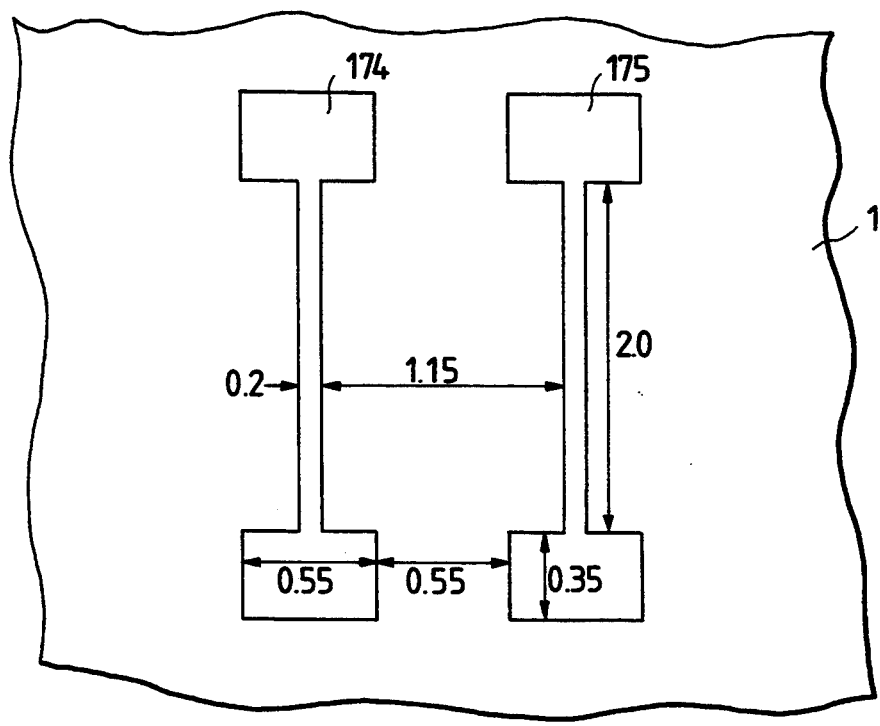
FIG. 68 is a plan view of a finished pattern on a treated wafer corresponding to the mask.

FIG. 66 and FIG. 67 indicate phase shift masks where line patterns (when positive resists are used) or space patterns (when negative resists are used) as shown in FIG. 68 are exposed two times using two masks, thereby the resists can be prevented from remaining undesirably (when positive resists are used) or from being removed undesirably (when negative resists are used), when only masks in FIG. 66 are used. Here, FIG. 66 indicates the first mask and FIG. 67 indicates the second mask. As processes, after the first exposure is carried out using the first mask, the second exposure is carried out using the second mask so that the boundary of the shifter 174d between the chromium screen parts 174c 17c is exposed fully. After these processes, the development is carried out thereby patterns as shown in FIG. 68 can be obtained.

(32) Intermediate phase shifter screen dog bone patterning

Figure 69:
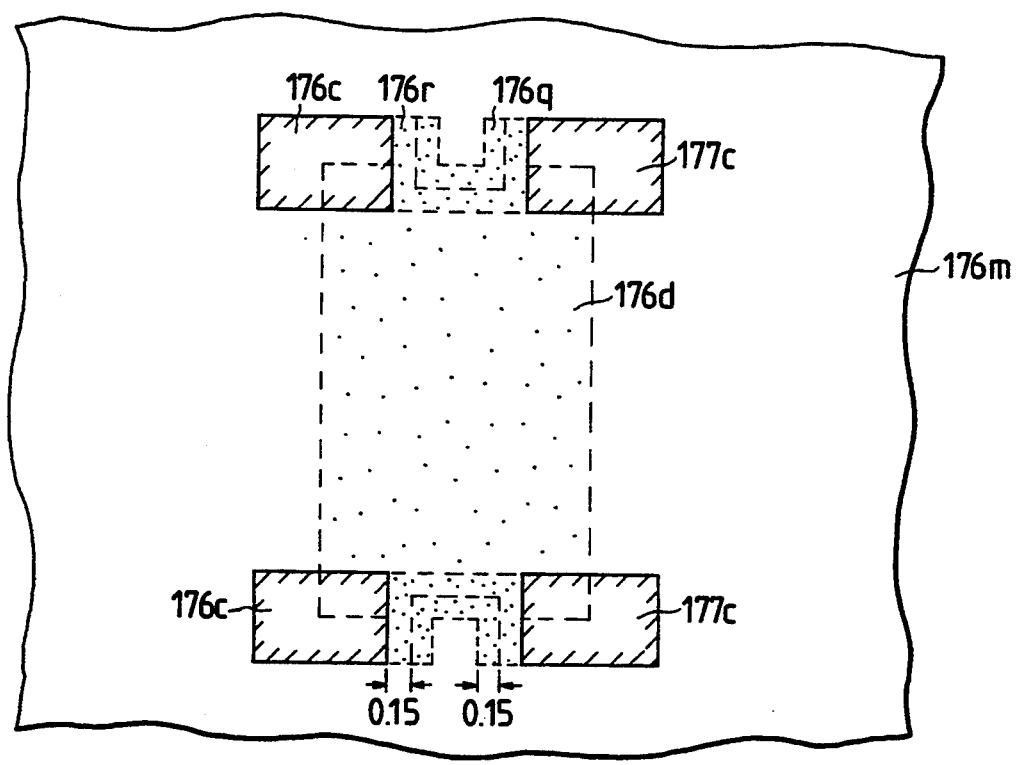
FIG. 69 is a plan pattern view of a mask in an embodiment of the invention.
Figure 70:
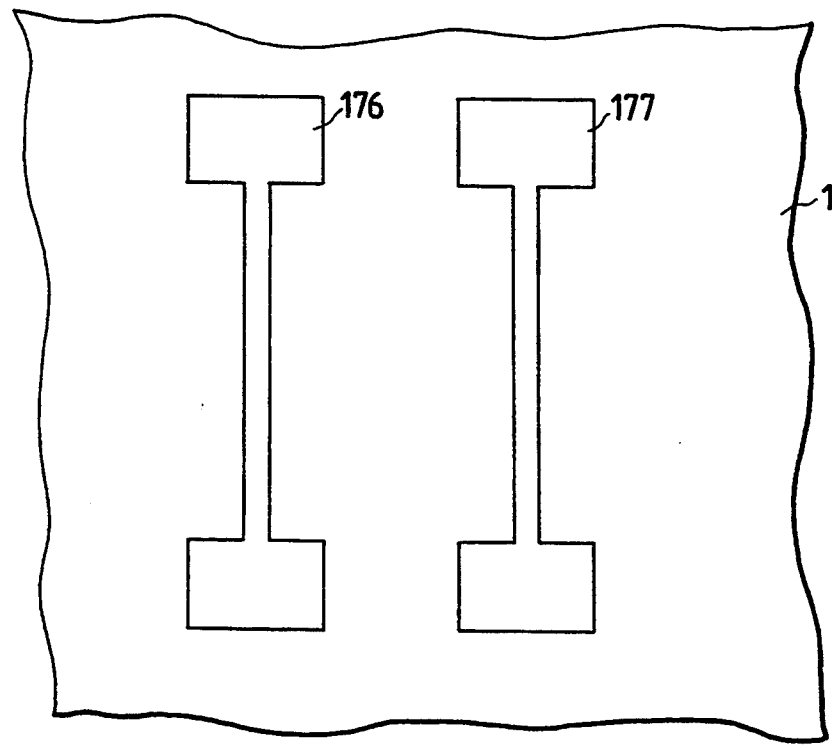
FIG. 70 is a plan view of a finished pattern on a treated wafer corresponding to the mask.

In FIG. 69, the problem in the mask of FIG. 66 can be executed using one mask, patterns as shown in FIG. 70 can be exposed by the exposure of one time. In FIG. 69, 176q and 176r are intermediate phase shifters forming buffer zones having width of 0.15 μm, and when the phase of the mask substrate surface 176m is made zero degree, 176q is 60 degrees and 176r is 120 degrees.

(33) Application examples of various phase shift techniques

Figure 71:
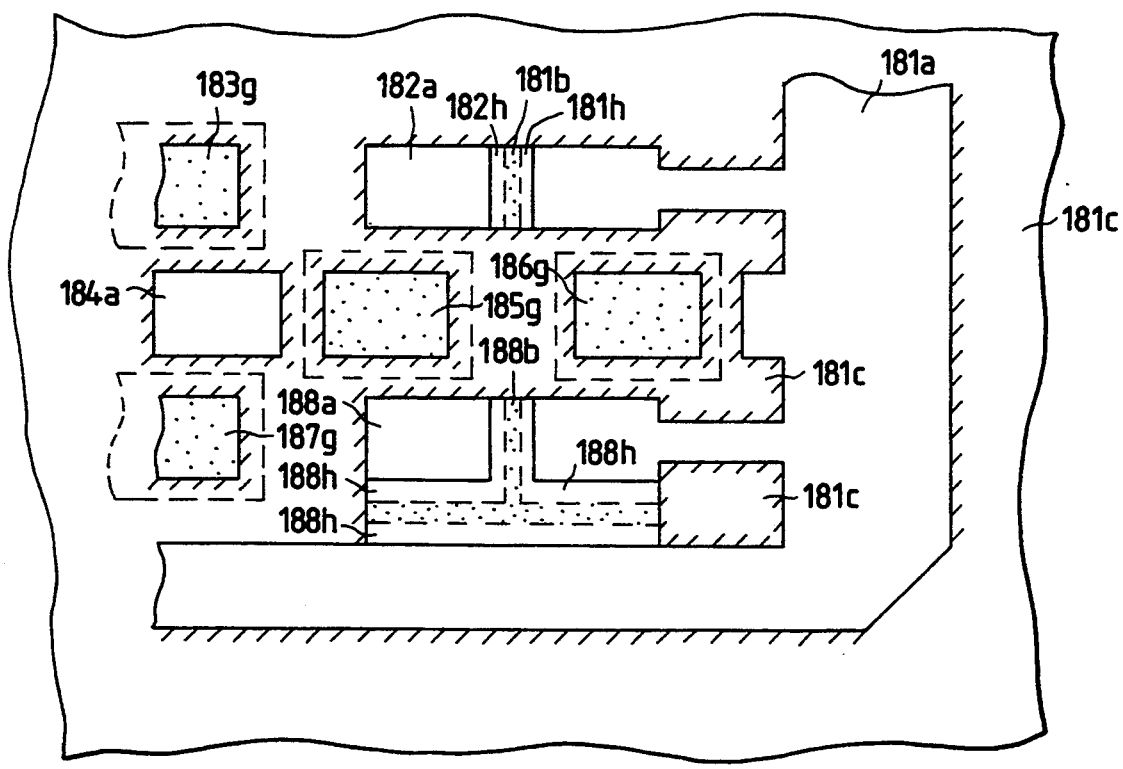
FIG. 71 is a plan pattern view of a mask in an embodiment of the invention.
Figure 72:
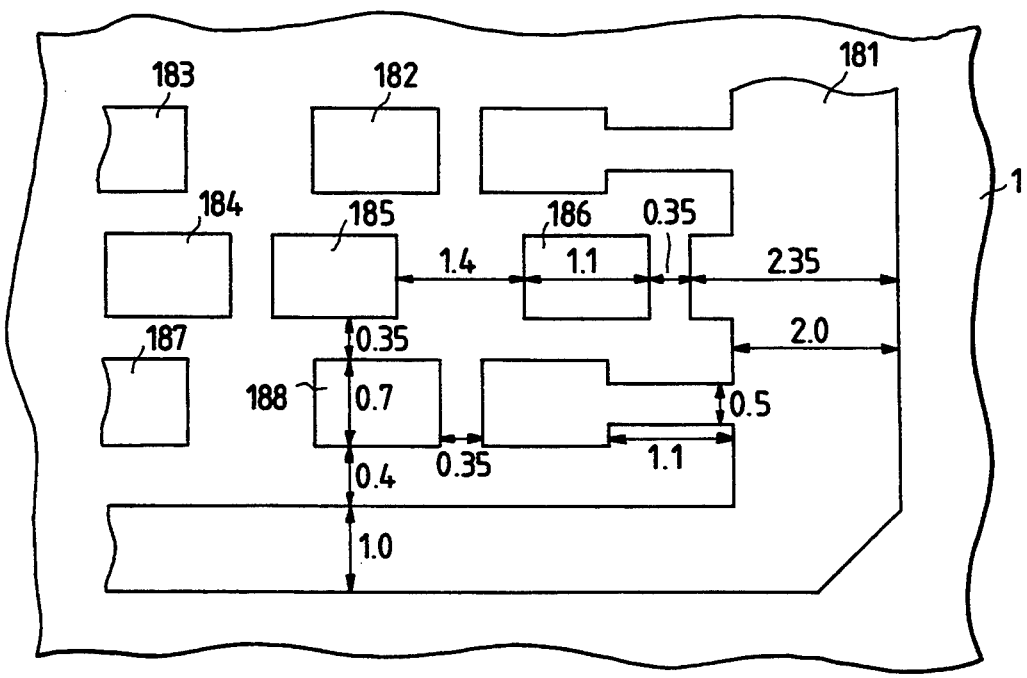
FIG. 72 is a plan view of a finished pattern on a treated wafer corresponding to the mask.

FIG. 71 is an example of applications where the above-mentioned various phase shift mask techniques are applied to the exposure for patterns as indicated in FIG. 72 of Si gate of DRAM using negative resists. The principal techniques used here are the close pattern alternate phase inversion, close pattern shift-on-quartz separation etc. In this case, the central section of periodic patterns in unit of two closely arranged rectangular patterns 184 and 185 etc. is processed by alternate phase shift method (Levenson system), and the end is processed by the Shifter-On-Quartz method as the alternate phase shift method cannot be applied.

Figure 73:
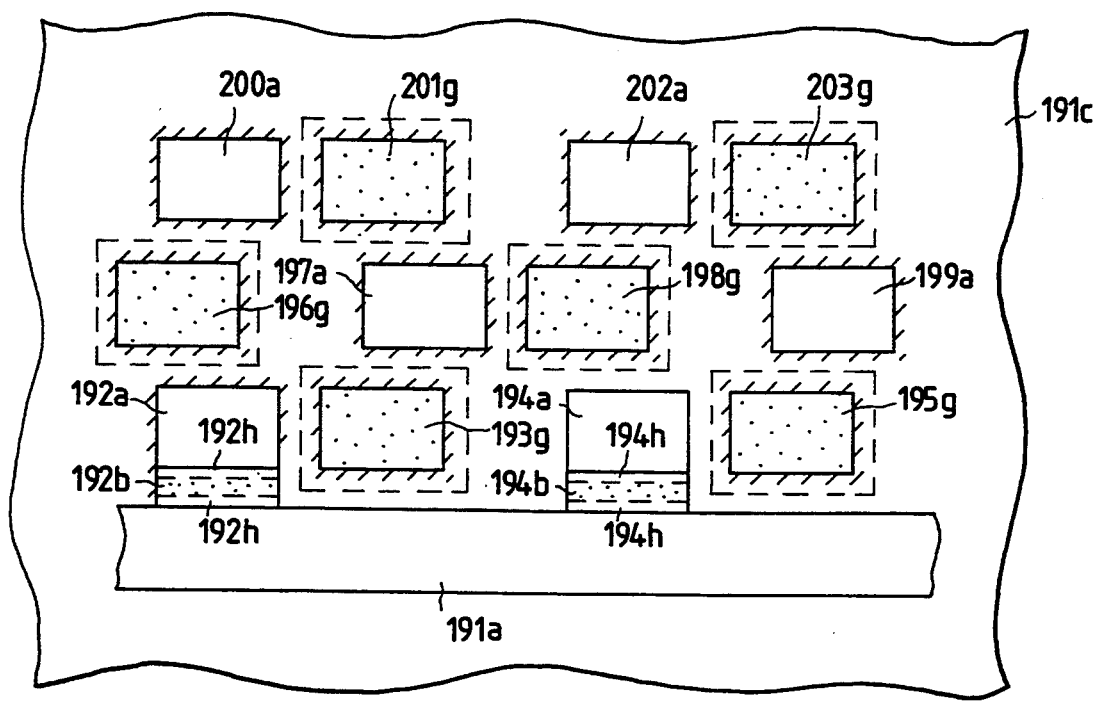
FIG. 73 is a plan pattern view of a mask in an embodiment of the invention.
Figure 74:
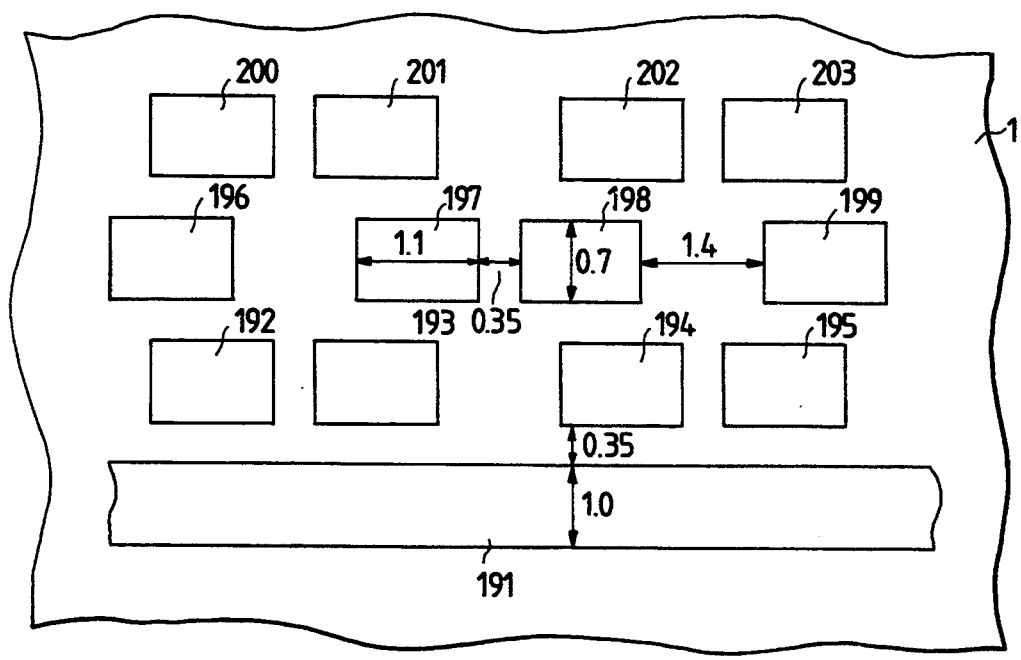
FIG. 74 is a plan view of a finished pattern on a treated wafer corresponding to the mask.

FIG. 73 is an application where the above-mentioned various phase shift mask techniques are applied to the exposure for patterns as indicated in FIG. 74 of Si gate of DRAM using negative resists. The principal techniques used here are the close pattern alternate phase inversion, the close pattern shift-on-quartz separation etc. In this case similar to FIG. 71, repeated patterns of matrix form in unit of the rectangular patterns 192 and 193 are basically processed by simple alternate phase inversion, and at the end of the matrix, the end processing is applied using the technique of the close pattern shift-on-quartz separation.

Figure 76:
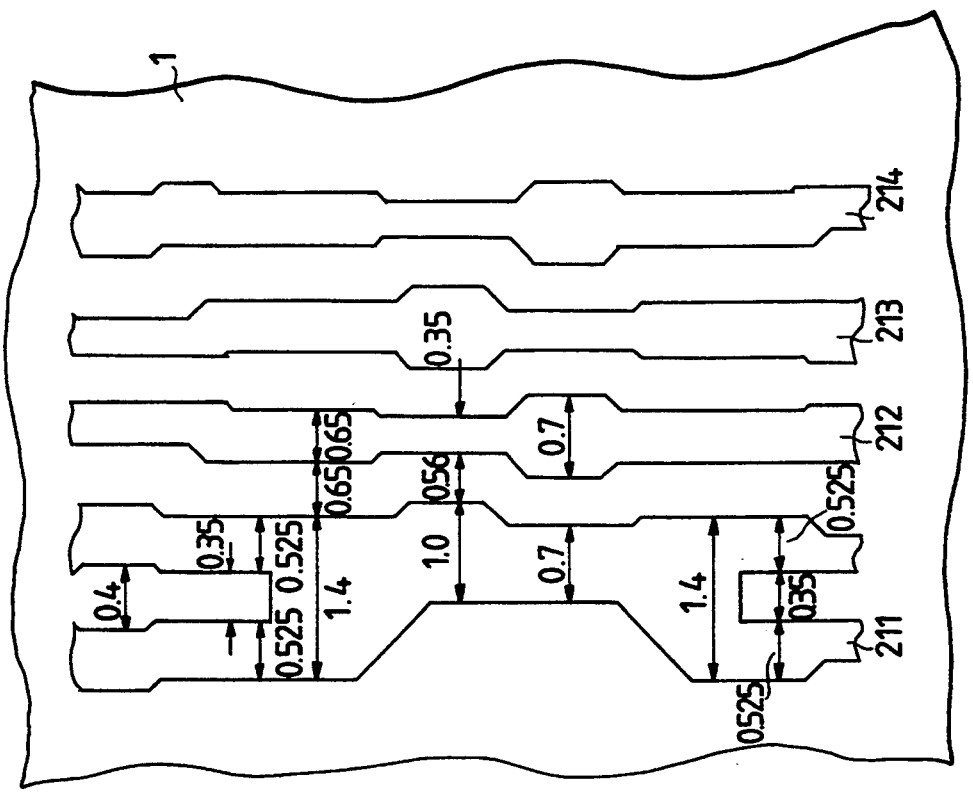
FIG. 76 is a plan view of a finished pattern on a treated wafer corresponding to the mask.
Figure 75:
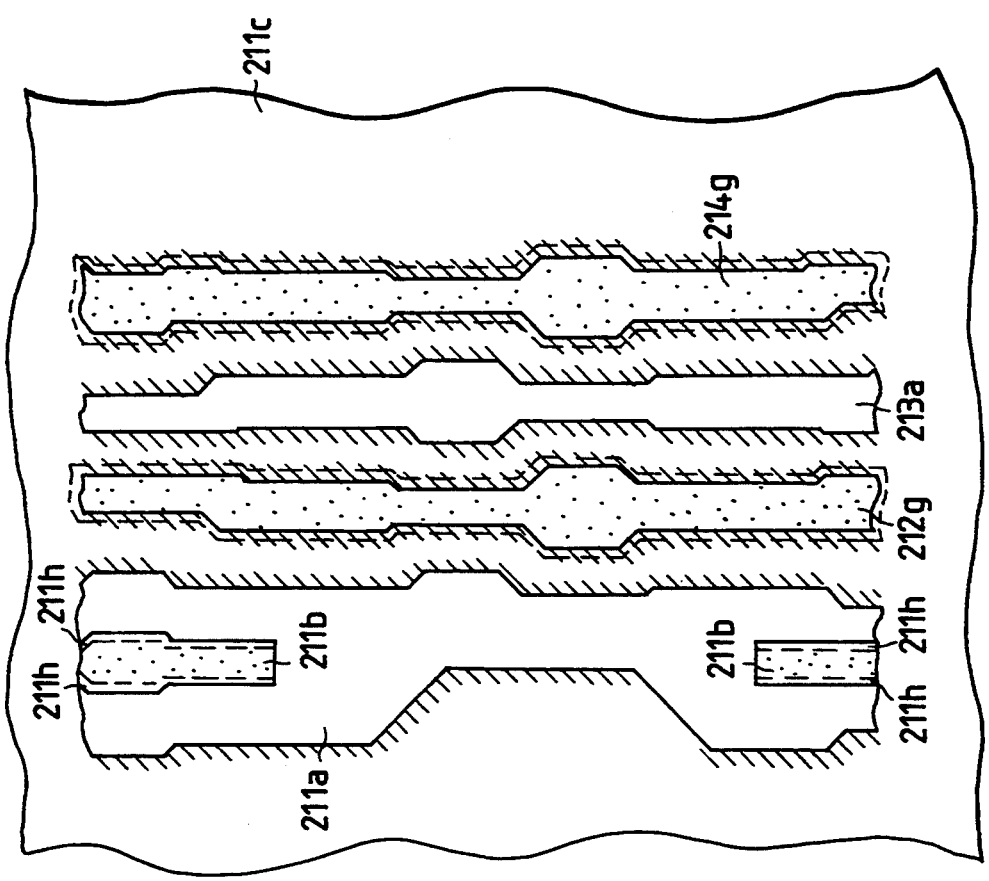
FIG. 75 is a plan pattern view of a mask in an embodiment of the invention.

FIG. 75 is an application of the above-mentioned various phase shift mask techniques to the exposure of patterns as indicated in FIG. 76 of layers of WL (word line) of DRAM using negative resists. The principal techniques used here are the close pattern alternate phase inversion, the close pattern shift-on-quartz separation etc. In this case, quasi repeated patterns in unit of quasi linear patterns of 212 etc. are basically processed with simple alternate phase inversion, and the end processing is carried out using the technique of close pattern shift-on-quartz separation at the part having branch of the end of the matrix.

Figure 77:
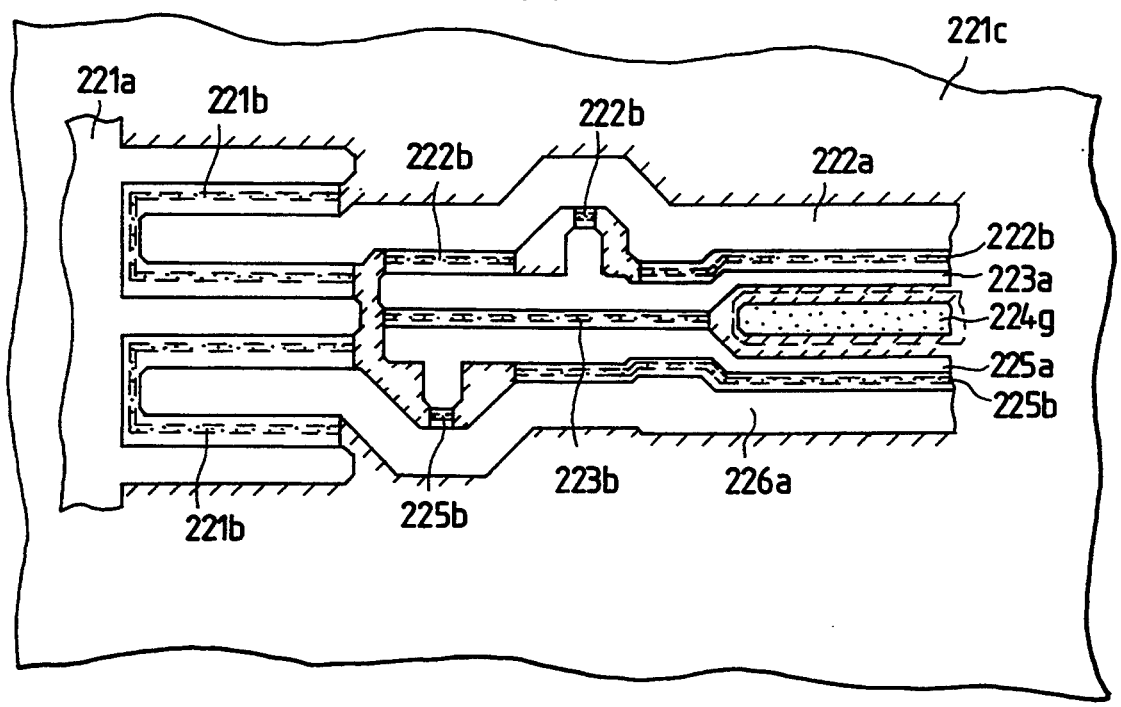
FIG. 77 is a plan pattern view of a mask in an embodiment of the invention.
Figure 78:
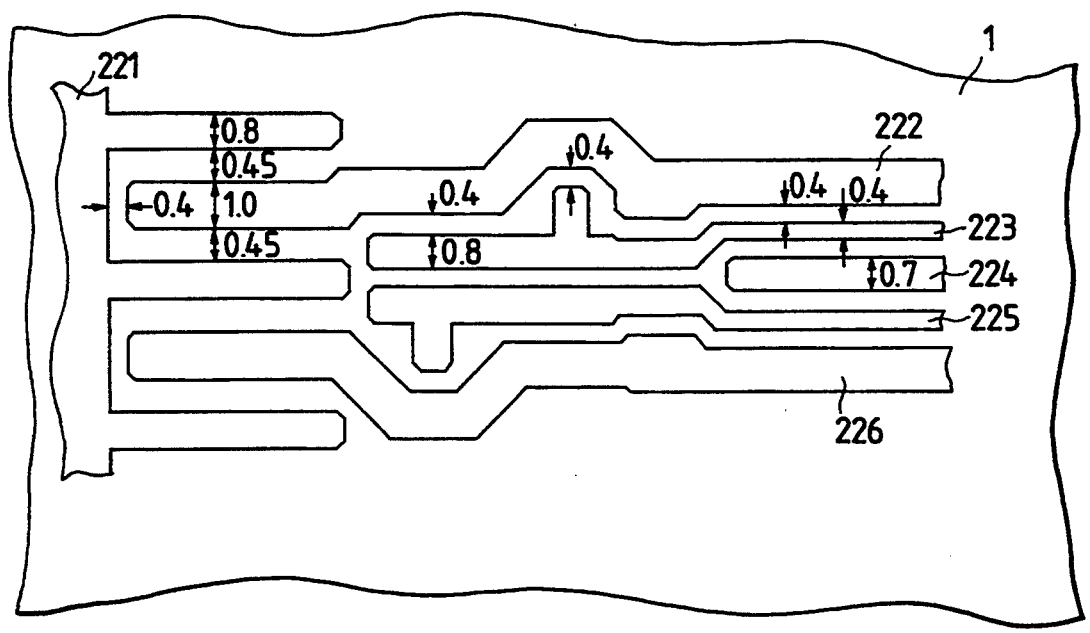
FIG. 78 is a plan view of a finished pattern on a wafer corresponding to the mask.

FIG. 77 is an application of the above-mentioned various phase shift matrix techniques to the exposure of the complicated patterns of the first layer Al of DRAM as indicated in FIG. 78, using negative resists. The principal techniques used here are the close pattern alternate phase inversion, the close pattern shift-on-quartz separation, the chrom & shifter separation etc. In this case, at the where alternate phase shift method is possible, the alternate phase method is applied, and at the part where phase inversion is impossible and patterns are close to each other, the Shifter-On-Quartz method is applied, and further at the part where the phase inversion is impossible and the patterns are not close to each other, the separation of neighboring patterns is carried out by the chrom screen film.

Figure 80:
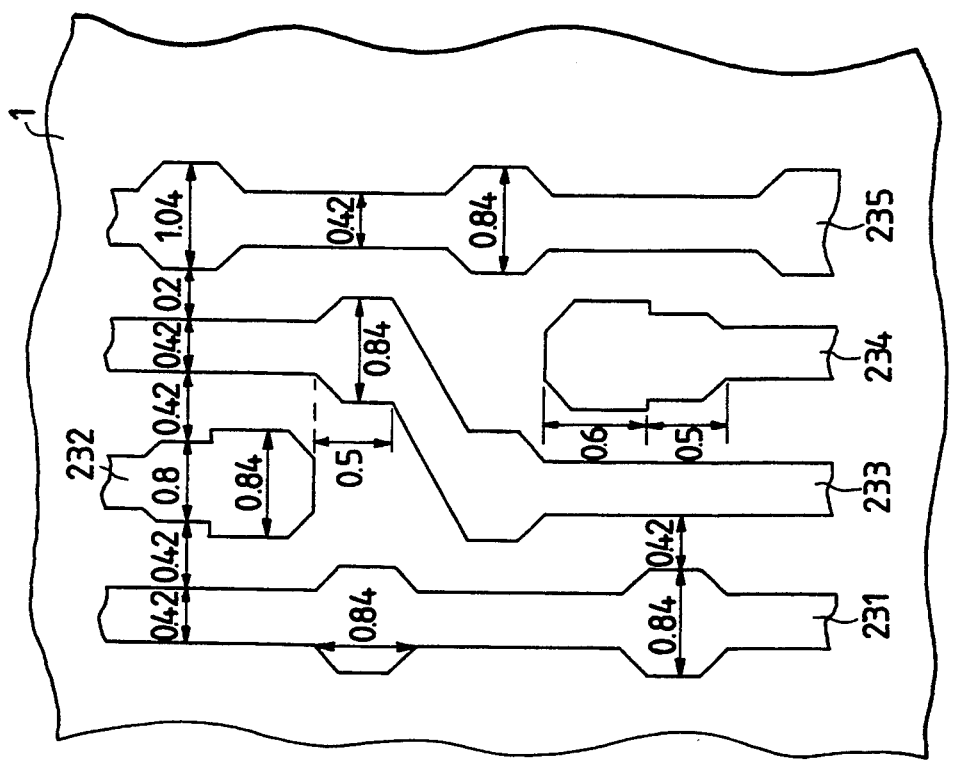
FIG. 80 is a plan view of a finished pattern on a wafer corresponding to the mask.
Figure 79:
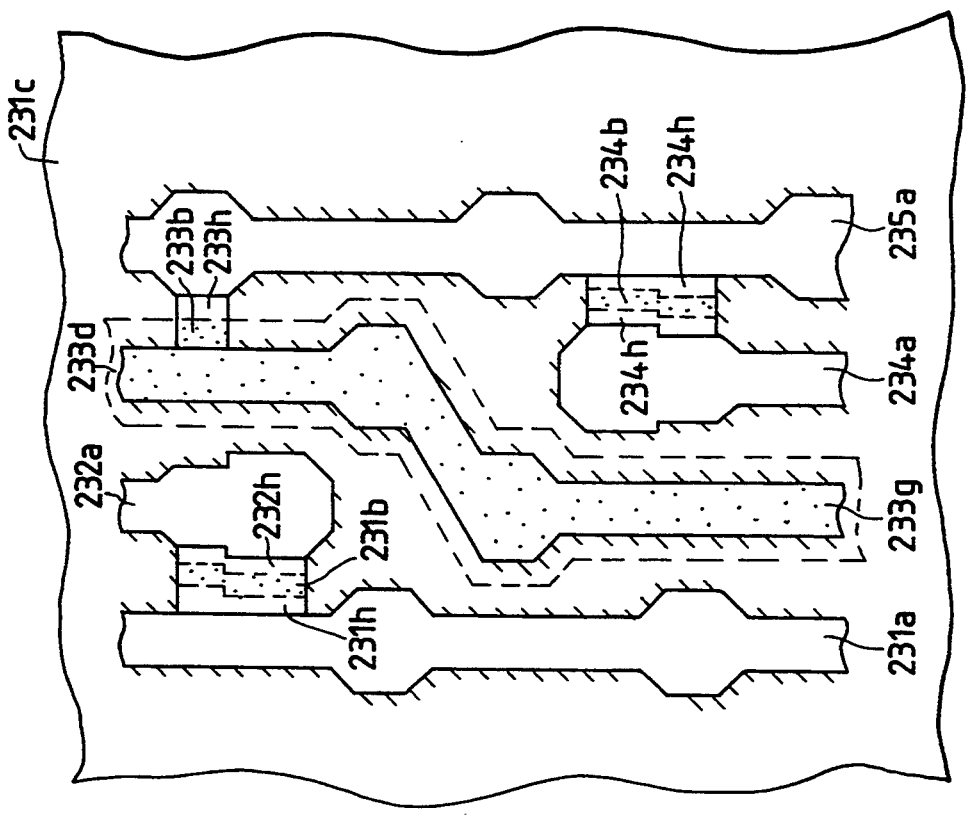
FIG. 79 is a plan pattern view of a mask in an embodiment of the invention.

FIG. 79 is an application of the above-mentioned various phase shift mask techniques to the exposure of patterns having complicated crossings of layers of bit lines of DRAM as indicated in FIG. 80, using negative resists. The principal techniques used hers are the close pattern phase inversion as shown in FIG. 53, the close pattern shift-on-quartz separation, the chrom & shifter separation etc. In this case, at the part such as patterns of both ends 231 and 232 or 234 and 235 where the alternate phase shift method can not be applied, the separation of patterns is carried out by the Shifter-On-Quartz method, and the interference of boundary of the shifter film 233d like the part extending longitudinally in FIG. 69 is used at the part being specially close between patterns 233 and 23 (for example, the interval=0.2 μm).

Figure 81:
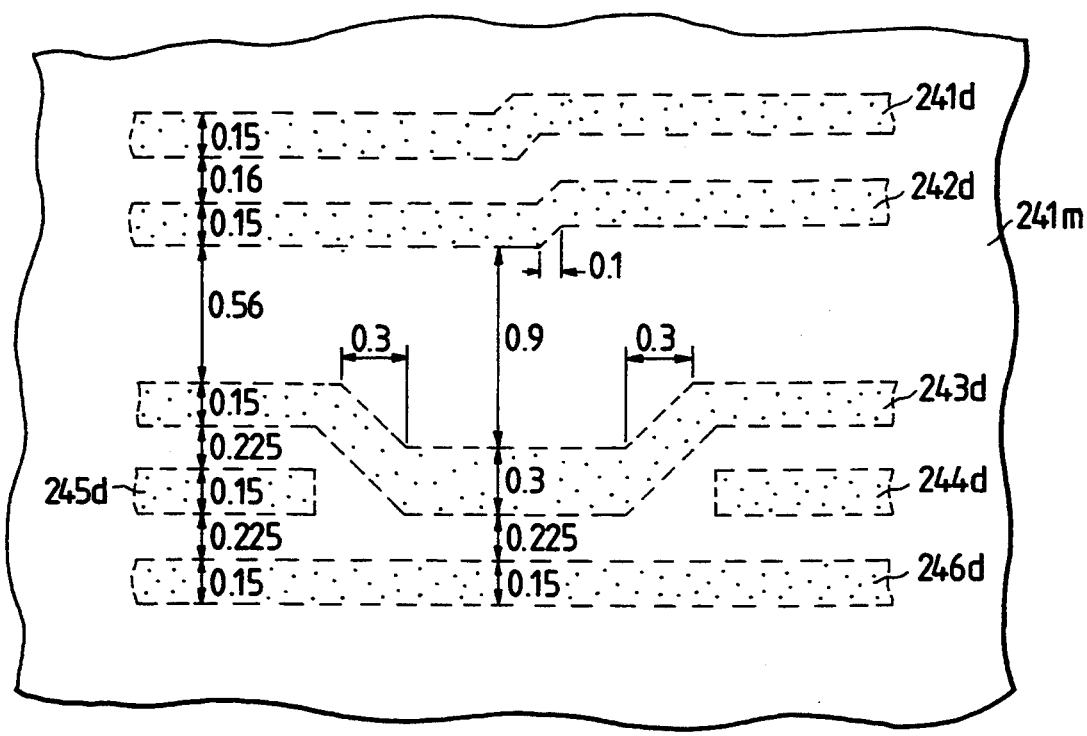
FIG. 81 is a plan pattern view of a mask in an embodiment of the invention.
Figure 82:
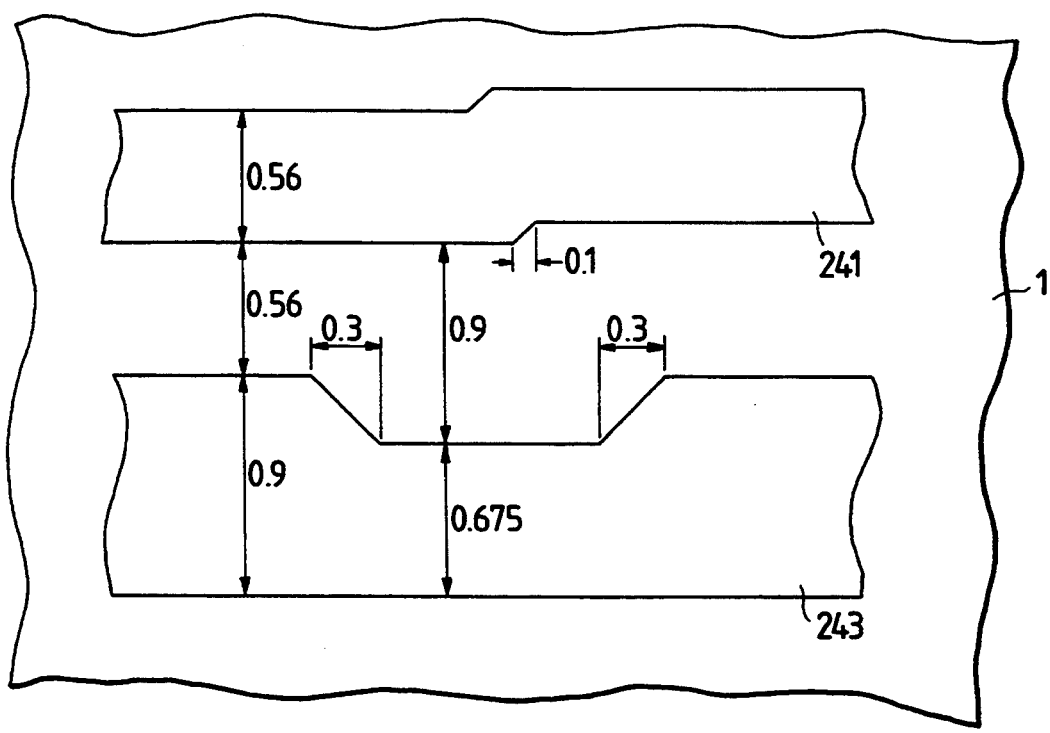
FIG. 82 is a plan view of a finished pattern on a treated wafer corresponding to the mask.

FIG. 81 is an application of the Shifter-On-Quartz painting method in which a plurality of fine shifters are made close and comparatively thick patterns 241 and 242 are formed, to the exposure for the second layer Al wiring of DRAM as indicated in FIG. 82 by negative resists.

Figure 83:
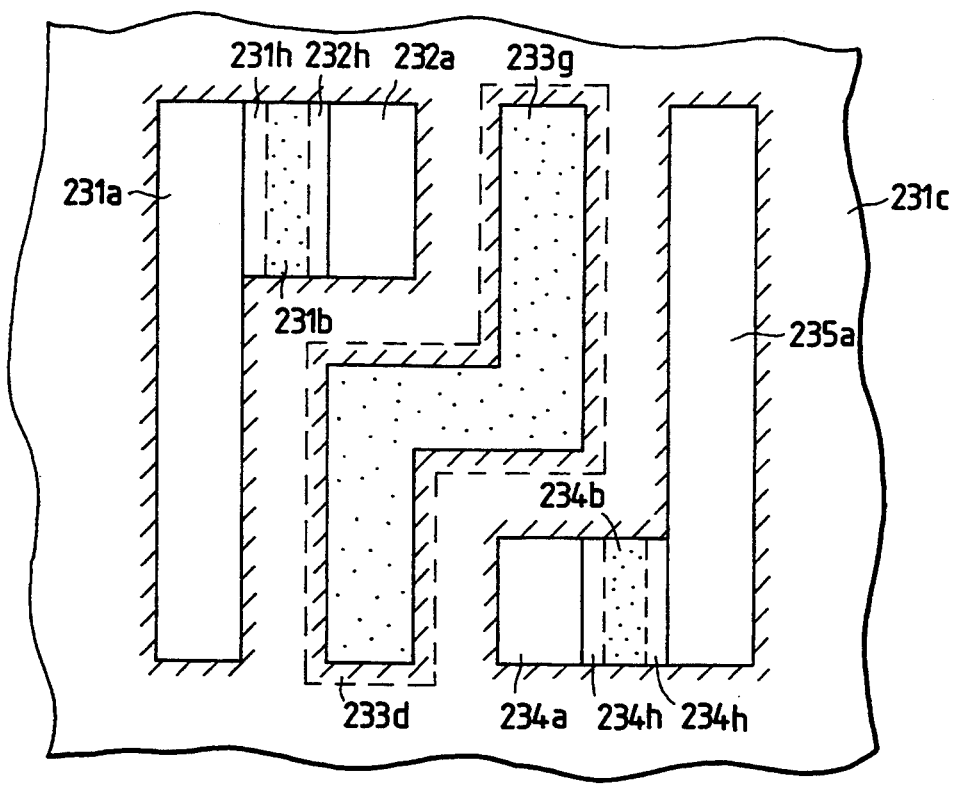
FIG. 83 is a plan pattern view of a mask in an embodiment of the invention.
Figure 84:
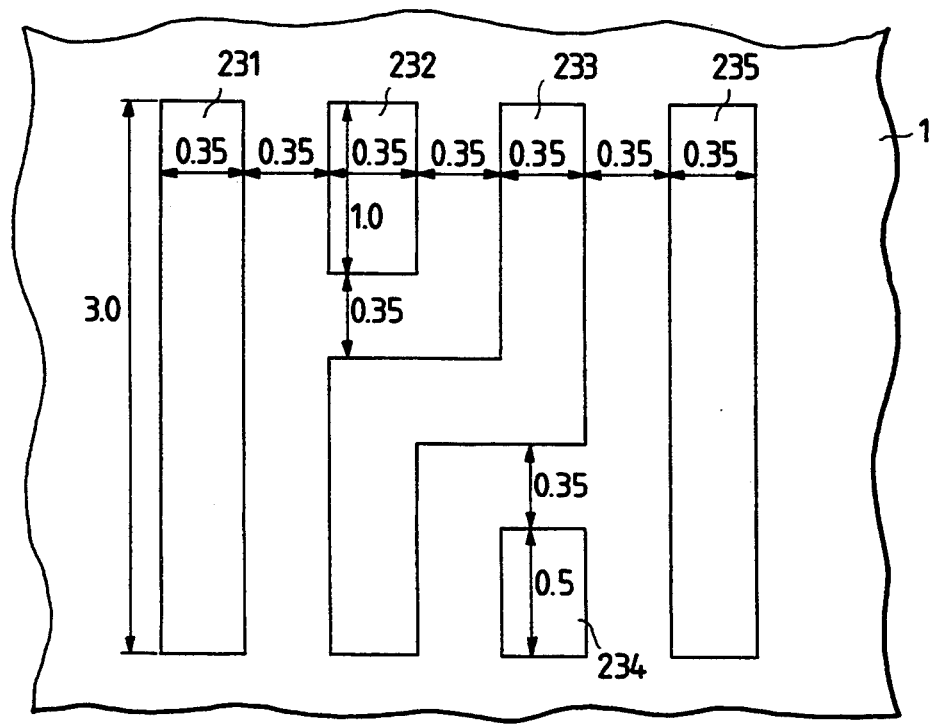
FIG. 84 is a plan view of a finished pattern on a treated wafer corresponding to the mask.

FIG. 83 indicates the simplified extraction of main techniques of the mask pattern of FIG. 79 as shown in FIG. 84.

Figure 85:
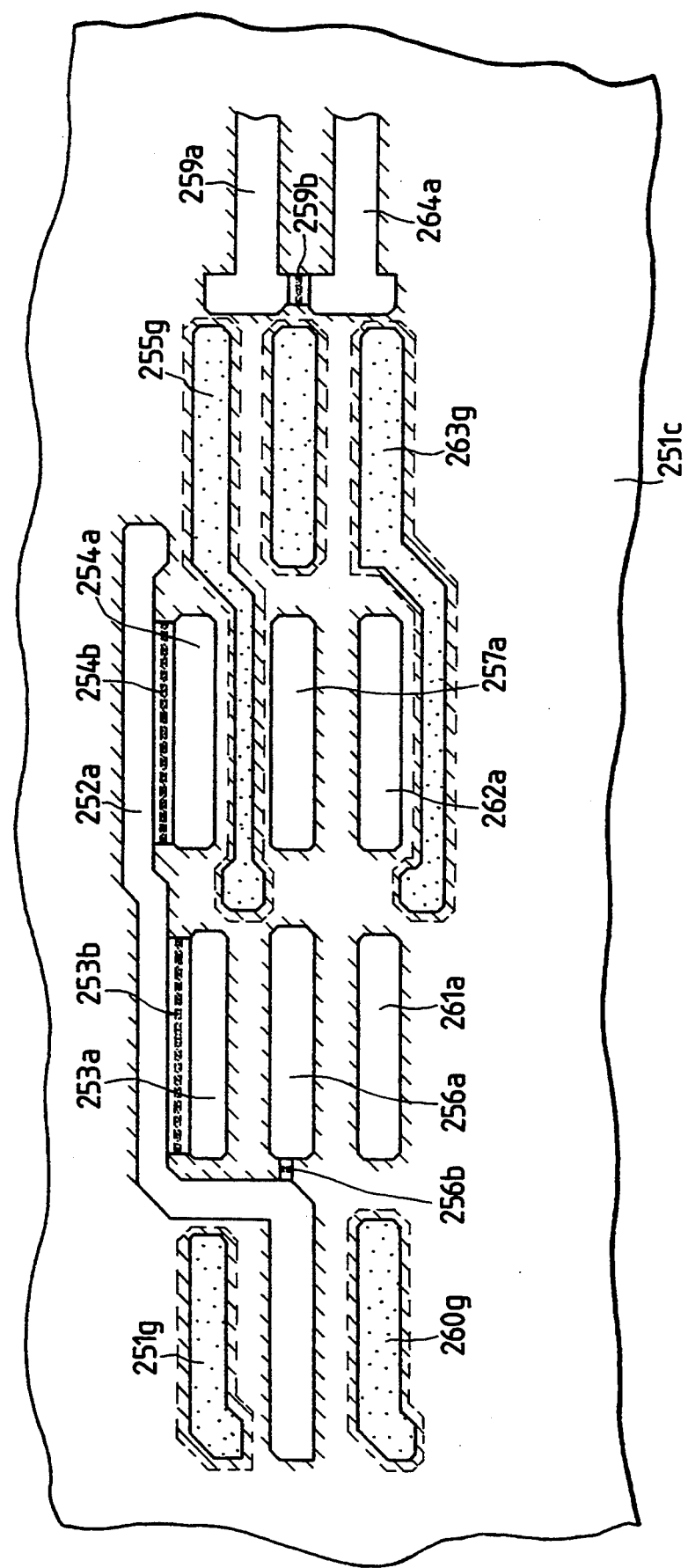
FIG. 85 is a plan pattern view of a mask in an embodiment of the invention.
Figure 86:
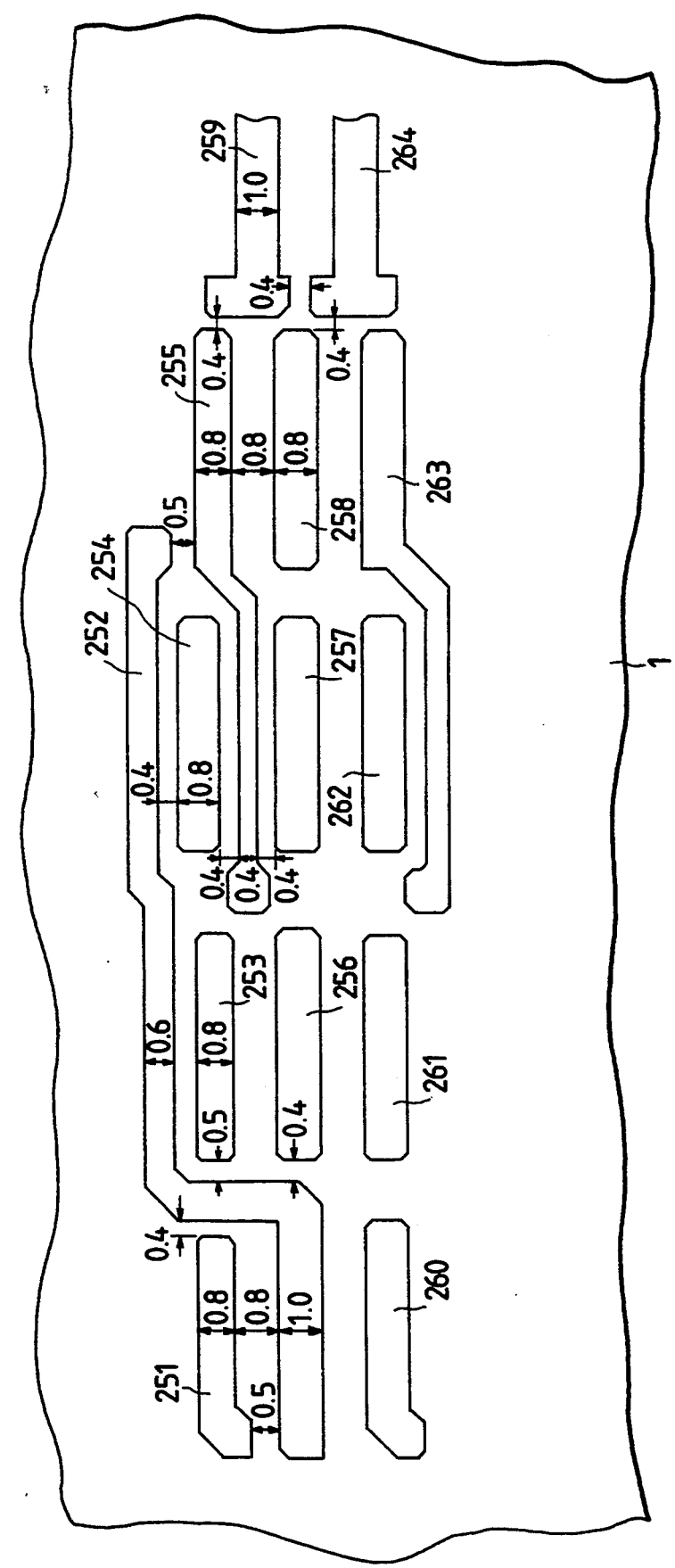
FIG. 86 is a plan view of a finished pattern on a treated wafer corresponding to the mask.

FIG. 85 is an application of the above-mentioned various phase shift mask techniques to the exposure of patterns having complicated crossings of the first layer of the Al wiring layer of DRAM as indicated in FIG. 86, using negative resists. The principal techniques used here are the close pattern alternate phase inversion, the close pattern shift-on-quartz separation, the chrom & shifter separation etc. In this case, as the free phase inversion can not be carried out because of complicated patterns, the phase shift is not applied to relatively distant part thereby the degree of freedom is secured. At other close part, the alternate inversion method is applied if possible, and at other part where the phase inversion can not be carried out, the Shifter-On-Quartz method is applied.

(34) Citation of references to supplement embodiments

Details of edge emphasizing type phase shift method and the mask design technique thereof are described in Japanese patent application laid-open No. 140743/1990 (patent application No. 29350/1988, filed on Nov. 22, 1988) by Okamoto laid-open on May 30, 1990, which shall be made a part of the description of the present application.

Further, the pattern layout of masks in the edge emphasizing type phase shift method, Levenson type phase shift method and the supplementary shift type phase shift method, negative or positive resist substances and resist process thereof, light sources for exposure, and the application thereof to semiconductor integrated circuit devices such as DRAM or SRAM are described in Japanese patent application No. 247100/1990 (filed on Sep. 19, 1990) by Okamoto, which shall be made a part of the present application.

Also, details of the negative resist substances for i-line stepper are explained in detail in Japanese patent application No. 290917/1990 (filed on Oct. 30, 1990) by Uchino et al., which shall be made a part of the present application.

Further, the design automation techniques regarding phase shift masks are indicated in Japanese patent application o. 11735/1991 (filed on May 22, 1991) by Takekuma et al., which shall be made a part of the present application.

Although the invention made by the present inventor has been described concretely based on embodiments, the present invention is not limited to the embodiments but various modifications may be done without departing from the scope and spirit of the invention. That is, the present embodiment has been described in an example of exposure by i-line, but it is needless to say that the present invention is not limited to the above example, and can be applied also to exposure using excimer laser light source.

Additionally, regarding the phases of the mask patterns, only either of a positive phase pattern or a phase reversal pattern with the phase thereof reversed is indicated, but it is needless to say that the reversed pattern thereof may be entirely used.

The effects obtained by the representative invention disclosed in the present application are described as follows.

Reduced projection exposure is carried out on the end of the mask pattern domain of a definite mode or on the boundary of the mask pattern domain of a plurality of modes using phase shift masks provided with prescribed correction patterns, thereby various and fine patterns can be exposed as the end effect can be canceled by the correction patterns.

The technical field forming the background of the present invention, that is, memory ICs has been explained, but the present invention is not limited to the above and various modifications may be done without departing from the scope and spirit of the invention. For example, it can be applied to logic IC, IC for microcomputers and IC for communications.

What is claimed is:

1. A method of making semiconductor devices, comprising the steps of:
   1) irradiating a monochromatic exposure light flux, having substantially constant wavelength and being coherent or partially coherent in ultraviolet or deep ultraviolet domain, on a mask on which enlarged patterns are formed, and
   2) reducing and projecting the exposure light flux passing through the mask, by a reducing lens system having a predetermined numerical aperture, so that desired reduced patterns corresponding to the enlarged patterns on the mask can be focused onto a photosensitive resist film on a major surface of a wafer, whereby reduced patterns corresponding to the enlarged patterns on the mask are transferred onto the wafer, said mask comprising:
      (a) a long main opening region having a shape of a continuous band, having a substantially constant width and corresponding to a line pattern isolated at least on one side; and
      (b) supplementary opening regions, in the shape of dots or broken lines, having dimensions so as not to resolve their own patterns, and having phases opposite to that of said main opening region and provided along said one side of the main opening region and close to it spaced by regular intervals so as to form a clear image of the main opening region onto the photosensitive resist film on the major surface of the wafer, a plurality of the supplementary opening regions being distributed along said one side of the long main opening region.

2. A method of making semiconductor devices, comprising the steps of:
   1) irradiating a monochromatic exposure light flux, having a substantially constant wavelength and being coherent or partially coherent in ultraviolet or deep ultraviolet domain, on a mask on which enlarged patterns are formed, and
   2) reducing and projecting the exposure light flux passing through the mask, by a reducing lens system having a predetermined numerical aperture, so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:
      (a) a first main opening region, in the shape of a pier, protruding substantially at right angles from one side of a second main opening region, corresponding to a protruding pattern whose characteristic length is not more than a wavelength of the exposure light;
      (b) a third opening region with an opposite phase to that of the first main opening region, adjacent to one side of the first main opening region, to form a clear image of the first main opening region on the wafer; and
      (c) at least one supplementary opening region, not to form its own independent pattern, disposed along the one side of the first main opening region and adjacent to a connecting portion of the first main opening region to the second main opening region where the image of the first main opening region on the wafer is liable to become thin by an interference effect of light when said first main opening region is exposed without the at least one supplementary opening region, said at least one supplementary opening region having substantially a same phase as that of the first main opening region and continuing thereto or in the vicinity of a side portion of the first main opening region.

3. A method of making semiconductor devices, comprising the steps of:
   1) irradiating a monochromatic exposure light flux, having a substantially constant wavelength and being coherent or partially coherent in ultraviolet or deep ultraviolet domain, on a mask on which enlarged patterns are formed, and
   2) reducing and projecting the exposure light flux passing through the mask, by a reducing lens system having a predetermined numerical aperture, so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:
      (a) a plurality of band-shaped main opening regions with phases reversed alternately, corresponding to a plurality of linear patterns arranged with a substantially constant width and interval; and
      (b) a dummy opening region, having a width so as to form its own independent pattern on the wafer, being disposed along an outer side of an outermost one of the main opening regions, with approximately an equal interval with that between the main opening regions, and having a reversed phase to that of the outermost main opening region, so as to form a clear image of the outermost main opening region with substantially a same width as that of the other main opening regions.

4. A method of making semiconductor devices, comprising the steps of:
   1) irradiating a monochromatic exposure light flux, having a substantially constant wavelength and being coherent or partially coherent in ultraviolet or deep ultraviolet domain, on a mask on which enlarged patterns are formed, and
   2) reducing and projecting the exposure light flux passing through the mask, by a reducing lens system having a predetermined numerical aperture, so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:
      (a) a plurality of first band-shaped main opening regions with phases reversed alternately, corresponding to a plurality of linear patterns arranged with a constant width and interval; and
      (b) a second band-shaped main opening region, to form its own independent pattern on the wafer, being disposed along an outer side of an outermost one of the first band-shaped main opening regions, having a larger width than that of the first band-shaped main opening regions, so that the second band-shaped main opening region has substantially a same width as that of the first band-shaped main opening regions at the exposure state, and having a reversed phase to that of the outermost first band-shaped main opening region.

5. A method of making semiconductor devices, comprising the steps of:
   1) irradiating a monochromatic exposure light flux, having a substantially constant wavelength and being coherent or partially coherent in ultraviolet or deep ultraviolet domain, on a mask on which enlarged patterns are formed, and
   2) reducing and projecting the exposure light flux passing through the mask, by a reducing lens system having a predetermined numerical aperture, so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:
      (a) first phase shift mask patterns, the first phase shift mask patterns including a plurality of first rectangular main opening regions, with substantially same phases, corresponding to hole patterns having a size corresponding to the wavelength of the exposure light on the wafer, the first rectangular main opening regions being spaced a first distance apart from each other, each of which has four auxiliary openings dimensioned so as not to form its own pattern on the wafer and has a reversed phase to a phase of the first main opening regions; and
      (b) second phase shift mask patterns, the second phase shift mask patterns including a plurality of second rectangular main opening regions with sizes corresponding to the first main opening regions and phases substantially reversed alternately, the second rectangular main opening regions being spaced a second distance apart from each other, the second distance being smaller than the first distance.

6. A method of making semiconductor devices, comprising the steps of:
   1) irradiating a monochromatic exposure light flux, having a substantially constant wavelength and being coherent or partially coherent in ultraviolet or deep ultraviolet domain, on a mask on which enlarged patterns are formed, and
   2) reducing and projecting the exposure light flux passing through the mask, by a reducing lens systems having a predetermined numerical aperture, so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:
      (a) first and second main opening regions arranged close to each other and having substantially a same phase;
      (b) a third main opening region arranged close to the first and second main opening regions and having a reversed phase thereto; and
      (c) a phase shift region having a phase reversed to that of the first and second main opening regions, and disposed between adjacent sides of the first and second main opening regions in such manner that the phase shift region substantially connects the first main opening region to the second main opening region so that image patterns on the wafer corresponding to the first and second main opening regions can be separated from each other through interference of the phase shift region.

7. A mask for use in making semiconductor devices, by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) a long main opening region having a shape of a continuous band, having a substantially constant width and corresponding to a line pattern isolated at least on one side; and (b) supplementary opening regions, in the shape of dots or broken lines, having dimensions so as not to resolve their own patterns, and having phases opposite to that of said main opening region and provided along said one side of the main opening region and close to it spaced by regular intervals so as to form a clear image of the main opening region onto the photosensitive resist film on the major surface of the wafer, a plurality of the supplementary opening regions being distributed along said one side of the long main opening region.

8. A mask for use in making semiconductor devices, by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) a first main opening region, in the shape of a pier, protruding substantially at right angles from one side of a second main opening region, corresponding to a protruding pattern whose characteristic length is not more than the wavelength of the exposure light;

(b) a third opening region with an opposite phase to that of the first main opening region, adjacent to one side of the first main opening region, to form a clear image of the first main opening region on the wafer; and (c) at least one supplementary opening region, not to form its own independent pattern, disposed along the one side of the first main opening region and adjacent to a connecting portion of the first main opening region to the second main opening region where the image of the first main opening region on the wafer is liable to become thin by an interference effect of light when said first main opening region is exposed without the at least one supplementary opening region, said at least one supplementary opening region having substantially a same phase as that of the first main opening region and continuing thereto or in the vicinity of a side portion of the first main opening region.

9. A mask for use in making semiconductor devices by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture, so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) a plurality of band-shaped main opening regions with phases reversed alternately, corresponding to a plurality of linear patterns arranged with a constant width and interval; and (b) a dummy opening region, having a width so as to form its own independent pattern on the wafer, being disposed along an outer side of an outermost one of the main opening regions, with approximately an equal interval with that between the main opening regions, and having a reversed phase to that of the outermost main opening region, so as to form a clear image of the outermost main opening region with substantially a same width as that of the other main opening regions.

10. A mask for use in making semiconductor devices by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) a plurality of first band-shaped main opening regions with phases reversed alternately, corresponding to a plurality of linear patterns arranged with a constant width and interval; and (b) a second band-shaped main opening region, to form its own independent pattern on the wafer, being disposed along an outer side of an outermost one of the first band-shaped main opening regions, and having a larger width than that of the first band-shaped main opening regions, so that the second band-shaped main opening region has substantially a same width as that of the first band-shaped main opening regions at the exposure state, and having a reversed phase to that of the outermost first band-shaped main opening region.

11. A mask for making semiconductor devices by a process where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) first phase shift mask patterns, the first phase shift mask patterns including a plurality of first square-shaped main opening regions with substantially same sizes and phases, the first square-shaped main opening regions being spaced a first distance apart from each other, each of which has four auxiliary openings dimensioned so as not to form their own pattern on the wafer and has a reversed phase to a phase of the first main opening regions; and (b) second phase shift mask patterns, the second phase shift mask patterns including a plurality of second square-shaped main opening regions with substantially same sizes as the first main opening regions and phases reversed alternately, the second square-shaped main opening regions being spaced a second distance apart from each other, the second distance being smaller than the first distance.

12. A mask for use in making semiconductor devices by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) first and second main opening regions arranged close to each other and having substantially a same phase;

(b) a third main opening region arranged close to the first and second main opening regions and having a reversed phase thereto; and (c) a phase shift region having a phase reversed to that of the first and second main opening regions, and disposed between adjacent sides of the first and second main opening regions in such manner that the phase shift region substantially connects the first main opening region to the second main opening region so that image patterns on the wafer corresponding to the first and second main opening regions can be separated from each other through interference of the phase shift region.

13. A method of making semiconductor devices, comprising the steps of:

1) irradiating a monochromatic exposure light flux, having a substantially constant wavelength and being coherent or partially coherent in ultraviolet or deep ultraviolet domain, on a mask on which enlarged patterns are formed, and 2) reducing and projecting the exposure light flux passing through the mask, by a reducing lens system having a predetermined numerical aperture, so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) a first main opening region, for forming a first pattern on the wafer; and (b) a second main opening region with substantially a reversed phase to that of the first main opening region, for forming a second pattern on the wafer, said second main opening region having a first adjacent side portion adjacent to, but spaced from, the first main opening region to the extent that the two patterns cannot be resolved without a phase inversion between the first and second main opening regions, and a second adjacent side portion connected to the first main opening region so as to be in contact with the first main opening region.

14. A mask for use in making semiconductor devices by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) a first main opening region, for forming a first pattern on the wafer; and (b) a second main opening region with substantially a reversed phase to that of the first main opening region, for forming a second pattern on the wafer, said second main opening region having a first adjacent side portion adjacent to, but spaced from, the first main opening region to the extent that the two patterns cannot be resolved without a phase inversion between the first and second main opening regions, and a second adjacent side portion connected to the first main opening region so as to be in contact with the first main opening region.

15. The method according to claim 3, wherein the width of the dummy opening region is greater than a width of the plurality of band-shaped main opening regions.

16. The mask according to claim 9, wherein the width of the dummy opening region is greater than a width of the plurality of band-shaped main opening regions.

17. The method according to claim 13, wherein the first main opening region includes a most adjacent side portion contacting the second adjacent side portion of the second main opening region, the most adjacent side portion and the second adjacent side portion being provided such that image patterns on the wafer formed from the first and second main opening regions can be separated from each other through interference of light transmitted through the most adjacent and second adjacent side portions.

18. The mask according to claim 14, wherein the first main opening region includes a most adjacent side portion contacting the second adjacent side portion of the second main opening region, the most adjacent side portion and the second adjacent side portion being provided such that image patterns on the wafer formed from the first and second main opening regions can be separated from each other through interference of light transmitted through the most adjacent and second adjacent side portions.

19. A method of making semiconductor devices, comprising the steps of:
(1) irradiating a monochromatic exposure light flux, having a substantially constant wavelength and being coherent or partially coherent in ultraviolet or deep ultraviolet domain, on a mask on which enlarged patterns are formed, and
(2) reducing and projecting the exposure light flux passing through the mask, by a reducing lens system having a predetermined numerical aperture, so that desired reduced patterns corresponding to the enlarged patterns on the mask can be focused onto a photosensitive resist film on a major surface of a wafer, whereby reduced patterns corresponding to the enlarged patterns on the mask are transferred onto the wafer, said mask comprising:
(a) a long main opening region having a shape of a continuous band isolated at least on one side; and
(b) supplementary opening regions, in the shape of dots or broken lines, having dimensions so as not to resolve their own patterns, and having phases opposite to that of said main opening region and provided along said one side of the main opening region and close to it spaced by regular intervals so as to form a clear image of the main opening region onto the photosensitive resist film on the major surface of the wafer.

20. A method of making semiconductor devices, comprising the steps of:
(1) irradiating a monochromatic exposure light flux, having a substantially constant wavelength and being coherent or partially coherent in ultraviolet or deep ultraviolet domain, on a mask on which enlarged patterns are formed, and
(2) reducing and projecting the exposure light flux passing through the mask, by a reducing lens system having a predetermined numerical aperture so that desired reduced patterns corresponding to the enlarged patterns on the mask can be focused onto a photosensitive resist film on a major surface of a wafer, whereby reduced patterns corresponding to the enlarged patterns on the mask are transferred onto the wafer, said mask comprising:
(a) a plurality of band-shaped main opening regions with phases reversed alternately; and
(b) a dummy opening region, having a width so as to form its own independent pattern on the wafer, being disposed along an outer side of an outermost one of the main opening regions, with approximately an equal interval with that between the main opening regions, and having a reversed phase to that of the outermost main opening region, so as to form a clear image of the outermost one of the main opening regions with substantially a same width as that of the other main opening regions.

21. A mask for use in making semiconductor devices, by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby reduced patterns corresponding to the enlarged patterns on the mask are transferred onto the wafer, said mask comprising:
(a) a long main opening region having a shape of a continuous band, having a substantially constant width and corresponding to a line pattern isolated at least on one side; and
(b) supplementary opening regions, in the shape of dots or broken lines, having dimensions so as not to resolve their own patterns, and having phases opposite to that of said main opening region and provided along said one side of the main opening region and close to it spaced by regular intervals so as to form a clear image of the main opening region onto the photosensitive resist film on the major surface of the wafer, a plurality of the supplementary opening regions being distributed along said one side of the long main opening region.

22. A method of making semiconductor devices, comprising the steps of:
(1) irradiating a monochromatic exposure light flux, having a substantially constant wavelength and being coherent or partially coherent in ultraviolet or deep ultraviolet domain, on a mask on which enlarged patterns are formed, and
(2) reducing and projecting the exposure light flux passing through the mask, by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:
(a) a first main opening region, in a shape of a pier, protruding substantially at right angles from one side of a second main opening region;
(b) a third opening region with an opposite phase to that of the first main opening region, adjacent to one side of the first main opening region, to form a clear image of the first main opening region on the wafer; and
(c) at least one supplementary opening region, not to form its own independent pattern, disposed along the one side of the first main opening region and adjacent to the connecting portion of the first main opening region to the second main opening region where the image of the first main opening region on the wafer is liable to become thin by the interference effect of light when said first main opening region is exposed without the at least one supplementary opening region, said at least one supplementary opening region having substantially a same phase as that of the first main opening region and continuing thereto or in the vicinity of a side portion of the first main opening region.

23. A method of making semiconductor devices, comprising the steps of:
(1) irradiating a monochromatic exposure light flux, having a substantially constant wavelength and being coherent or partially coherent in ultraviolet or deep ultraviolet domain, on a mask on which enlarged patterns are formed, and
(2) reducing and projecting the exposure light flux passing through the mask, by a reducing lens system having a predetermined numerical aperture, so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) first and second main opening regions arranged close to each other and having substantially a same phase;

(b) a third main opening region arranged close to the first and second main opening regions and having the reversed phase thereto; and (c) a narrow opening region having a phase reversed to that of the first and second main opening regions, and disposed between adjacent sides of the first and second main opening regions in such manner that the narrow opening region substantially connects the first main opening region to the second main opening region so that image patterns on the wafer corresponding to the first and second main opening regions can be separated from each other through interference of the narrow opening region.

24. A mask for use in making semiconductor devices, by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) a first main opening region, in a shape of a pier, protruding substantially at right angles from one side of a second main opening region;

(b) a third opening region with an opposite phase to that of the first main opening region, adjacent to one side of the first main opening region, to form a clear image of the first main opening region on the wafer; and (c) at least one supplementary opening region, not to form its own independent pattern, disposed along the one side of the first main opening region and adjacent to a connecting portion of the first main opening region to second main opening region where the image of the first main opening region on the wafer is liable to become thin by an interference effect of light when said first main opening region is exposed without the at least one supplementary opening region, said at least one supplementary opening region having substantially a same phase as that of the first main opening region and continuing thereto or in the vicinity of a side portion of the first main opening region.

25. A mask for use in making semiconductor devices by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) first and second main opening regions arranged close to each other and having substantially a same phase;

(b) a third main opening region arranged close to the first and second main opening regions and having a reversed phase thereto; and (c) a narrow opening region having a phase reversed to that of the first and second main opening regions, and disposed between adjacent sides of the first and second main opening regions in such manner that the narrow opening region substantially connects the first main opening region to the second main opening region so that image patterns on the wafer, corresponding to the first and second main opening regions, can be separated from each other through interference of the narrow opening region.

26. A mask for use in making semiconductor devices, by a method where a monochromatic exposure light flux having a substantially constant wavelength and being coherent or partially coherent in ultraviolet or deep ultraviolet domain is irradiated on a mask on which enlarged patterns are formed, and the exposure light flux passing through the mask is reduced and projected by a reducing lens system having a predetermined numerical aperture so that desired reduced patterns corresponding to the enlarged patterns on the mask can be focused onto a photosensitive resist film on a major surface of a wafer, whereby the reduced patterns corresponding to the enlarged patterns on the mask are transferred onto the wafer, said mask comprising:

(a) a plurality of band-shaped main opening regions with phases reversed alternately; and (b) a dummy opening region, having a width so as to form its own independent pattern on the wafer, being disposed along an outer side of an outermost one of the main opening regions, with approximately an equal interval with that between the main opening regions, and having a reversed phase to that of the outermost main opening region, so as to form a clear image of the outermost opening region with substantially a same width as that of the other main opening regions.

* * * * *